United States Patent
Xing et al.

(10) Patent No.: US 9,966,726 B2
(45) Date of Patent: May 8, 2018

(54) EMISSION SOURCE AND METHOD OF FORMING THE SAME

(71) Applicant: Nanyang Technological University, Singapore (SG)

(72) Inventors: Guichuan Xing, Singapore (SG); Nripan Mathews, Singapore (SG); Subodh Gautam Mhaisalkar, Singapore (SG); Tze Chien Sum, Singapore (SG)

(73) Assignee: NANYANG TECHNOLOGICAL UNIVERSITY, Singapore (SG)

( * ) Notice: Subject to any disclaimer, the term of this patent is extended or adjusted under 35 U.S.C. 154(b) by 0 days. days.

(21) Appl. No.: 14/484,927

(22) Filed: Sep. 12, 2014

(65) Prior Publication Data
US 2015/0071319 A1   Mar. 12, 2015

Related U.S. Application Data

(60) Provisional application No. 61/876,940, filed on Sep. 12, 2013.

(51) Int. Cl.
| | |
|---|---|
| *H01S 3/04* | (2006.01) |
| *H01S 3/16* | (2006.01) |
| *H01S 5/36* | (2006.01) |
| H01S 3/092 | (2006.01) |
| H01S 3/0941 | (2006.01) |
| H01S 3/17 | (2006.01) |
| H01S 5/04 | (2006.01) |

(52) U.S. Cl.
CPC .............. *H01S 3/1645* (2013.01); *H01S 5/36* (2013.01); *H01S 3/092* (2013.01); *H01S 3/0941* (2013.01); *H01S 3/1628* (2013.01); *H01S 3/178* (2013.01); *H01S 5/041* (2013.01)

(58) Field of Classification Search
CPC .......... H01S 3/1645; H01S 5/36; H01S 3/092; H01S 3/0941; H01S 3/1628; H01S 3/178; H01S 5/041
USPC ....................................... 372/43.01
See application file for complete search history.

(56) References Cited

U.S. PATENT DOCUMENTS

| 3,451,009 A * | 6/1969 | Ross ................. | C09K 11/06 252/301.18 |
| 3,949,319 A * | 4/1976 | Tofield .................. | H01S 3/094 359/343 |
| 5,023,877 A * | 6/1991 | Eden .................... | H01S 3/0632 372/39 |
| 7,641,815 B2 * | 1/2010 | Varadarajan .......... | C09K 11/616 252/301.4 H |

(Continued)

OTHER PUBLICATIONS

Michael M. Lee, "Efficient Hybrid Solar Cells Based on Meso-Superstructured Organometal Halide Perovskites", Science vol. 338 Nov. 2, 2012.*

(Continued)

*Primary Examiner* — Vu A Vu
(74) *Attorney, Agent, or Firm* — Seed Intellectual Property Law Group LLP

(57) ABSTRACT

In various embodiments, an emission source may be provided. The emission source may also include a gain medium including a halide semiconductor material. The emission source may further include a pump source configured to provide energy to the gain medium.

35 Claims, 51 Drawing Sheets

(56) References Cited

U.S. PATENT DOCUMENTS

| | | | |
|---|---|---|---|
| 7,906,787 B2* | 3/2011 | Kang | H01L 33/08 257/85 |
| 2004/0229061 A1* | 11/2004 | Kasai | C09K 11/025 428/485 |
| 2011/0073935 A1* | 3/2011 | Sekihara | H01L 21/28282 257/325 |
| 2013/0284264 A1 | 10/2013 | Pfenninger et al. | |
| 2013/0320836 A1* | 12/2013 | Kanatzidis | H01L 31/032 313/483 |
| 2014/0008660 A1* | 1/2014 | Jorgenson | H01L 21/0237 257/76 |

OTHER PUBLICATIONS

Mitzi, "Thin Film Deposition of Organic-Inorganic Hybrid Materials Using a Single Source Thermal Ablation Technique", Chem. Mater. 1999, 11, 542-544.*
Atwater et al., "Plasmonics for improved photovoltaic devices," Nature Materials 9:205-214, Mar. 2010.
Baikie et al., "Synthesis and crystal chemistry of the hybrid perovskite ($CH_3NH_3$)$PbI_3$ for solid-state sensitised solar cell applications," J. Mater. Chem. A 1:5628-5641, 2013.
Bakulin et al., "Ultrafast Hole-Transfer Dynamics in Polymer/PCBM Bulk Heterojunctions," Adv. Funct. Mater. 20:1653-1660, 2010.
Ball et al., "Low-temperature processed meso-superstructured to thin-film perovskite solar cells," Energy Environ. Sci. 6:1739-1743, 2013.
Beaujuge et al., "Molecular Design and Ordering Effects in π-Functional Materials for Transistor and Solar Cell Applications," J. Am. Chem. Soc. 133:20009-20029, 2011.
Beek et al., "Hybrid Solar Cells from Regioregular Polythiophene and ZnO Nanoparticles," Adv. Funct. Mater. 16:1112-1116, 2006.
Blom et al., "Device Physics of Polymer:Fullerene Bulk Heterojunction Solar Cells," Adv. Mater. 19:1551-1566, 2007.
Burschka et al., "Sequential deposition as a route to high-performance perovskite-sesitized solar cells," Nature 499:316-320, Jul. 18, 2013.
Cesaria et al., "Realistic absorption coefficient of ultrathin films," J. Opt. 14, 105701, 2012, 11 pages.
Chan et al., "Blue semiconductor nanocrystal laser," Applied Physics Letters 86, 073102, 2005, 4 pages.
Clark et al., "Organic photonics for communications," Nature Photonics 4:438-446, Jul. 2010.
Dang et al., "Red, green and blue lasing enabled by single-exciton gain in colloidal quantum dot films," Nature Nanotechnology 7:335-339, May 2012.
Ding et al., "(Zn,Cd)Se/ZnSe quantum-well lasers: Excitonic gain in an inhomogeneously broadened quasi-two-dimensional system," Physical Review B 47(16):10528-10542, Apr. 15, 1993.
Etgar et al., "Mesoscopic $CH_3NH_3PbI_3$/$TiO_2$ Heterojunction Solar Cells," J. Am. Chem. 134:17369-17399, 2012.
Facchetti, "π-Conjugated Polymers for Organic Electronics and Photovoltaic Cell Applications," Chem. Mater. 23:733-758, 2011.
Graetzel et al., "Materials interface engineering for solution-processed photovoltaics," Nature 488:304-312, Aug. 16, 2012.
Grancini et al., "Dynamic Microscopy Study of Ultrafast Charge Transfer in a Hybrid P3HT/Hyperbranched CdSe Nanoparticle Blend for Photovoltaics," J. Phys. Chem. Lett. 3:517-523, 2012.
Grancini et al., "Hot exciton dissociation in polymer solar cells," Nature Materials 12:29-33, Jan. 2013.
Grivas et al., "Organic solid-state integrated amplifiers and lasers," Laser Photonics Rev. 6(4):419-462, 2012.
Haugeneder et al., "Exciton diffusion and dissociation in conjugated polymer/fullerene blends and heterostructures," Physical Review B 59(23):15346-15351, Jun. 15, 1999.
Heo et al., "Efficient inorganic-organic hybrid heterojunction solar cells containing perovskite compound and polymeric hole conductors," Nature Photonics 7:486-491, Jun. 2013.

Hoppe et al., "Optical Constants of Conjugated Polymer/Fullerene Based Bulk-Heterojunction Organic Solar Cells," Mol. Cryst. Liq. Cryst. 385:233-239, 2002.
Im et al., "6.5% efficient perovskite quantum-dot-sensitized solar cell," Nanoscale 3:4088-4093, 2011.
Jailaubekov et al., "Hot charge-transfer excitons set the time limit for charge separation at donor/acceptor interfaces in organic photovoltaics," Nature Materials 12:66-73, Jan. 2013.
Kagan et al., "Organic-Inorganic Hybrid Materials as Semiconducting Channels in Thin-Film Field-Effect Transistors," Science 286:945-947, Oct. 29, 1999.
Kim et al., "Composition and annealing effects in polythiophene/fullerene solar cells," Journal of Materials Science 40:1371-1376, 2005.
Kim et al., "Effect of the End Group of Regioregular Poly(3-hexylthiophene) Polymers on the Performance of Polymer/Fullerene Solar Cells," Journal of Physical Chemistry C 111:8137-8141, 2007.
Kim et al., "Lead Iodide Perovskite Sensitized All-Solid-State Submicron Thin Film Mesoscopic Solar Cell with Efficiency Exceeding 9%," Scientific Reports 2(591):1-7, 2012.
Klimov, "Spectral and Dynamical Properties of Multiexcitons in Semiconductor Nanocrystals," Annu. Rev. Phys. Chem. 58:635-673, 2007.
Kozlov et al., "Laser action in organic semiconductor waveguide and double-heterostructure devices," Nature 389:362-364, Sep. 25, 1997.
Kroeze et al., "Contactless Determination of the Photoconductivity Action Spectrum, Exciton Diffusion Length, and Charge Separation Efficiency in Polythiophene-Sesitized $TiO_2$ Bilayers," J. Phys. Chem. B 107:7696-7705, 2003.
Kumar et al., "Flexible, low-temperature, solution processed ZnO-based perovskite solid state solar cells," Chem. Commun. 49:11087-11091, 2013.
Lampert et al., "Controlling Morphology and Chain Aggregation in Semiconducting Conjugated Polymers: The Role of Solvent on Optical Gain in MEH-PPV," J. Phys. Chem. B 116:12835-12841, 2012.
Laubsch et al., "High-Power and High-Efficiency InGaN-Based Light Emitters," IEEE Transactions on Electron Devices 57(1):79-87, Jan. 2010.
Lee et al., "Efficient Hybrid Solar Cells Based on Meso-Superstructured Organometal Halide Perovskites," Science 338:643-647, Nov. 2, 2012.
Liao et al., "Low Threshold, Amplified Spontaneous Emission from Core-Seeded Semiconductor Nanotetrapods Incorporated into a Sol-Gel Matrix," Adv. Mater. 24:OP159-OP164, 2012.
Liu et al., "Tailoring the Lasing Modes in Semiconductor Nanowire Cavities Using Intrinsic Self-Absorption," Nano Lett. 13:1080-1085, 2013.
Lunt et al., "Relationship between Crystalline Order and Exciton Diffusion Length in Molecular Organic Semiconductors," Adv. Mater. 22:1233-1236, 2010.
Mehraeen et al., "Role of band states and trap states in the electrical properties of organic semiconductors: Hopping versus mobility edge model," Physical Review B 87, 195209, 2013, 9 pages.
Mitzi et al., "Conducting Layered Organic-Inorganic Halides Containing <110>-Oriented Perovskite Sheets," Science 267:1473-1476, Mar. 10, 1995.
Mueller et al., "Slow Hot-Carrier Relaxation in Colloidal Graphene Quantum Dots," Nano Lett. 11:56-60, 2011.
Najafov et al., "Observation of long-range exciton diffusion in highly ordered organic semiconductors," Nature Materials 9:938-943, Nov. 2010.
Namdas et al., "Low Thresholds in Polymer Lasers on Conductive Substrates by Distributed Feedback Nanoimprinting: Progress Toward Electrically Pumped Plastic Lasers," Adv. Mater. 21:799-802, 2009.
O'Regan et al., "A low-cost, high-efficiency solar cell based on dye-sensitized colloidal $TiO_2$ films," Nature 353:737-740, Oct. 24, 1991.

(56) References Cited

OTHER PUBLICATIONS

Ostojic et al., "Stability of High-Density One-Dimensional Excitons in Carbon Nanotubes under High Laser Excitation," *Physical Review Letters* 94, 097401, 2005, 4 pages.
Peumans et al., "Small molecular weight organic thin-film photodetectors and solar cells," *Journal of Applied Physics* 93(7):3693-3723, Apr. 1, 2003.
Piris et al., "Photogeneration and Ultrafast Dynamics of Excitons and Charges in P3HT/PCBM Blends," *J. Phys. Chem. C* 113:14500-14506, 2009.
Selinsky et al., "Quantum dot nanoscale heterostructures for solar energy conversion," *Chem. Soc. Rev.* 42:2963-2985, 2013.
Shaklee et al., "Direct Determination of Optical Gain in Semiconductor Crystals," *Applied Physics Letters* 18(11):475-477, Jun. 1, 1971.
Shaw et al., "Exciton Diffusion Measurements in Poly(3-hexylthiophene)," *Adv. Mater.* 20:3516-3520, 2008.
Sirringhaus, "Device Physics of Solution-Processed Organic Field-Effect Transistors," *Adv. Mater.* 17:2411-2425, 2005.
Sun et al., "The origin of high efficiency in low-temperature solution-processable bilayer organometal halide hybrid solar cells," *Energy Environ. Sci* 7:399-407, 2014.
Uhd Jepsen et al., "Ultrafast carrier trapping in microcrystalline silicon observed in optical pump-terahertz probe measurements," *Applied Physics Letters* 79(9):1291-1293, Aug. 27, 2001.
van Duren et al., "Relating the Morphology of Poly(p-phenylene vinylene)/Methanofullerene Blends to Solar-Cell Performance," *Adv. Funct. Mater.* 14(5):425-434, May 2004.
Wehrenfennig et al., "High Charge Carrier Mobilities and Lifetimes in Organolead Trihalide Perovskites," *Adv. Mater.* 26:1584-1589, 2014.
Willa et al., "From organic single crystals to solution processed thin-films: Charge transport and trapping with varying degree of order," *Journal of Applied Physics* 113, 133707, 2013, 8 pages.
Wu et al., "Uncovering loss mechanisms in silver nanoparticle-blended plasmonic organic solar cells," *Nature Communications* 4(2004), 2013, 14 pages.
Xia et al., "Fluorene-based polymer gain media for solid-state laser emission across the full visible spectrum," *Applied Physics Letters* 82(21):3599-3601, May 26, 2003.
Xing et al., "Charge transfer dynamics in Cu-doped ZnO nanowires," *Applied Physics Letters* 98, 102105, 2011, 4 pages.
Xing et al., "Long-Range Balanced Electron- and Hole-Transport Lengths in Organic-Inorganic $CH_3NH_3PbI_3$," *Science* 342:344-347, Oct. 18, 2013.
Xing et al., "Ultrafast Exciton Dynamics and Two-Photon Pumped Lasing from ZnSe Nanowires," *Adv. Optical Mater.* 1:319-326, 2013.
Xing et al., "Ultralow-Threshold Two-Photon Pumped Amplified Spontaneous Emission and Lasing from Seeded CdSe/CdS Nanorod heterostructures," *ACS Nano* 6(12):10835-10844, 2012.
Yella et al., "Porphyrin-Sensitized Solar Cells with Cobalt (II/III)-Based Redox Electrolyte Exceed 12 Percent Efficiency," *Science* 334:629-634, Nov. 4, 2011.
Zhang et al., "Enhancement of Perovskite-Based Solar Cells Employing Core-Shell Metal Nanoparticles," *Nano. Lett.* 13:4505-4510, 2013.
Zhang et al., "Preparations and Characterizations of Luminescent Two Dimensional Organic-inorganic Perovskite Semiconductors," *Materials* 3:3385-3406, 2010.
Zhitomirsky et al., "Measuring Charge Carrier Diffusion in Coupled Colloidal Quantum Dot Solids," *ACS Nano* 7(6):5282-5290, 2013.
Chondroudis et al., "Electroluminescence from an Organic-Inorganic Perovskite Incorporating a Quarterthiohene Dye within Lead Halide Perovskite Layers," *Chem. Mater.*, vol. 11, pp. 3028-3030, 1999.
Era et al., "Polarized electroluminescence from oriented p-sexiphenyl vacuum-deposited film," *Applied Physics Letters*, 67(17):2436-2438, Oct. 23, 1995.

Hirasawa, M. et al., "Exciton Features in 0-, 2-, and 3-Dimensional Networks of $PBI_6]^{4-}$ Octahedra," *Journal of the Physical Society of Japan* 63(10):3870-3879, Oct. 1994.
Ishihara, T., "Optical Properties of Pb-Based Inorganic-Organic Perovskites," World Scientific Publishing Co. Pte. Ltd., Chapter 6, 1998.
Xing, G. et al., "Low-temperature solution-processed wavelength-tunable perovskites for lasing," *Nature Materials*, vol. 13, pp. 476-480, May 2014.
Baets et al., "Resonant-Cavity Light-Emitting Diodes: a review," *Proceedings of SPIE*, 4996:74-86, 2003.
Era et al., "Organic-inorganic heterostructure electroluminescent device using a layered perovskite semiconductor $(C_6H_5C_2H_4NH_3)_2PbI_4$," *Appl. Phys. Lett.*, 65(6):676-678, 1994.
Burschka et al., "Sequential deposition as a route to high-performance perovskite-sensitized solar cells," *Nature* 499:316-320, Jul. 18, 2013.
Chen et al., "Nanolasers grown on silicon," *Nature Photonics* 5:170-175, 2011.
Chung et al., "All-solid-state dye-sensitized solar cells with high efficiency," *Nature* 485:486-490, 2012.
Chung et al., "$CsCnI_3$: Semiconductor or Metal? High Electrical Conductivity and Strong Near-Infrared Photoluminescence from a Single Material. High Hole Mobility and Phase-Transitions," *Journal of American Chemical Society* 134:8579-8587, 2012.
Deschler et al., "High Photoluminescence Efficiency and Optical Pumped Lasing in Solution-Processed Mixed Halide Perovskite Semiconductors," *The Journal of Physical Chemistry Letters* 5:1421-1426, 2014.
Duan et al., "Single-nanowire electrically driven lasers," *Nature* 421:241-245, 2003.
Guo et al., "Recent progress in the development of near-infrared fluorescent probes for bioimaging applications," *Chem. Soc. Rev.* 43:16-29, 2014.
Hall et al., "Coherent Light Emission from GaAs Junctions," *Physical Review Letters* 9(9):366-369, 1962.
Hao et al., "Lead-free solid-state organic-inorganic halide perovskite solar cells," *Nature Photonics* 8:489-494, 2014.
Huang et al., "Electronic band structure, phonons, and exciton binding energies of halide perovskites $CsSnCl_3$, $CsSnBr_3$, and $CsSnI_3$," *Physical Review B* 88(165203), 1-12, 2013.
Jeon et al., "Compositional engineering of perovskite materials for high-performance solar cells," *Nature* 517:476-489, 2015.
Kojima et al., "Organometal Halide Perovskites as Visible-Light Sensitizers for Photovoltaic Cells," *J. Am. Chem. Soc.* 131:6050-6051, 2009.
Kumar et al., "Lead-Free Halide Perovskite Solar Cells with High Photocurrents Realized Through Vacancy Modulation," *Advanced Materials* 26:7122-7127, 2014.
Lyon et al., "Near-Infrared Spectral Imaging for Quality Assurance of Pharmaceutical Products: Analysis of Tablets to Assess Powder Blend Homogeneity," *PharmSciTech* 3(3), 2002, 15 pages.
Motta et al., "Revealing the role of organic cations in hybrid halide perovskite $CH_3NH_3PbI_3$," *Nature Communications* 6(7026):1-7, 2015.
Noel et al., "Lead-free organic-inorganic tin halide perovskites for photovoltaic applications," *Energy & Environmental Science* 7:3061-3068, 2014.
Saba et al., "Correlated electron-hole plasma in organometal perovskites," *Nature Communications* 5(5049):1-10, 2014.
Shum et al., "Synthesis and characterization of $CsSnI_3$ thin films," *Applied Physics Letters* 96:221903, 2010, 4 pages.
Snee et al., "Whispering-Gallery-Mode Lasing from a Semiconductor Nanocrystal/ Miscrosphere Resonator Composite," *Advanced Materials* 17: 1131-1136, 2005.
Stranks et al., "Electron-Hole Diffusion Lengths Exceeding 1 Micrometer in an Organometal Trihalide Perovskite Absorber," *Science* 342(6156):341-344, 2013.
Tanabe et al., "III-V / Si hybrid photonic devices by direct fusion bonding," *Scientific Reports* 2:349, 2012, 6 pages.
Wu et al., "III-Nitride-Based Microarray Light Emitting Diodes with Enhanced Light Extraction Efficiency," *Japanese Journal of Applied Physics* 47(8):6757-6759, 2008.

(56) References Cited

OTHER PUBLICATIONS

Yakunin et al., "Low-threshold amplified spontaneous emission and lasing from colloidal nanocrystals of caesium lead halide perovskites," *Nature Communications* 6(8056):1-8, 2015.
Yoon et al., "GaAs photovoltaics and optoelectronics using releasable multilayer epitaxial assemblies," *Nature* 465:329-334, 2010.
Zhu et al., "Lead halide perovskite nanowire lasers with low lasing thresholds and high quality factors," *Nature Materials* 14:636-643, 2015.

* cited by examiner

300 provide a gain medium including an organic-inorganic perovskite halide material

302 provide a pump source configured to provide energy to the gain medium

304

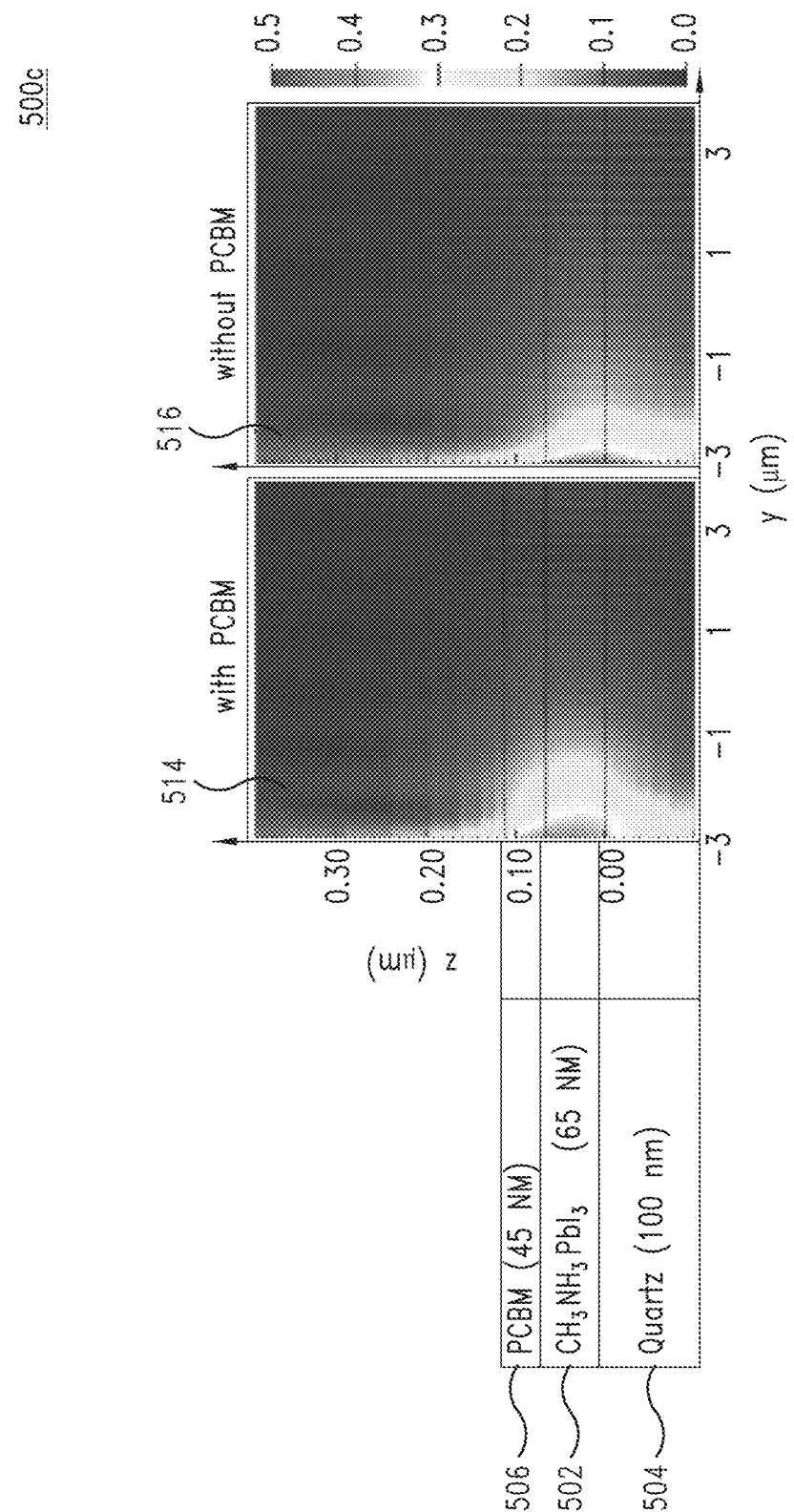

The relative PL quantum yield ($\eta_{PL}$), PL decay time ($\tau_{PL}$), TA decay time ($\tau_{TA}$) and the estimated charge carrier transfer time ($\tau_{CT}$) from the TA results.

| | $\eta_{PL}$ | $\tau_{PL}$ [ns] | $\tau_{TA}$ [ns] | $\tau_{CT}$ [ns] |
|---|---|---|---|---|
| $CH_3NH_3PbI_3$ | 1 | 4.5 | 5.64 | - |
| $CH_3NH_3PbI_3$/PCBM | 0.02 | 0.37 | 0.37* | 0.40 |
| $CH_3NH_3PbI_3$/Spiro-OMeTAD | 0.08 | 0.64 | 0.59* | 0.66 |

*Lifetime of the additional fast decay component.

EMISSION SOURCE AND METHOD OF FORMING THE SAME

CROSS-REFERENCE TO RELATED APPLICATIONS

This application claims the benefit of priority of U.S. application No. 61/876,940 filed Sep. 12, 2013, the contents of it being hereby incorporated by reference in its entirety for all purposes.

TECHNICAL FIELD

Various aspects of this disclosure relate to emission sources and methods of forming the same.

BACKGROUND

A laser (acronym for light amplification by stimulated emission of radiation) emits coherent light through a process of optical amplification via the stimulated emission of electromagnetic radiation. Lasers or coherent light sources have many important applications which form the cornerstones of our modern society. These range from fast information processing and telecommunications; optical data storage; bio-imaging; medical diagnostic and phototherapy to scientific research and defence applications. The demands for such applications continue to grow with Mankind's relentless pursuit of sustainable growth.

The heart of a laser is its gain medium—a material that makes light stronger or permits optical amplification to occur. Optical amplification, also known as gain occurs when the gain material transfers part of its energy to light and makes the light more intense and in phase. Typical gain media include crystals (e.g., neodymium-doped yttrium aluminum garnet (Nd:YAG), titanium doped aluminum oxide (Ti:Sapphire) and neodymium-doped yttrium orthovanadate (Nd:YVO$_4$) etc.) and high quality semiconductors (e.g. gallium arsenide (GaAs) and aluminum gallium arsenide (Al$_x$Ga$_{(1-x)}$As) etc). These gain media typically operate in the infrared (IR) region of the electromagnetic spectrum. To obtain wavelengths in the ultraviolet (UV) or visible (VIS) region, wavelength conversion of IR photons with nonlinear crystals is performed. For example, in the modest hand-held laser pointer, the green light is generated indirectly—beginning with an AlGaAs laser diode (808 nm) pumping a NdYVO$_4$ crystal to generate 1064 nm photons which are then frequency doubled by a KTP crystal to 532 nm. It is important to note the stringent conditions needed to prepare the high quality, crystalline gain materials, which involve costly high temperature growth and processing. For example, GaAs and Al$_x$Ga$_{(1-x)}$As heterostructures require expensive elevated temperature and high vacuum growth techniques such as chemical vapor deposition (CVD) and molecular beam epitaxy (MBE).

SUMMARY

In various embodiments, an emission source may be provided. The emission source may also include a gain medium including a halide semiconductor material. The emission source may further include a pump source configured to provide energy to the gain medium.

In various embodiments, a method of forming an emission source may be provided. The method may include providing a gain medium including a halide semiconductor material. The method may also include providing a pump source configured to provide energy to the gain medium.

BRIEF DESCRIPTION OF THE DRAWINGS

The invention will be better understood with reference to the detailed description when considered in conjunction with the non-limiting examples and the accompanying drawings, in which:

FIG. 3 shows a schematic of a method of forming an emission source according to various embodiments.

FIG. 5C is a schematic showing intensity distributions in the y-z plane of structures of light polarized parallel to the structure surface.

FIG. 25 is a table showing relative photoluminescence (PL) quantum yield ($\varsigma_{PL}$), PL decay time ($\tau_{PL}$), TA decay time ($\tau_{TA}$) and the estimated charge transfer time ($\tau_{CT}$) from the TA results.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, and logical changes may be made without departing from the scope of the invention. The various embodiments are not necessarily mutually exclusive, as some embodiments can be combined with one or more other embodiments to form new embodiments.

In order that the invention may be readily understood and put into practical effect, particular embodiments will now be described by way of examples and not limitations, and with reference to the figures.

Various embodiments relate to low temperature, solution processable high crystallinity gain media. Various embodiments not only reduce the production costs but also permit application of such solution processable gain media to a much wider range of resonator designs compatible for on-chip integration.

Figure 1:
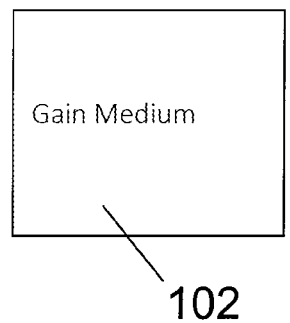
FIG. 1 is a schematic showing a cross-sectional side view of an emission source according to various embodiments.
Figure 1:
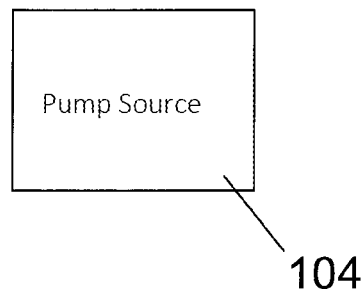

FIG. 1 is a schematic 100 showing an emission source according to various embodiments. The emission source may also include a gain medium 102, the gain medium 102 including a halide semiconductor material. The emission source may further include a pump source 104 configured to provide energy to the gain medium 102.

In other words, the emission source may include a gain medium 102 made of a halide semiconductor material. The emission source may further include a pump source 104 to provide energy to the gain medium 102.

The halide semiconductor material may also be referred to as a halide semiconductor. The halide semiconductor material may be or may include a halide perovskite material. The halide perovskite material may include an organic-inorganic perovskite material. The halide perovskite material may be or may include a three dimensional halide perovskite material. The halide perovskite material may also be referred to as perovskite material. In general, the halide semiconductor material may be or may include a three dimensional halide semiconductor material.

Figure 2A:
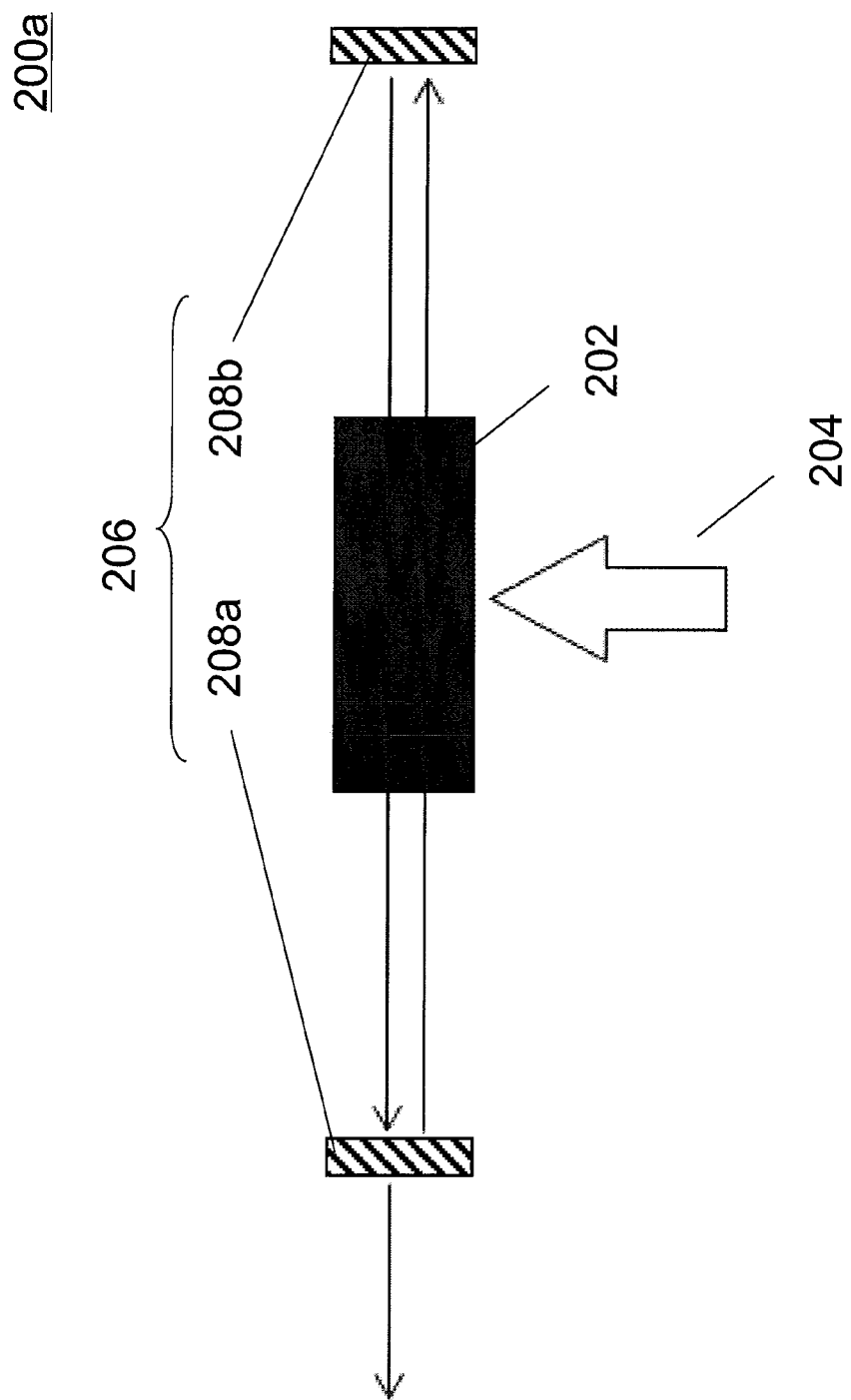
FIG. 2A is a schematic showing a cross-sectional side view of an emission source according to various embodiments.

FIG. 2A is a schematic 200a showing a cross-sectional side view an emission source according to various embodiments. The emission source may also include a gain medium 202, the gain medium 202 including a halide semiconductor material such as a halide perovskite material. The emission source may further include a pump source 204 configured to provide energy to the gain medium 202.

In various embodiments, the emission source may be a source for providing amplified spontaneous emission (ASE). In addition, the emission may additionally or alternatively provide spontaneous emission (SE), and/or stimulated emission (laser).

The pump source 204 may be configured to supply energy to the gain medium through a process called pumping. In various embodiments, the pump source 204 may be or may include an optical source configured to provide light as energy to the gain medium 202. The optical source may a flash lamp or by a laser. The optical source may emit light of a wavelength different from the light which the emission source generates or emit.

In various alternate embodiments, the pump source 204 may be or may include an electrical source configured to provide electrical energy to the gain medium 202. The electrical source may be configured to supply a current to the gain medium 202.

As shown in FIG. 2A, the emission source may include a resonant cavity 206. The gain medium 202 may be arranged within the resonant cavity 206. The resonant cavity 206 may be an open cavity. In other words, the gain medium 202 may be arranged to couple with a resonant cavity 206. In various embodiments, the resonant cavity 206 may be defined by a first reflective structure 208a and a second reflective structure 208b. The gain medium 202 may be arranged between the first reflective structure 208a and the second reflective structure 208b along an optical axis. The resonant cavity 206 may also be referred to as an optical cavity.

The first reflective structure 208a may be arranged to reflect light incident on the first reflective structure 208a towards the second reflective structure 208b along the optical axis and the second reflective structure 208b may be arranged to reflect light incident on the second reflective surface 208b towards the first reflective surface 208a along the optical axis. In other words, light may bounce between the first reflective structure 208a and the second reflective structure 208b, passing through the gain medium 204 after each reflection. As the light passes through the gain medium 204, a wavelength or range of wavelengths of the light is amplified by stimulated emission.

The first reflective structure 208a and the second reflective structure 208b may be arranged substantially parallel to each other.

The first reflective structure 208a may be partially transparent so that light incident in the first reflective structure 208a may be partially transmitted through the first reflective structure 208a and partially reflected towards the second reflective structure 208b along the optical axis. The first reflective structure 208a may be referred to as an optical coupler. The second reflective structure 208b may be a highly reflective mirror. The resonant cavity 206 may be defined or may include other suitable arrangements of reflective surfaces. The halide semiconductor material may be represented by the general formula $AMX_3$, where A may be a monopositive organic or inorganic ion (e.g. an organic group or organic cation or a metal cation or element), M may be a divalent metal cation or element, and X may be a halogen anion or element. Examples may include $CH_3NH_3PbI_3$, $CH_3NH_3PbBr_3$, $CH_3NH_3PbBr_2I$, $CsSnI_3$, $CsPbI_3$, $NH_2CH=NH_2PbI_3$. The halide semiconductor material may be alternatively represented by $A_2MX_6$, where A may be a monopositive organic or inorganic ion (e.g. an organic group or organic cation or a metal cation or element), M may be a tetravalent metal cation or element, and X may a halogen anion or element. Examples may include $Cs_2SnI_6$, $(CH_3NH_3)_2SnI_6$. The halide semiconductor material may also have the general formula $A_{2+m}M_mX_{3m+2}$, where A may be a monopositive organic or inorganic ion (e.g. an organic group or organic cation or a metal cation or element), M may be a divalent metal cation or element, and X may an halogen anion or element (m greater or equal to 1). Examples may include $(CH_3NH_3)_3SnI_5$, $(NH_2CH=NH_2)_2CH_3NH_3SnI_5$, $(NH_2CH=NH_2)_2CH_3NH_3SnI_2Br_3$. The halide semiconductor may instead be represented by the formula $A_{3n-1}M_nX_{3n+1}$, where A may be a monopositive organic or inorganic ion (e.g. an organic group or organic cation or a metal cation or element), M may be a divalent metal cation or element, and X may an halogen anion or element (n greater or equal to 1). An example may be $(CH_3NH_3)_2CuCl_3Br$. In various embodiments, the halide semiconductor material may include an organic ammonium cation or organic ammonium cation group. The organic group may be the organic ammonium cation or group. The organic ammonium group may be selected from a group consisting of an ammonium group, a hydroxylammonium group, a methylammonium group, a hydrazinium group, a azetidinium group, a formamidinium group, an imidazolium group, a dimethylammonium group, an ethylammonium group, a guanidinium group, a group with formula $[C_nH_{2n+1}NH_3]$ where $2<n<20$ or a long chain group such as phenethylammonium group $[(C_6H_5—C_2H_4)NH_3]$ and combinations thereof. The organic ammonium cation may be selected from a group consisting of an ammonium ion $[NH_4]^+$, a hydroxylammonium ion $[H_3NOH]^+$, a methylammonium ion $[(CH_3)NH_3]^+$, a hydrazinium ion $[H_3N—NH_2]^+$, an azetidinium ion $[(CH_2)_3NH_2]+$, a formamidinium ion $[NH_2(CH)NH_2]^+$, an imidazolium ion $[C_3N_2H_5]^+$, a dimethylammonium ion $[(CH_3)_2NH_2]^+$, an ethylammonium ion $[(C_2H_5)NH_3]^+$, a guanidinium ion $[C(NH_2)_3]^+$, a cation with formula $[C_nH_{2n+1}NH_3]^+$ where $2<n<20$ or a long chain ion such as phenethylammonium ion $[(C_6H_5—C_2H_4)NH_3]^+$ and combinations thereof. In various alternate embodiments, the halide semiconductor material may include a metal cation such as $Cs^+$, $K^+$, $Rb^+$. The halide semiconductor material may include a metal such as Cs, K or Rb.

The one or more metal elements may be selected from Group 14 of the periodic table. The halide semiconductor material may include one or more metal elements selected from a group consisting of Cu, Pb, Sn, Ge, Eu, Cr, Mn, Ni, Zn, Pd, Cd, Hg, Ba and Sr. The halide semiconductor material may include one or more metal cations selected from the cationic 2+ group (e.g. $Cu^{2+}$, $Pb^{2+}$, $Sn^{2+}$ $Ge^{2+}$, $Eu^{2+}$, $Cr^{2+}$, $Mn^{2+}$, $Ni^{2+}$, $Zn^{2+}$, $Pd^{2+}$, $Cd^{2+}$, $Hg^{2+}$, $Ba^{2+}$ and $Sr^{2+}$).

The one or more halogen elements may be selected from Group 17 of the periodic table. The halide semiconductor material may include one or more halogen elements selected from a group consisting of F, I, Cl and Br. The halide semiconductor material may include one or more halide anions selected from a group consisting of $F^-$, $I^-$, $Cl^-$ and $Br^-$.

Examples of halide semiconductor materials may for instance include $HNC(NH_2)_2SnF_3$, $C_2H_5NH_3Pb_{0.5}Sn_{0.5}Cl_3$, and $CH_3NH_3SnFCl_2$.

Various embodiments relate to halide semiconductor materials as a gain medium. Various embodiments relate to the use or the application of low temperature solution processed halide semiconductor materials as coherent light emission gain medium that could be driven by photons and/or electrons.

The emission source may be configured to generate light, i.e. amplified spontaneous emission, spontaneous emission, and/or laser beam. The emission source may be configured to generate or emit coherent light. A coherent light may mean a polarized electromagnetic wave at a frequency whose phase is correlated over a relatively large distance (the coherence length) along the beam. The coherence length may be more than 10 cm or more than 15 cm or more than 20 cm or more than 50 cm or more than 1 m. The emission source may be configured to generate the amplified spontaneous emission and/or laser beam when energy is supplied or pumped into the gain medium 202 by the pump source 204.

In the present context, light may be any electromagnetic waves or combination of electromagnetic waves. In various embodiments, the emission source may be configured to generate light of a wavelength or range of wavelengths from a range of 250 nm to about 1 mm, e.g. about 380 nm to about 1 mm, e.g. from about 390 to about 790 nm. The emission source may be configured to generate visible light and/or infrared light. In other words, lasing wavelengths spanning from the visible to the infrared may be achieved using this class of materials.

Halide semiconductor materials may have a low trap density. The gain medium 202 may have a trap density below $10^{18}$ $cm^{-3}$, e.g. below $0.5\times10^{18}$ $cm^{-3}$, e.g. below $10^{17}$ $cm^{-3}$, e.g. below $0.5\times10^{17}$ $cm^{-3}$, e.g. below $10^{16}$ $cm^{-3}$. The gain medium may be configured to achieve amplified spontaneous emission (ASE) at a pump fluence substantially equal to or below 50 µJ $cm^{-2}$, e.g. substantially equal to or below 20 µJ $cm^{-2}$, e.g. substantially equal to or below 15 µJ $cm^{-2}$, substantially equal to or below 14 µJ $cm^{-2}$, e.g. substantially equal to or below 12 µJ $cm^{-2}$, substantially equal to or below 10 µJ $cm^{-2}$. The threshold pump fluence may be dependent on the quality of the cavity. The emission source may be configured to generate light via amplified spontaneous emission (ASE).

The low trap density of halide semiconductor materials may allow amplified spontaneous emission (ASE) in bare films (i.e. without any cavity or optical feedback) to be achieved with the ultralow threshold pump fluence.

In various embodiments, the halide semiconductor material may have a ASE threshold carrier density below $10^{19}$ $cm^{-3}$, e.g. below $5\times10^{18}$ $cm^{-3}$, e.g. below $2\times10^{18}$ $cm^{-3}$ e.g. about $1.7\times10^{18}$ $cm^{-3}$.

Halide semiconductor materials may also exhibit high optical stability and durability. Halide semiconductor materials may have long range balanced electron and hole diffusion lengths that makes it possible to achieve efficient electrical-driven lasing.

In various embodiments, the gain medium 202 may have a bulk trap density below or about $10^{17}$ $cm^{-3}$, e.g. below or about $6\times10^{16}$ $cm^{-3}$, below or about $6\times10^{16}$ $cm^{-3}$.

Further, the gain medium may include halide semiconductor materials (e.g. halide perovskite materials) that are solution processable. A solution processable gain medium has much greater versatility than traditional gain media for integration with existing silicon based technologies. The halide semiconductor materials may be applied to a much wider range of optical cavity designs and substrates by methods such as spin-coating, dip-coating or dropcasting. Further, halide semiconductor materials exhibit broadband gain profile. In various embodiments, the gain medium may have undergone a post film treatment. In various embodiments, the gain medium may further include additives to control trap density. Additives may include metal halides with a generic structure $MI_2$, where M represents a metal cation and I represents the iodide anion. Non-limiting examples include $PBI_2$, $SnI_2$, $SnF_2$. The additives may be configured to control metal vacancies/oxidation states. Other additives to improve film formation properties may include acids such as HCl, HI or other halide derivatives such as $CH_3NH_3Cl$.

Facile substitution of the metal element and organic component may allow a wide choice of lasing wavelengths. For instance, the material may be or may include $CH_3NH_3PbCl_3$, $CH_3NH_3PbCl_{1.5}Br_{1.5}$ and/or $CH_3NH_3PbCl_2Br$. In various embodiments, the halide semiconductor material may include more than one organic cation or group. The halide semiconductor material may include more than one metal cation. The halide semiconductor material may include more than one halide anion. The gain medium 202 may include more than one halide semiconductor materials. For instance, the gain medium 202 may include a mixture of $CH_3NH_3PbCl_3$, $CH_3NH_3PbCl_{1.5}Br_{1.5}$ and $CH_3NH_3PbCl_2Br$ In various embodiments, the halide semiconductor material layer may on a substrate such as a quartz substrate. In various embodiments, the emission source may include a layer such as $CH_3NH_3PbI_3$/[6,6]-phenyl-C61-butyric acid methyl ester (PCBM) on or in contact with the halide semiconductor material layer. In various embodiments, the gain medium may include a substrate and a halide semiconductor material layer on the substrate. In various embodiments, the gain medium may further include a layer such as $CH_3NH_3PbI_3$/[6,6]-phenyl-C61-butyric acid methyl ester (PCBM) on the halide semiconductor material layer.

Various embodiments may find applications in areas such as telecommunication, quantum computing, data storage and reading out (CD, DVD), laser pointer, barcode readers, laser printers, image scanners, laser surgery, industrial laser machining, directed energy weaponry, laser medicine, etc.

Figure 2B:
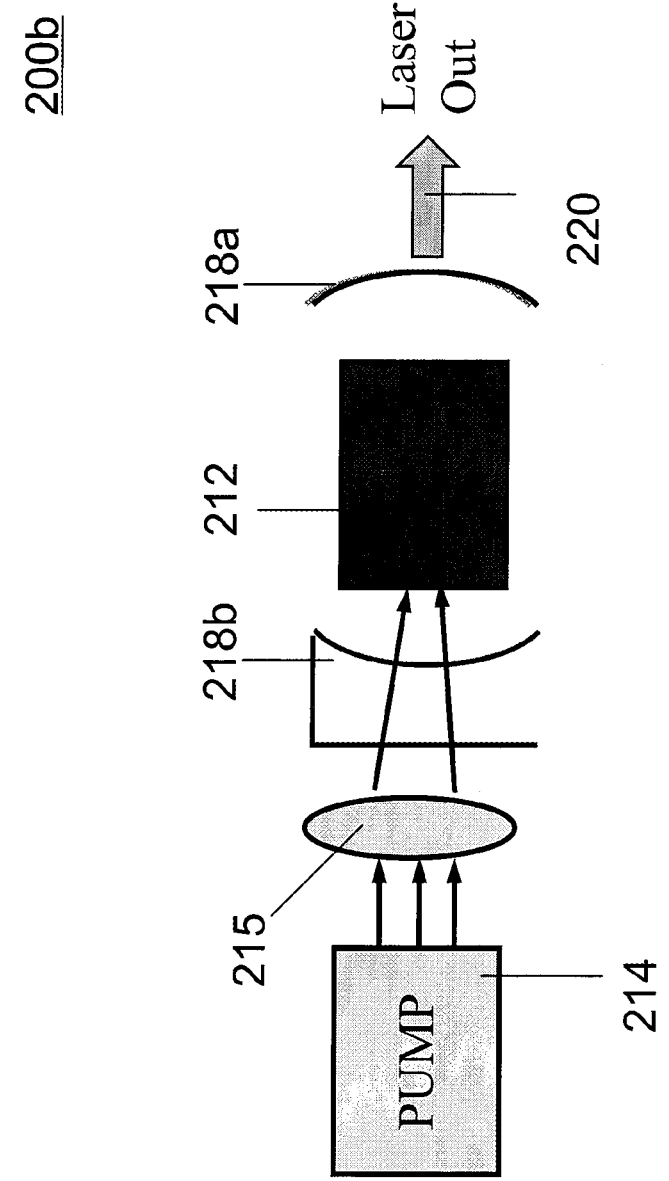
FIG. 2B shows a schematic showing a cross-sectional side view of an emission source according to various embodiments.

FIG. 2B shows a schematic 200b showing a cross-sectional side view of an emission source according to various embodiments. The emission source may also include a gain medium 212, the gain medium 212 including a halide semiconductor material such as a halide perovskite material. The emission source may further include a pump source 214 configured to provide energy to the gain medium 212.

The emission source may be or may include an optical pumped bulk perovskite laser according to various embodiments. The halide semiconductor material may be or may include a three-dimensional perovskite gain material 212 such as $CH_3NH_3PbX_3$ (X=Cl, Br, I or their combinations), $CsSnI_3(SnF_2)_x$ or any other suitable perovskite material. The perovskite gain materials may be contained in an optical cavity such as a self formed optical cavity or formed by other optical elements such as partially transmission mirror 218a and mirrored element 218b. The elements 218a, 218b may be the reflective structures. The mirrored element 218b may be disposed at one end of the gain material 212 and the partially transmission mirror 218a may be disposed at the other end. A suitable pumping source 214 such as a Ti:sapphire laser may provide a pumping energy (e.g. at a wavelength of 400 nm). The energy may be transmitted through lens 215 and mirror 218b to energize the perovskite material. The laser output beam 220 may exit through the partially reflective mirror 218a.

Figure 2C:
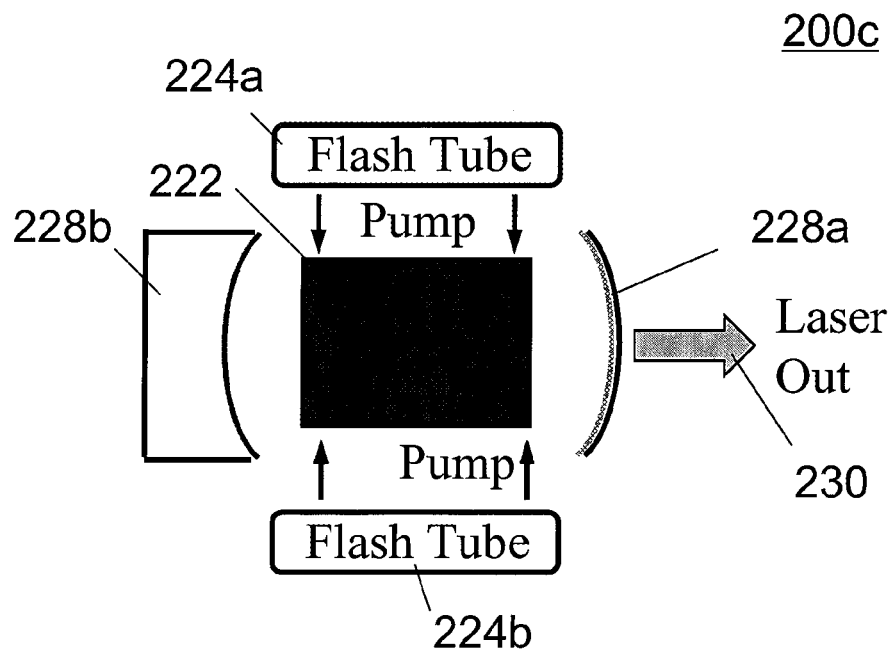
FIG. 2C shows a schematic showing a cross-sectional side view of an emission source according to various alternate embodiments.

FIG. 2C shows a schematic 200c showing a cross-sectional side view of an emission source according to various alternate embodiments. The emission source may also include a gain medium 222, the gain medium 222 including a halide semiconductor material such as a halide perovskite material. The emission source may further include a pump source 224a, 224b configured to provide energy to the gain medium 222. The pump source 224a, 224b may include a first flash tube 224a and a second flash tube 224b arranged on opposing sides of the gain medium 222. The emission structure may further include partially transmission mirror 228a and mirrored element 228b. The elements 228a, 228b may be the reflective structures.

The emission source shown in FIG. 2C may be referred to as a flash tube side pumped perovskite laser. The gain medium 222 may be side pumped using flash tubes 224a, 224b.

Figure 2D:
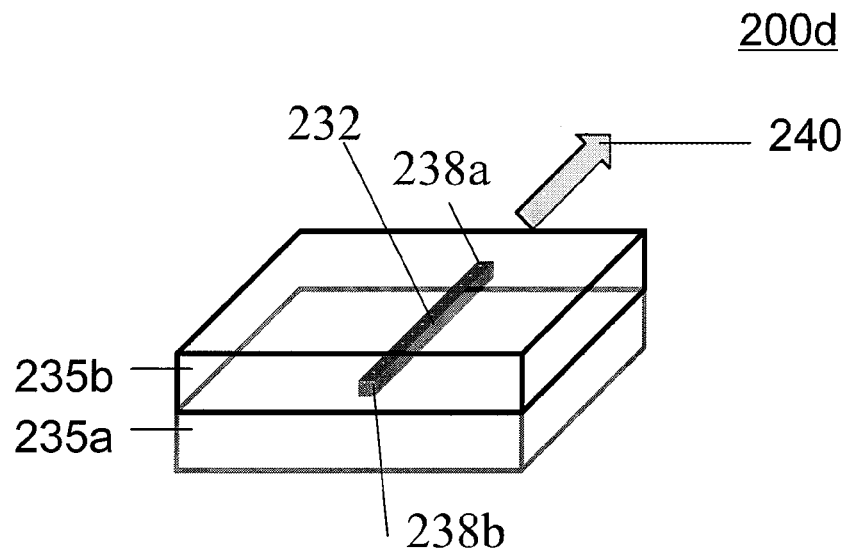
FIG. 2D shows a schematic showing a perspective view an emission source according to various alternate embodiments.
Figure 2E:
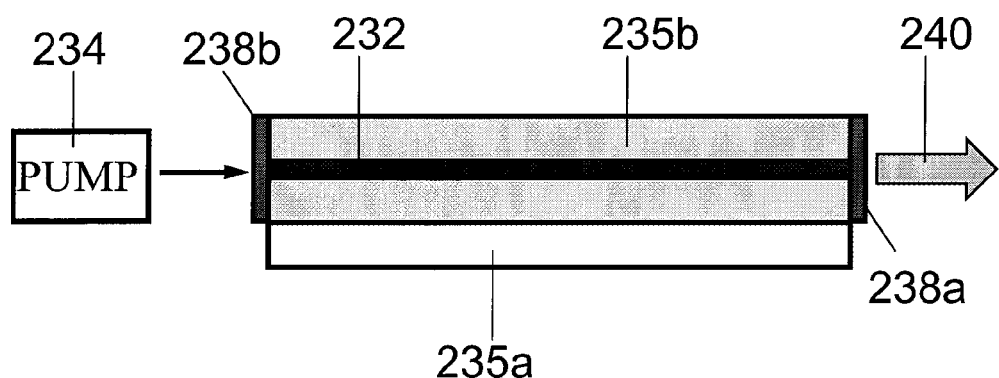
FIG. 2E shows a schematic showing a cross-sectional side view of the emission source of FIG. 2D according to various embodiments.

FIG. 2D shows a schematic 200d showing a perspective view an emission source according to various alternate embodiments. FIG. 2E shows a schematic 200e showing a cross-sectional side view of the emission source of FIG. 2D according to various embodiments. The emission source may also include a gain medium 232, the gain medium 232 including a halide semiconductor material such as a halide perovskite material. The emission source may further include a pump source 234 configured to provide energy to the gain medium 232. The gain medium 232 may be a perovskite waveguide.

Although we only show bulk lasers with perovskite used as the gain material in the earlier figures, various embodiments may relate also to perovskite channel waveguide laser as shown in FIG. 2D. The perovskite channel waveguide laser may be conveniently formed on a substrate 235a (including a material such as silica or aluminum oxide). The perovskite waveguide 232 may be formed for example, using a suitable lithographic approach. The channel perovskite waveguide 232 may be covered with an overcoating or cladding layer 235b, the overcoating or cladding layer 235b including a suitable polymer or dielectric material with refractive index lower than the perovskite material. The perovskite waveguide 232 may include two mirrored ends 238a, 238b as reflective structures. Laser beam 240 may exit the less reflective end 238a.

Figure 2F:
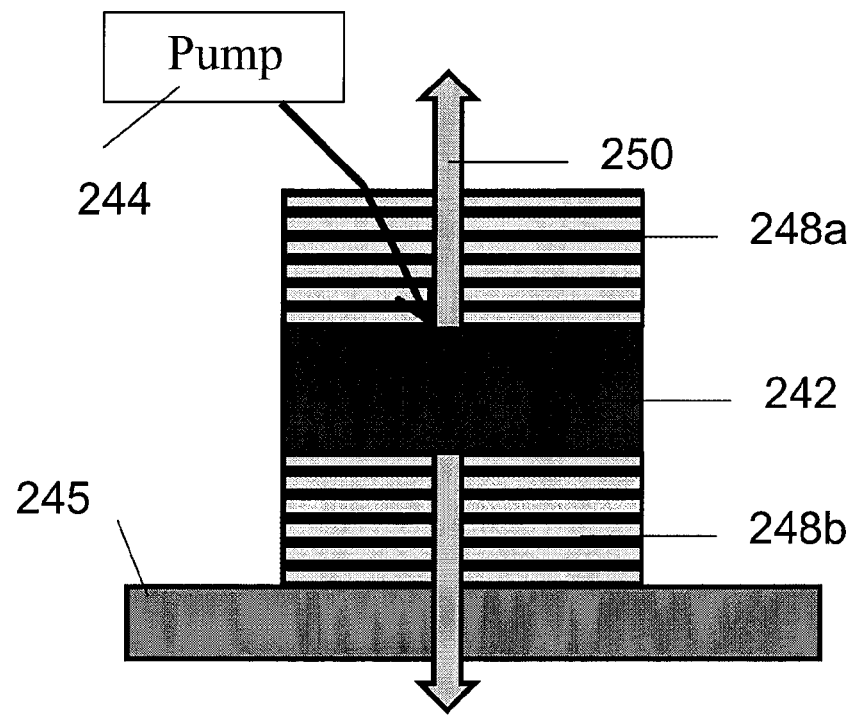
FIG. 2F shows a schematic showing a cross-sectional side view of an emission source according to various other embodiments.

FIG. 2F shows a schematic 200f showing a cross-sectional side view of an emission source according to various other embodiments. The emission source may also include a gain medium 242, the gain medium 242 including a halide semiconductor material such as a halide perovskite material. The emission source may further include a pump source 244 configured to provide energy to the gain medium 242. The gain medium 242 may be a perovskite waveguide. The emission source may be or may include a top optical pumped bulk perovskite Distributed Bragg Reflector (DBR) laser.

The perovskite DBR laser may be on a substrate 245 with periodic structures 248a, 248b serving as gratings to provide optical feedback for the emission in the perovskite gain medium 242. Laser beam 250 exits from the top 248a.

Figure 2G:
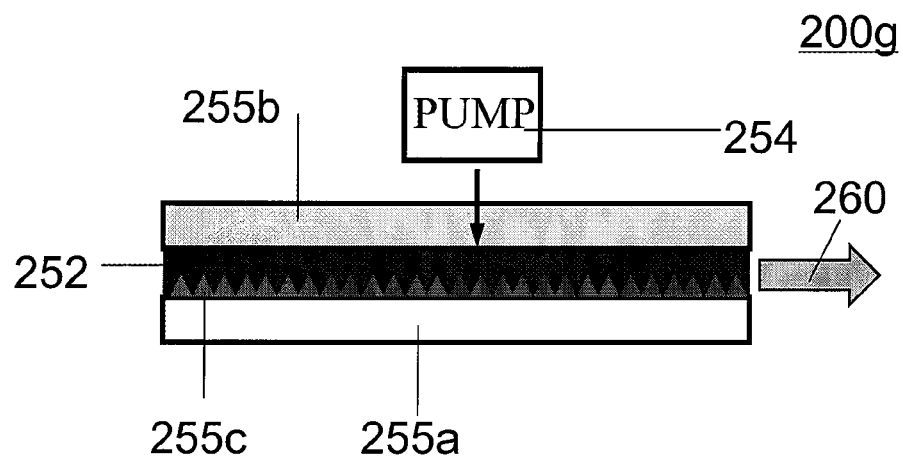
FIG. 2G shows a schematic showing a cross-sectional side view of an emission source according to various other embodiments.

FIG. 2G shows a schematic 200g showing a cross-sectional side view of an emission source according to various other embodiments. The emission source may also include a gain medium 252, the gain medium 252 including a halide semiconductor material such as a halide perovskite material. The emission source may further include a pump source 254 configured to provide energy to the gain medium 252. The gain medium 252 may be a perovskite waveguide. The emission source may be or may include a perovskite Distributed Feedback (DFB) laser.

The emission source may include a substrate 255a, a diffraction grating 255c on the substrate 255a. The emission source may further include a laser element 255a on the diffraction grating 255c. The diffraction grating 255c may include the gain medium 255c and be configured to reflect light to and from the gain medium 255c to generate laser beam 260. In other words, a periodic structure such as a diffraction grating 255c may be integrated into the active perovskite gain medium 252. The diffraction grating 255c may provide optical feedback for the emission. The whole structure may be supported by a substrate 255a with a laser element 255c on top of it. Laser beam 260 may exit from the side.

Figure 2H:
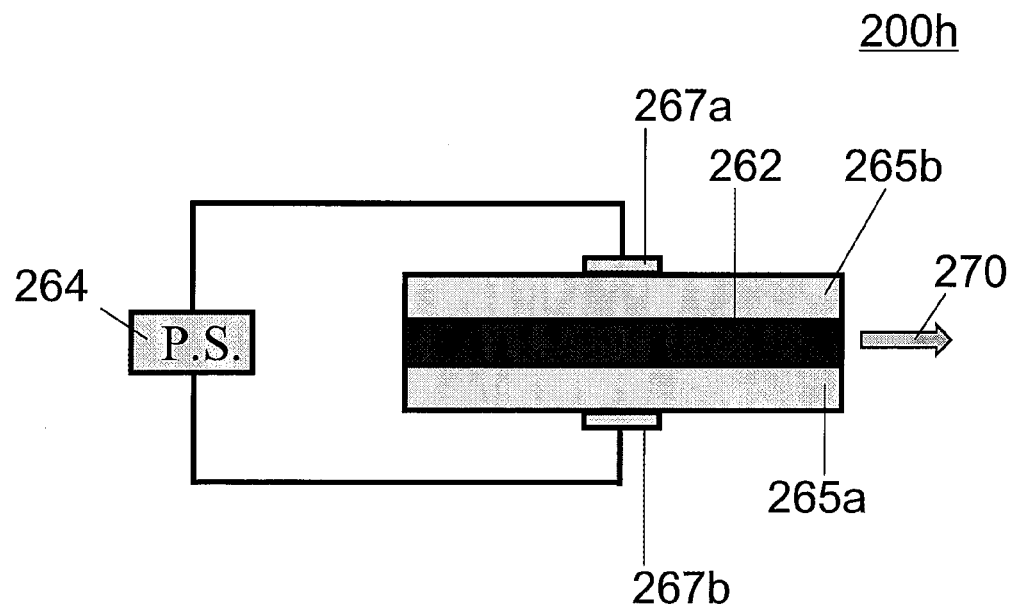
FIG. 2H shows a schematic showing a cross-sectional side view of an emission source according to various other embodiments.

FIG. 2H shows a schematic 200h showing a cross-sectional side view of an emission source according to various other embodiments. The emission source may also include a gain medium 262, the gain medium 262 including a halide semiconductor material such as a halide perovskite material. The emission source may further include a pump source 264 configured to provide energy to the gain medium 252. The pump source 264 may be or may include an electrical source, such as a power supply 264. The emission source may be or may include an electrically pumped perovskite laser (side emitting). The emission source may include a gain medium 262 between a first laser element 265a and a second laser element 265b. A first electrode 267a may be on the first laser element 265a and a second electrode 267b may be on the second laser element 265b. The electrical source 264 may be electrically coupled to the first electrode 267a and the second electrode 267b. Electrical energy may be supplied by the electrical source 264 to generate laser beam 270. In other words, the perovskite laser may also be pumped electrically by connecting an electrical power source 264 across two electrodes 267a and 267b and the electrons and holes are transported through laser elements 265a and 265b to provide an electric field across the perovskite gain material 262 and provide the necessary population inversion to result in the lasing action that produces output beam 270. The beam 270 may travel in a direction perpendicular to a direction from the first electrode 267a to the second electrode 267b.

Figure 2I:
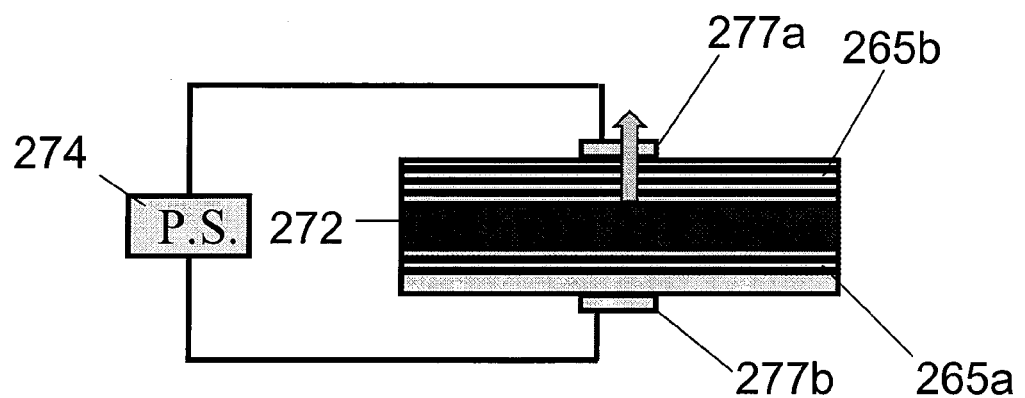
FIG. 2I shows a schematic showing a cross-sectional side view of an emission source according to various other embodiments.

FIG. 2I shows a schematic 200i showing a cross-sectional side view of an emission source according to various other embodiments. The emission source may also include a gain medium 272, the gain medium 272 including a halide semiconductor material such as a halide perovskite material. The emission source may further include a pump source 274 configured to provide energy to the gain medium 252. The pump source 274 may be or may include an electrical source, such as a power supply 274. The emission source may be or may include an electrically pumped perovskite DBR laser (top emitting). The emission source may include a gain medium 272 between a first laser element 275a and a second laser element 275b. A first electrode 277a may be on the first laser element 275a and a second electrode 277b may be on the second laser element 275b. The electrical source 274 may be electrically coupled to the first electrode 277a and the second electrode 277b. Electrical energy may be supplied by the electrical source 274 to generate laser beam 280. The first laser element 275a may be a first Distributed Bragg Reflector (DBR) and the second laser element 275b may be a second Distributed Bragg Reflector (DBR). The laser may be pumped electrically by connecting an electrical power source 274 across two electrodes 277a, 277b and the electrons and holes may be transported through laser elements 277a, 277b to provide an electric field across the perovskite gain material 272 and provide the necessary population inversion to result in the lasing action. The Distributed Bragg Reflectors 277a, 277b may determine the lasing wavelength and the laser beam 280 exits from the less reflective end 277a. The laser beam may travel in a direction parallel to a direction from electrode 277b to electrode 277a.

FIG. 3 shows a schematic 300 of a method of forming an emission source according to various embodiments. The method may include, in 302, providing a gain medium including an halide semiconductor material. The method may also include, in 304, providing a pump source configured to provide energy to the gain medium.

In other words, a method of fabricating a emission source may include providing a gain medium including an halide semiconductor material and arranging a pump source so that the pump source is able to provide energy, e.g. electrical energy and/or optical energy to the gain medium.

In various embodiments, the gain medium may be arranged within a resonant cavity. The gain medium may be arranged within the cavity by arranging the gain medium between a first reflective structure and a second reflective structure along an optical axis.

In various embodiments, the first reflective structure may be arranged to reflect light incident on the first reflective structure towards the second reflective structure along the optical axis and the second reflective structure may be arranged to reflect light incident on the second reflective surface towards the first reflective surface along the optical axis.

In various embodiments, the first reflective structure may be partially transparent so that light incident in the first reflective structure may be partially transmitted through the first reflective structure and partially reflected towards the second reflective structure along the optical axis.

In various embodiments, the halide semiconductor material may be formed by reacting a metal halide (e.g. $PbI_2$, $SnCl_2$, $CaBr_2$) with an organic ammonium halide. The metal halide may be caused to react with the organic or inorganic halide such as an ammonium halide (e.g. $CH_3NH_3I$, $CH_3NH_3F$, $HNC(NH_2)_2Br$ etc.) by mixing the metal halide with the organic ammonium halide in a suitable solvent.

While only selected examples are mentioned in the experimental section of halide semiconductor material, these examples are not intended to be limiting and other halide semiconductor materials may show similar results.

In various embodiments, the halide semiconductor material may be formed by dropcasting or spincoating or any other solution-based methods. The halide semiconductor material may be formed by printing processes, (e.g. dropcasting or spincoating etc.), physical deposition methods (e.g. thermal evaporation, sputtering etc.) or combinations thereof.

The halide semiconductor material, e.g. organic-inorganic perovskite films may be prepared by simple solution deposition processes such as dropcasting and spincoating. The solution may include $CH_3NH_3X$ and $PbX_2$ (where X may be a halogen such as I, Cl, Br and F or mixtures of them) dissolved in an appropriate solvent such as DMF (Dimethyl formamide) or GBL (Gamma butyrylactone). The wt % of the solute ($CH3NH_3X+PbX_2$) may be as high as 40%, or as high as 35%. Upon deposition and mild heating, the deposited film may transform into crystalline $CH_3NH_3PbX_3$. Heating temperature may be a temperature less than 100° C., e.g. less than 80° C., e.g. less than 50° C. Another solution based technique may include the spincoating of $PbX_2$ on a substrate followed by dipping it in a $CH_3NH_3X$ solution to complete its transformation to $CH_3NH_3PbX_3$. Other non-solution based techniques such as evaporative deposition may also possible.

Solution processed organic-inorganic perovskite materials may provide simple and inexpensive alternatives to traditional semiconductor gain mediums which were produced with expensive gas-phase methods. Various embodiments may be easily integrated with existing silicon based electronics. If compared with traditional semiconductor gain mediums, various embodiments may also provide better temperature stability of the ASE occurring threshold. The low temperature of processing may also enable integration of these materials on to flexible substrates.

Low-temperature solution-processed materials that show optical gain and can be embedded into a wide range of cavity resonators are attractive for the realization of on-chip coherent light sources. Organic semiconductors and colloidal quantum dots are considered the main candidates for this application.

However, stumbling blocks in organic lasing include intrinsic losses from bimolecular annihilation and the conflicting requirements of high charge carrier mobility and large stimulated emission; whereas challenges pertaining to Auger losses and charge transport in quantum dots still remain. Herein, we reveal that halide semiconductors such as solution-processed organic-inorganic halide perovskites ($CH_3NH_3PbX_3$ where X D Cl, Br, I) may demonstrate huge potential in photovoltaics and may have promising optical gain. Their ultra-stable amplified spontaneous emission at strikingly low thresholds may stem from their large absorption coefficients, ultralow bulk defect densities and slow Auger recombination. Straightforward visible spectral tunability (390-790 nm) is demonstrated. Importantly, in view of their balanced ambipolar charge transport characteristics, these materials may show electrically driven lasing.

EXPERIMENTAL SECTION

Organic-inorganic halide perovskites have recently emerged as a new class of photovoltaic materials with high efficiencies driven by the large absorption coefficients and long-range balanced electron and hole transport lengths. Surprisingly, we found that they may also exhibit excellent coherent light emission properties.

The $CH_3NH_3PbI_3$ films on quartz substrates were prepared by spin-coating 10 vol % solutions in DMF. [6,6]-phenyl-C61-butyric acid methyl ester (PCBM) layers were spin-coated from a solvent mixture (10 mg ml$^{-1}$) of anhydrous chlorobenzene and anhydrous chloroform (1:1 v/v).

The samples were put in vacuum for more than three days to get rid of any residual solvent before the optical measurements. Mixed halides were prepared by blending appropriate molar ratios of $CH_3NH_3PbI_3$, $CH_3NH_3PbBr_3$ and $CH_3NH_3PbCl_3$ solutions. The solar cells were fabricated using the sequential deposition procedure, as previously reported and characterized under simulated air mass 1.5 global (AM1.5G) solar irradiation in the dark.

Optical spectroscopy. For femtosecond optical spectroscopy, the laser sources were a Coherent Legend regenerative amplifier (150 fs, 1 kHz, 800 nm) seeded by a Coherent Vitesse oscillator (100 fs, 80 MHz) and a Coherent Libra regenerative amplifier (50 fs, 1 kHz, 800 nm) seeded by a Coherent Vitesse oscillator (50 fs, 80 MHz). 800 nm wavelength laser pulses were from the regenerative amplifier's output whereas 400 nm wavelength laser pulses were obtained with a BBO doubling crystal. 600-nm laser pulses were generated from the Coherent TOPAS-C and Coherent OPerA-Solo optical parametric amplifiers. The laser pulses (circular spot, diameter 1.5 mm) were directed to the films under vacuum in a cryostat. The emission from the samples was collected at a backscattering angle of 150 by a pair of lenses into an optical fibre that was coupled to a spectrometer (Acton, Spectra Pro 2500i) and detected by a charge coupled device (Princeton Instruments, Pixis 400B). Time-resolved PL (TRPL) was collected using an Optronis Optoscope streak camera system which has an ultimate temporal resolution of about 10 ps. All optical measurements were performed at room temperature, except for ASE from $CH_3NH_3PbCl_3$ (at 150 K). Room-temperature photoluminescence quantum yield (PLQY) of the perovskite thin films was measured using an integrating sphere. The samples were excited with 600 nm pulses generated from the Coherent OPerA-Solo. The emission was corrected for CCD and grating responsivity. Room-temperature gain measurements were carried out using standard VSL methods. The excitation stripe was focused by a cylindrical lens (with focal length f=20 cm) to a stripe and the emission collection configuration was the same as described above. The excitation stripe length was varied through an adjustable slit actuated by a micrometer which was placed at the focal line of the cylindrical lens.

Figure 4A:
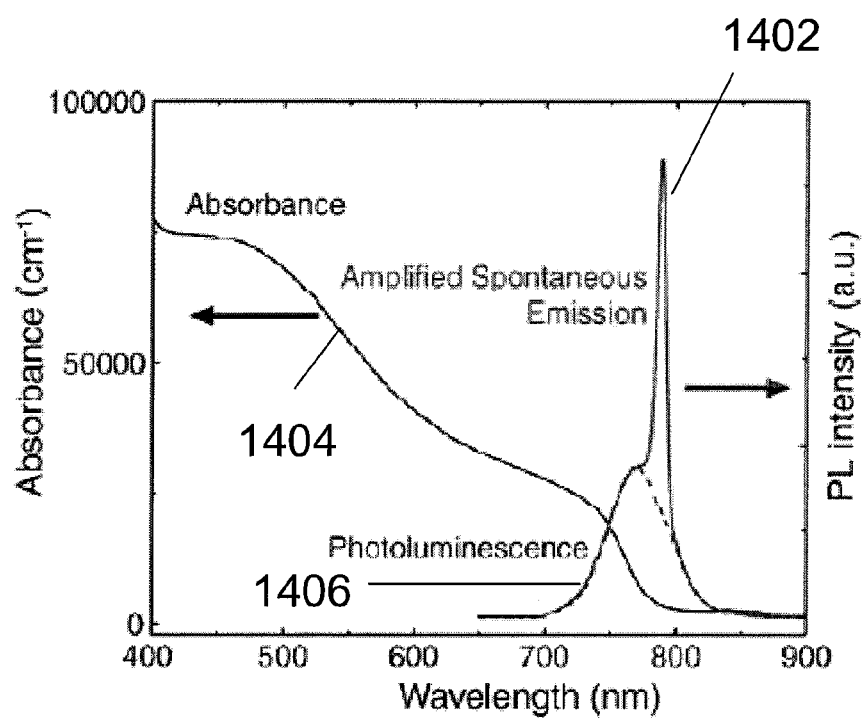
FIG. 4A is a plot of a comparison of the amplified spontaneous emission (ASE) profile in relation to the absorption and spontaneous emission (SE)/photoluminescence profile for CH$_3$NH$_3$PbI$_3$.

After spincoating, a clear optically flat film of $CH_3NH_3PbI_3$ was obtained with thickness of about 65 nm. FIG. 4A is a plot 400a of a comparison of the amplified spontaneous emission (ASE) profile (indicated by 1402) in relation to the absorption (indicated by 1404) and spontaneous emission (SE)/photoluminescence profile (indicated by 1406) for $CH_3NH_3PbI_3$. The ASE develops at the wavelength where the optical gain and absorption are balanced—the ASE peak is red-shifted with respect to the photoluminescence (PL) peak. The $CH_3NH_3PbI_3$ film has strong absorbance (~$10^4$ cm$^{-1}$) from UV to near infrared (800 nm) with two distinct peaks located at 480 nm and 760 nm, which are consistent with previous publications. The broad strong absorbance is a good indication of its excellent light harvesting capabilities. The second absorption peak (760 nm) is attributed to the direct gap transition from the first valence band maximum to the conduction minimum. The first absorption peak (480 nm) is attributed to the transition from lower valence band to the conduction band minimum. The strong band edge PL peaks at 770 nm. Absorbance is measured in cm$^{-1}$ while PL intensity/SE and amplified spontaneous emission are in arbitrary units (a.u.). Absorbance, PL intensity/SE and amplified spontaneous emission are plotted against wavelength (nm).

Figure 4B:
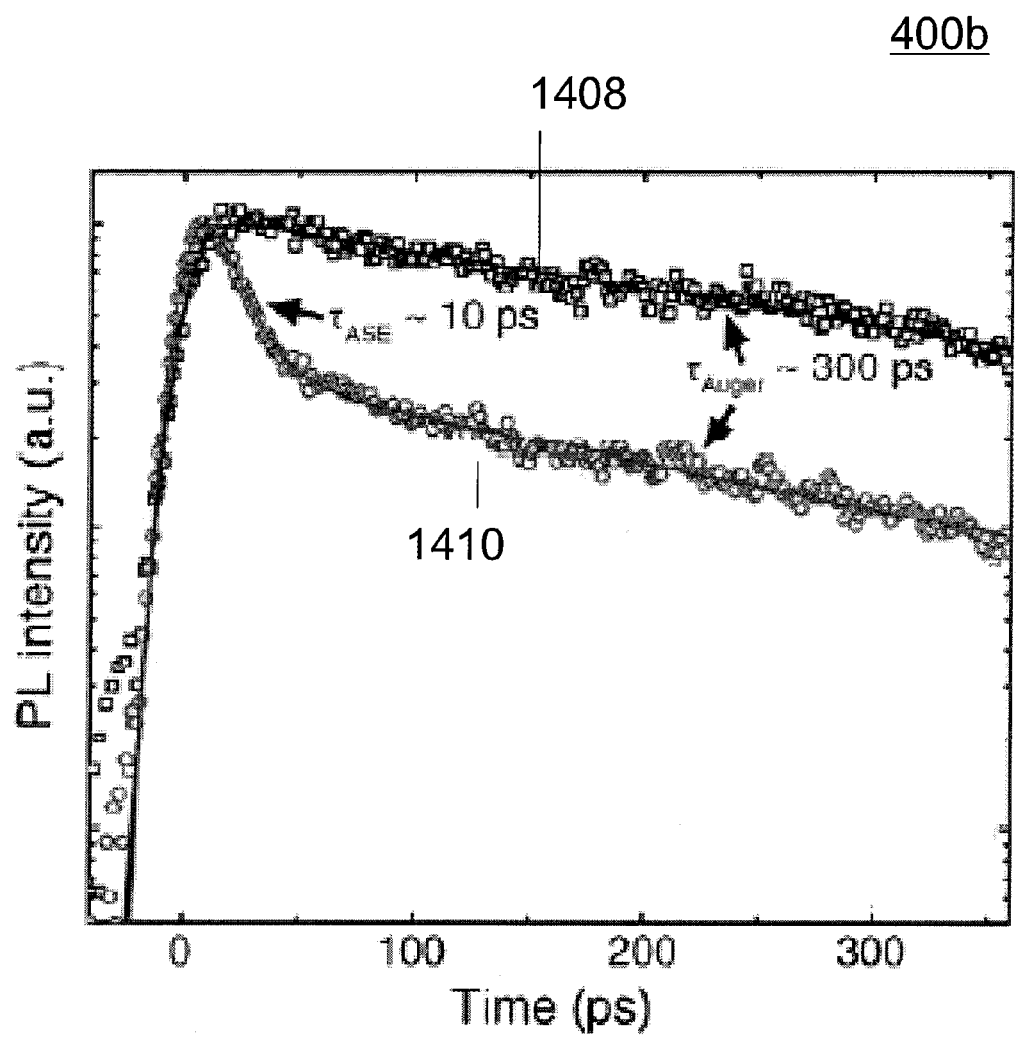
FIG. 4B shows a plot of a typical time resolved photoluminescence (TRPL) decay transients following photo-excitation with pump fluence below (~10 µJ cm$^{-2}$) and above (~13 µJ cm$^{-2}$) the ASE threshold (i.e., 12±2 µJ cm$^{-2}$).
Figure 4C:
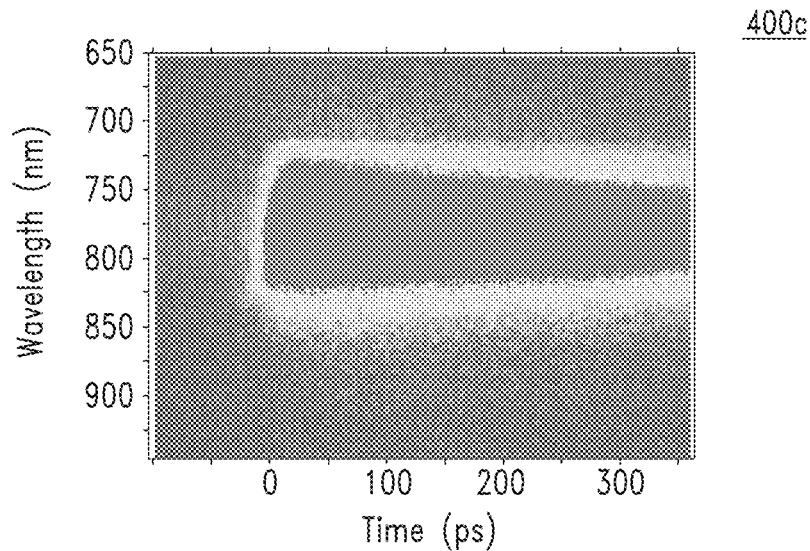
FIG. 4C is a streak camera image 400c of spectrum against time (collected over a time window of 460 ps) for below ASE threshold fluence.
Figure 4D:
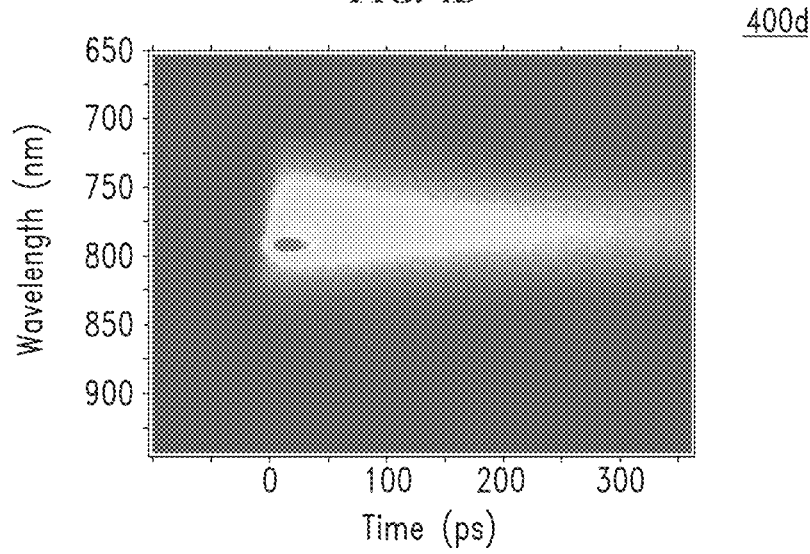
FIG. 4D is a streak camera image 400d of spectrum against time (collected over a time window of 460 ps) for above ASE threshold fluence.

FIG. 4B shows a plot 400b of a typical time resolved photoluminescence (TRPL) decay transients following photo-excitation with pump fluence below (~10 μJ cm$^{-2}$, indicated by 1406) and above (~13 μJ cm$^{-2}$, indicated by 1410) the ASE threshold (i.e., 12±2 μJ cm$^{-2}$). FIG. 4B shows the variation of PL intensity in arbitrary units (a.u.) against time (in ps). The lifetime data presented in FIG. 4B is collected over a time window of 18 ns to allow consistent comparison with the longer-lived SE dynamics. FIG. 4C is a streak camera image 400c of spectrum against time (collected over a time window of 460 ps) for below ASE threshold fluence. FIG. 4D is a streak camera image 400d of spectrum against time (collected over a time window of 460 ps) for above ASE threshold fluence.

Figure 8A:
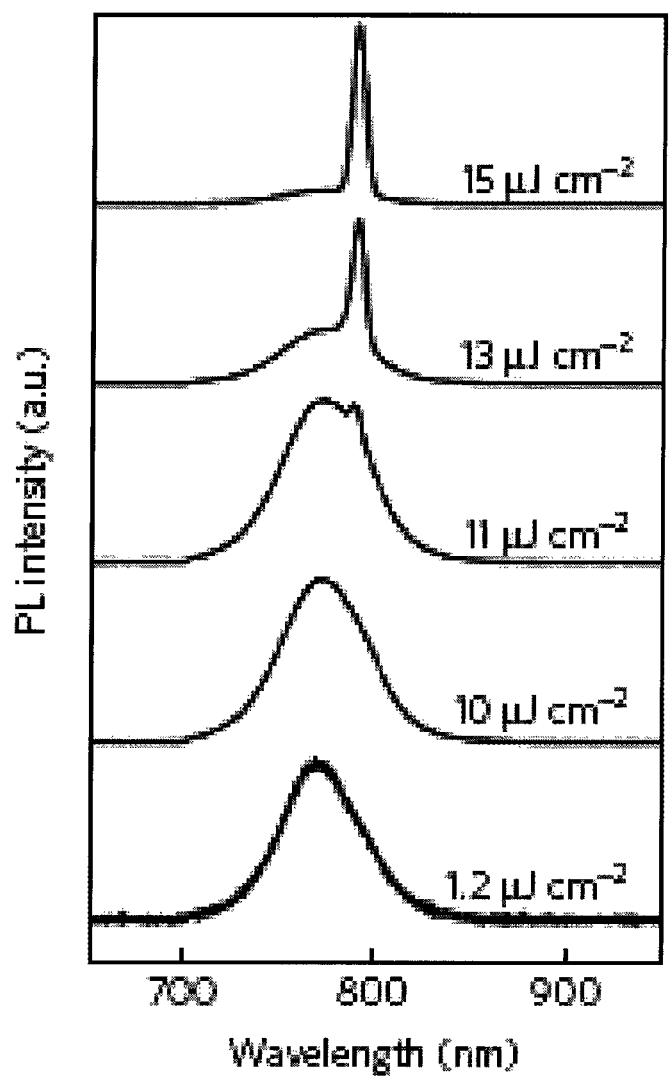
FIG. 8A is a plot showing steady-state photoluminescence (PL) emission spectra from a 65-nm-thick $CH_3NH_3PbI_3$ film photoexcited using 600 nm, 150 fs and 1 kHz pump pulses with increasing pump fluence (per pulse).

FIG. 8A is a plot 800a showing steady-state photoluminescence (PL) emission spectra from a 65-nm-thick $CH_3NH_3PbI_3$ film photoexcited using 600 nm, 150 fs and 1 kHz pump pulses with increasing pump fluence (per pulse). FIG. 8A illustrates the transition from spontaneous emission (SE) to amplified spontaneous emission (ASE) with increasing pump fluence at 1.2 μJ cm$^{-2}$, 10 μJ cm$^{-2}$, 11 μJ cm$^{-2}$, 13 μJ cm$^{-2}$, 15 μJ cm$^{-2}$ the $CH_3NH_3PbI_3$ film, which is spin-coated on a quartz substrate.

Figure 8B:
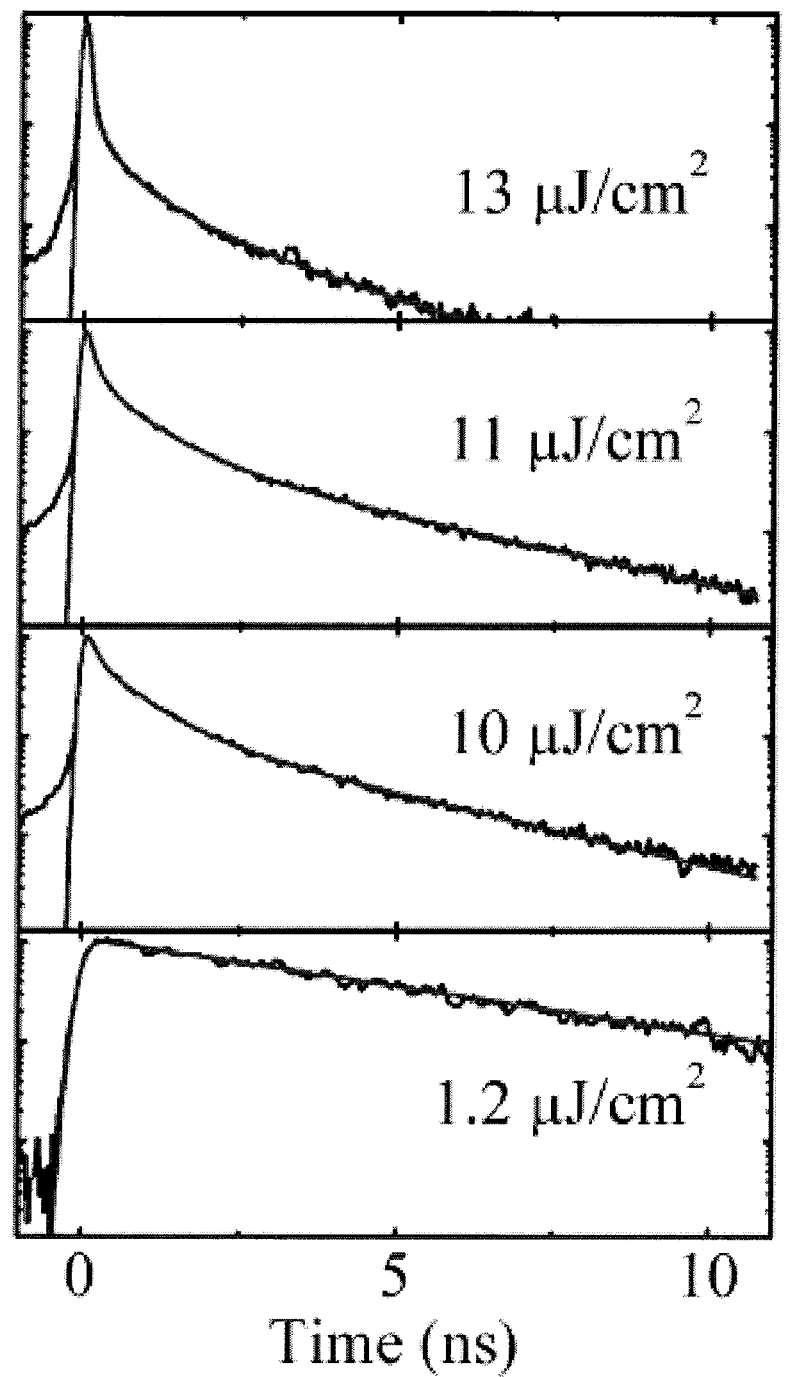
FIG. 8B is a plot showing the corresponding time resolved photoluminescence (TRPL) intensity measured at 788±10 nm.

FIG. 8B is a plot 800b showing the corresponding time resolved photoluminescence (TRPL) intensity measured at 788±10 nm. FIG. 8B shows the TRPL intensity at a pump fluence of 1.2 μJ cm$^{-2}$, 10 μJ cm$^{-2}$, 11 μJ cm$^{-2}$, 13 μJ cm$^{-2}$.

Figure 8C:
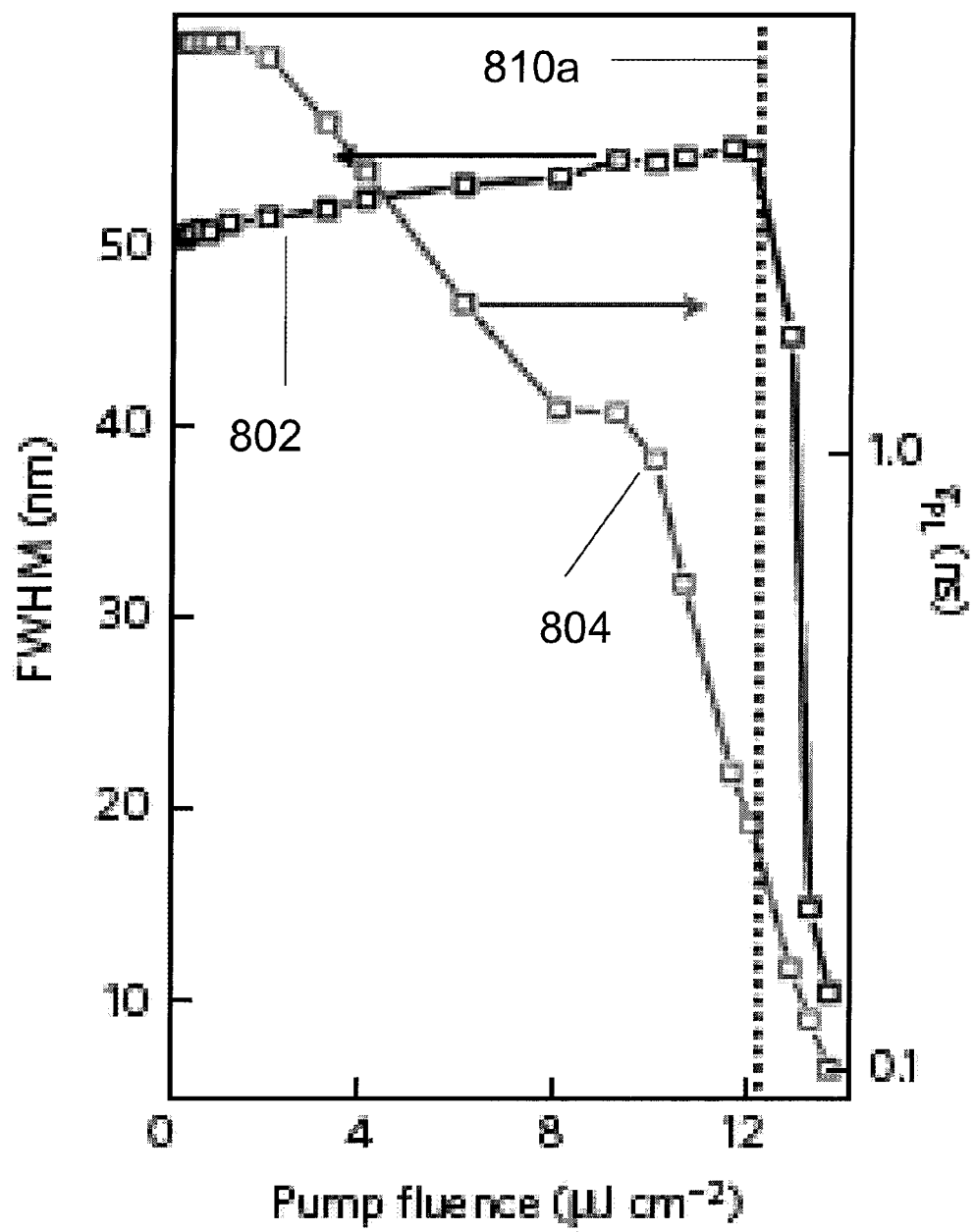
FIG. 8C is a plot full width at half maximum (FWHM) of the emission peak and average transient photoluminescence lifetime ($\tau_{PL}$) as a function of the pump fluence.

FIG. 8C is a plot 800c full width at half maximum (FWHM) of the emission peak (indicated by 802) and average transient photoluminescence lifetime ($\tau_{PL}$) (indicated by 804) as a function of the pump fluence. $\tau_{PL}$ may be defined as the time taken for the intensity to decrease to 1/e of its initial value. At low pump levels, the broad spontaneous emission (SE) (with FWHM about 50 nm) from $CH_3NH_3PbI_3$ increases linearly with increasing pump fluence. Correspondingly, the average transient photoluminescence (PL) lifetimes ($\tau_{PL}$) progressively decrease.

Figure 8D:
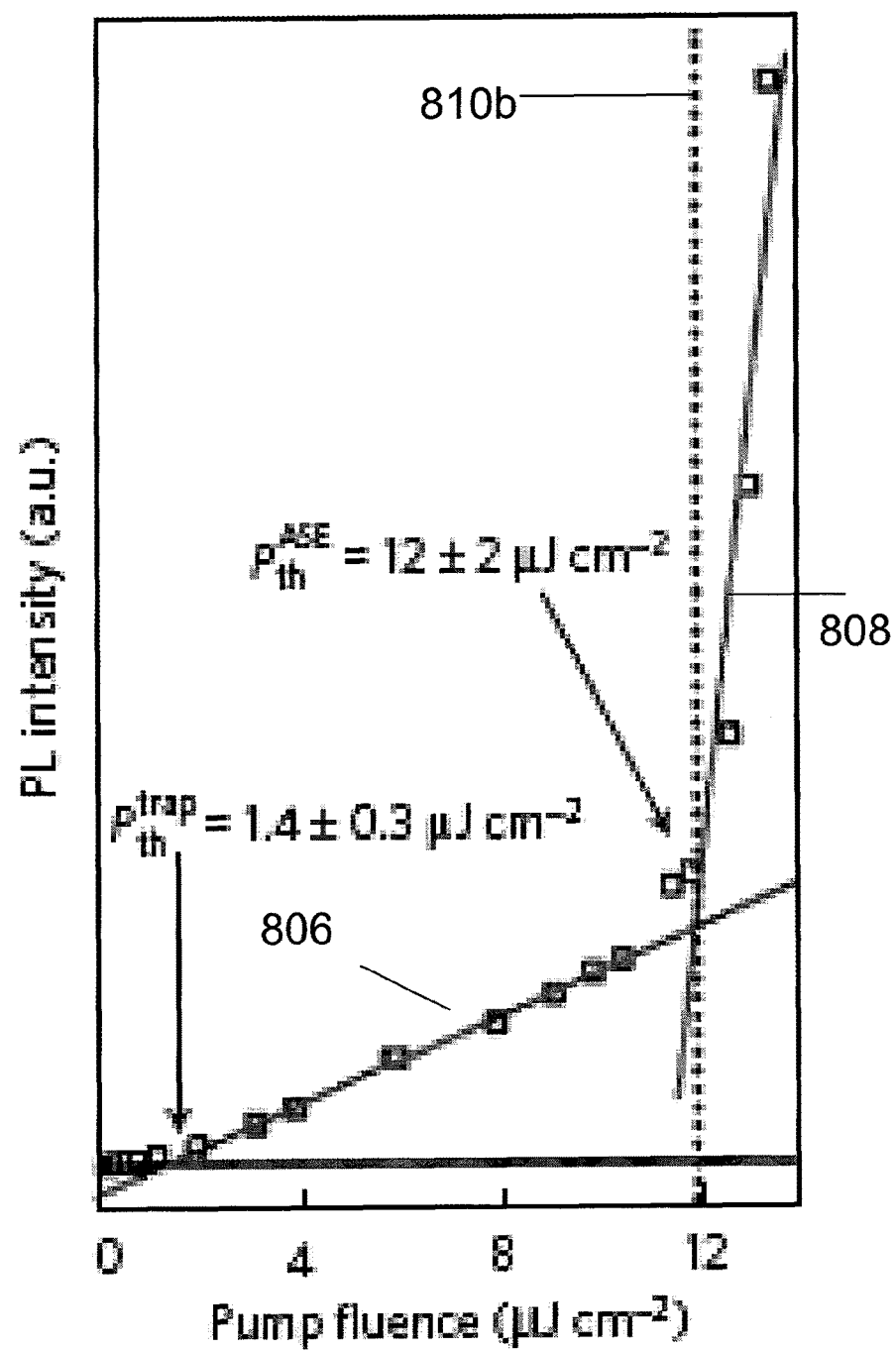
FIG. 8D is a plot showing photoluminescence intensity as a function of pump fluence.

FIG. 8D is a plot 800d showing photoluminescence intensity as a function of pump fluence. The arrows indicate the trap state saturation threshold fluence ($P_{th}^{trap}$) and the ASE threshold fluence ($P_{th}^{ASE}$). Line 806 and line 808 represent the linear fits to experimental data in the two linear regimes of SE and ASE, respectively. The dashed vertical lines 810a, 810b in FIGS. 8C and 8D respectively indicate the onset of ASE.

Above the threshold fluence (12±2 µJ cm$^{-2}$), the emission intensity may increase superlinearly (as shown in FIG. 8D), with PL dramatically shortened owing to the occurrence of a new short lifetime (<10 ps) dynamical process. Concurrently, the emission band may collapse to yield a sharp peak at 788 nm (as shown in FIG. 8A). These may provide clear signatures of optical amplification of the SE from CH$_3$NH$_3$PbI$_3$, i.e. ASE behaviour. The balance between optical gain and self-absorption may give rise to a red-shifted ASE peak that is located near the tail of the absorption edge (as shown in FIG. 4A).

The intrinsic gain properties of perovskites are investigated by examining the ASE behaviour in a cavity-free configuration. The ASE values provide a better benchmark for comparing different material sets on their intrinsic suitability for gain applications.

From the measured threshold fluence (12±2 µJ cm$^{-2}$ and absorption coefficient (á=5.7×10$^4$ cm$^{-1}$ at 600 nm), the ASE threshold carrier density may be calculated to be about 1.7×10$^{18}$ cm$^{-3}$. The threshold carrier density may correspond to the ease with which a material can attain net gain through optical or electrical generated means. Comparatively, for highly crystalline high-temperature-grown ZnSe and CdS nanowires (with similar α=10$^5$ cm$^{-1}$ at the excitation wavelengths), the typical threshold carrier densities are nearly one order larger under similar measurement conditions.

Similarly, the typical ASE threshold carrier density for solution-processed organic thin films may be approximately one order larger. As a point of comparison, state-of-the-art cavity-free solution-processed polymer films such as poly[9,9-dioctylfluorene-co-9,9-di(4-methoxyphenyl)-fluorene] (F8DP) and Super Yellow exhibited an ASE threshold of about 6 µJ cm$^{-2}$ (calculated from reported threshold pump energy of 0.1 µJ per pulse; excitation stripe about 400 µm×about 4 mm) and about 36 µJ cm$^{-2}$ (calculated from the reported values of 315 nJ/pulse over a rectangular spot of length about 2.5 mm and width about 350 µm) respectively.

The results on CH$_3$NH$_3$PbI$_3$ also compare favourably to reported CdSe/ZnCdS core/shell colloidal quantum dot (QD) films having an ASE threshold of 90 µJ cm$^{-2}$.

Figure 9A:
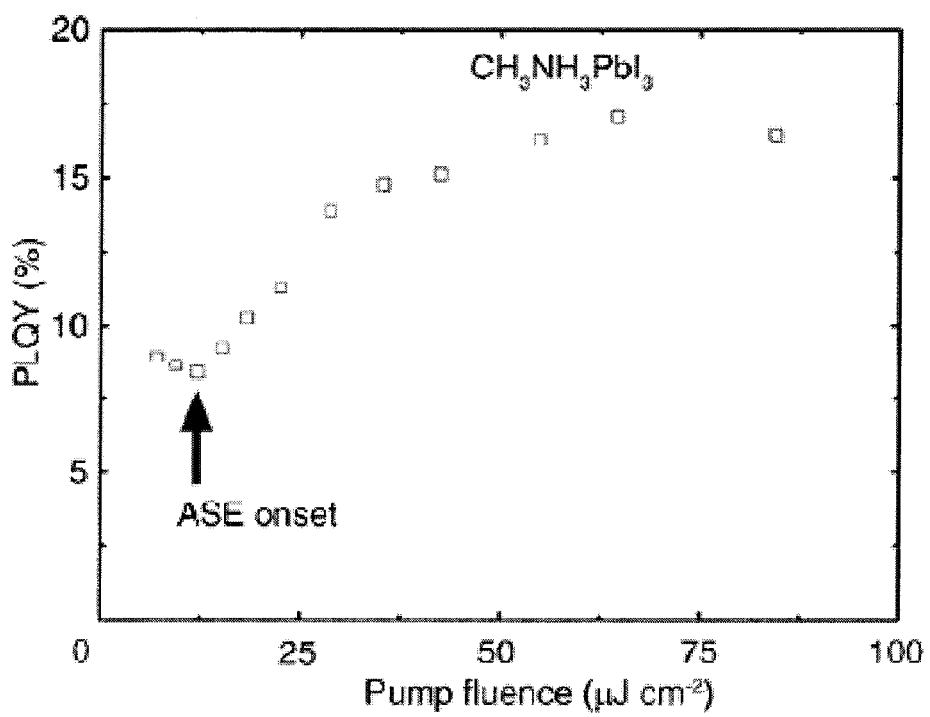
FIG. 9A is a plot showing photoluminescence quantum yield (PLQY) (in percentage or %) dependence on pump fluence (in µJ cm$^{-2}$).

Photoluminescence quantum yield (PLQY) values approaching 20% at pump fluence above the ASE thresholds have also measured using an integrating sphere. FIG. 9A is a plot 900a showing photoluminescence quantum yield (PLQY) (in percentage or %) dependence on pump fluence (in µJ cm$^{-2}$). The PLQY measurements are carried out for CH$_3$NH$_3$PbI$_3$ films at various pump fluence at room temperature using an integrating sphere. The samples were excited with 600 nm pulses generated from the Coherent OPerA-Solo, an optical parametric amplifier. The emission was corrected for CCD and grating responsivity.

Figure 9B:
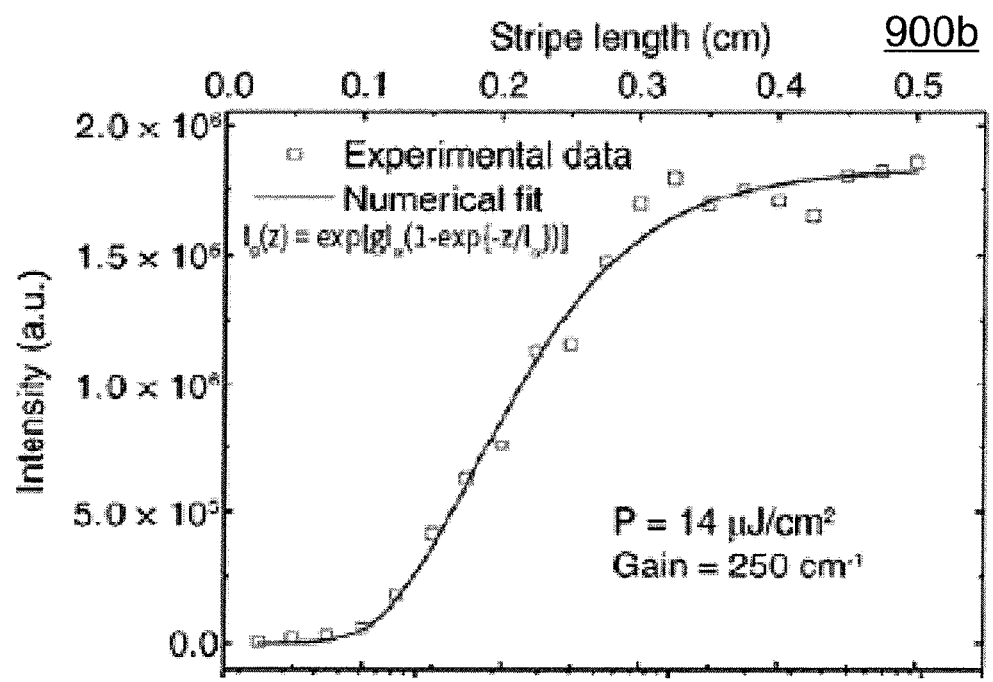
FIG. 9B is a plot showing room temperature variable stripe length (VSL) measurements of the $CH_3NH_3PbI_3$ films and fitted using the respective methods used for solution processed colloidal quantum dots thin films.
Figure 9C:
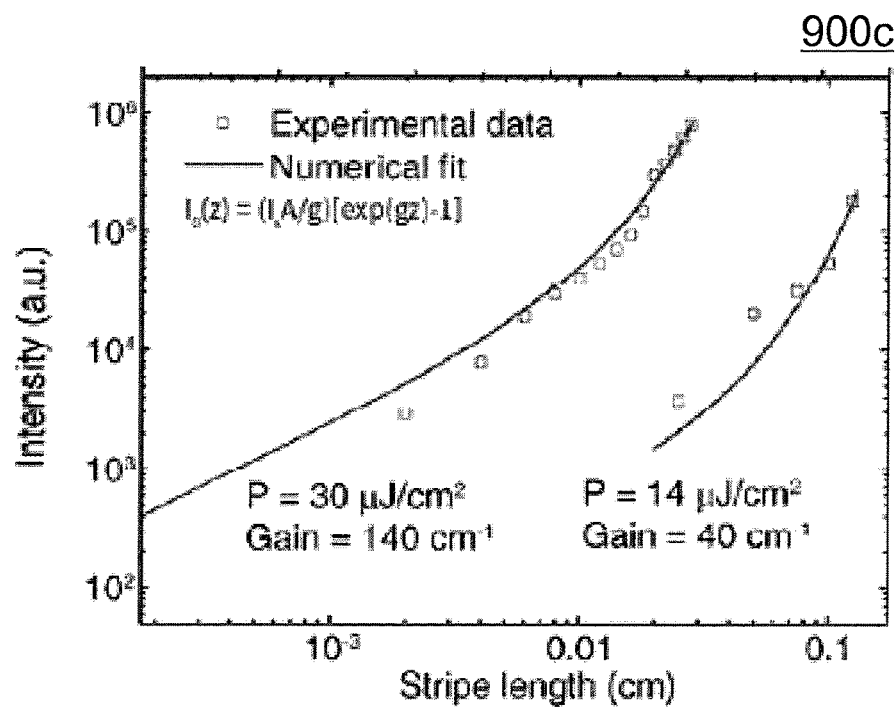
FIG. 9C is a plot showing room temperature variable stripe length (VSL) measurements of the $CH_3NH_3PbI_3$ films and fitted using the respective methods used for organic thin films.

The room temperature gain of the CH$_3$NH$_3$PbI$_3$ sample was assessed using Variable Stripe Length (VSL) measurements. FIG. 9B is a plot 900b showing room temperature variable stripe length (VSL) measurements of the CH$_3$NH$_3$PbI$_3$ films and fitted using the respective methods used for solution processed colloidal quantum dots thin films. FIG. 9C is a plot 900c showing room temperature variable stripe length (VSL) measurements of the CH$_3$NH$_3$PbI$_3$ films and fitted using the respective methods used for organic thin films. FIGS. 9B and 9C show variation of intensity (arbitrary units or a.u.) against stripe length (cm)

The data is fitted using two methods. The method developed by Shaklee and Leheny (Shaklee, K. L. & Leheny, R. F. "Direct determination of optical gain in semiconductor crystals." Appl. Phys. Lett. 18, 475-477 (1971)), is a straightforward way to determine the gain spectrum of a material over the small signal regime (utilized for inorganic and organic semiconductors in slab geometry).

The equation is provided by:

$$I_o = \frac{I_S A}{g}[\exp(gz) - 1] \quad (1)$$

where $I_o(z)$, g, and z are the detected light intensity, gain coefficient and excitation stripe length, respectively; $I_s$ is the spontaneous emission rate per unit volume and A is the cross-sectional area of the excited volume.

Another method developed by Chan et al. (Chan, Y. et al., Blue semiconductor nanocrystal laser, Appl. Phys. Lett. 86, 073102 (2005)) for analysis over the entire signal regime (including saturation) and is more commonly used in solution processed colloidal quantum dot films.

The equation is provided by:

$$I = \exp\left[gl_a\left(1 - \exp\left\{\frac{-(z-z_o)}{l_a}\right\}\right)\right] \quad (2)$$

Wherein I, g, and z are the ASE intensity, gain coefficient and excitation stripe length. Respectively; while $z_o$ accommodates for possible pump beam inhomogenity and delayed ASE onset. $I_a$ is a parameter that accounts for the saturation in ASE intensity which is defined as the gain lifetime multiplied by the speed of light within the gain medium.

The relatively low yield may be a consequence of the low exciton binding energy (19±3 meV) as well as high electron and hole mobilities. Nonetheless, variable stripe length (VSL) measurements on CH$_3$NH$_3$PbI$_3$ have revealed a gain of about 250 cm$^{-1}$ (fitted with Chan's method in Chan, Y. et al., Blue semiconductor nanocrystal laser, Appl. Phys. Lett. 86, 073102 (2005), typically used for colloidal QDs, see FIG. 4F) or about 40 cm$^{-1}$ (fitted with Shaklee and Leheny's method in Shaklee, K. L. & Leheny, R. F. "Direct determination of optical gain in semiconductor crystals." Appl. Phys. Lett. 18, 475-477 (1971), largely used for films of conjugated polymers, see FIG. 4G) at a pump fluence of 14 µJ cm$^{-2}$. The gain values obtained from the respective methods compare favourably with those for colloidal quantum dots (Dang, C. et al. Red, "green and blue lasing enabled by single-exciton gain in colloidal quantum dot films." Nature Nanotech. 7, 335-339 (2012), Liao, Y., Xing, G., Mishra, N., Sum, T. C. & Chan, Y. "Low threshold, amplified spontaneous emission from core-seeded semiconductor nanotetrapods incorporated into a sol-gel matrix." Adv. Mater. 24, 159-164 (2012)) and conjugated polymer thin films (Lampert, Z. E., Reynolds, C. L. Jr., Papanikolas, J. M. & Aboelfotoh, M. O. "Controlling morphology and chain aggregation in semiconducting conjugated polymers: the role of solvent on optical gain in" MEH-PPV. J. Phys. Chem. B. 116, 12835-12841 (2012)) at comparable excitation intensities.

Various embodiments may show better performance than other solution processed systems. Typical competing non-radiative pathways that can rapidly deplete the carrier population and make ASE unfavourable in other solution-processed semiconductors may not be dominant in various embodiments. The non-radiative pathways may include bulk defects such as vacancies, interstitials, antisites etc.) with fast trapping in the fs and ps timescales, surface traps which typically may require more than 100 ps for carrier diffusion through a few tens of nanometers of the material, and multi-particle loss mechanisms (such as bimolecular recombination in organic thin films or Auger recombination in quantum dots).

Following photo-excitation across the $CH_3NH_3PbI_3$ bandgap (at low pump fluence where Auger recombination is not dominant), the excited charge carriers may either relax through bandedge emission or trap-mediated non-radiative pathways. The former (relaxing through bandgap emission) may give rise to SE with a lifetime ($\tau_0$) of 4.5±0.3 ns (as shown in FIG. 8C). An estimate of the bulk and surface trap densities may be made under these conditions where trap state recombination is much slower than bandedge radiative recombination. The photo-generated charge carrier density ($n_c(t)$) after photoexcitation may be described with a set of differential equations. The model reveals the presence of two types of traps in these $CH_3NH_3PbI_3$ thin films, with the bulk traps exhibiting fast trapping times and the surface traps exhibiting slow trapping times.

Figure 10A:
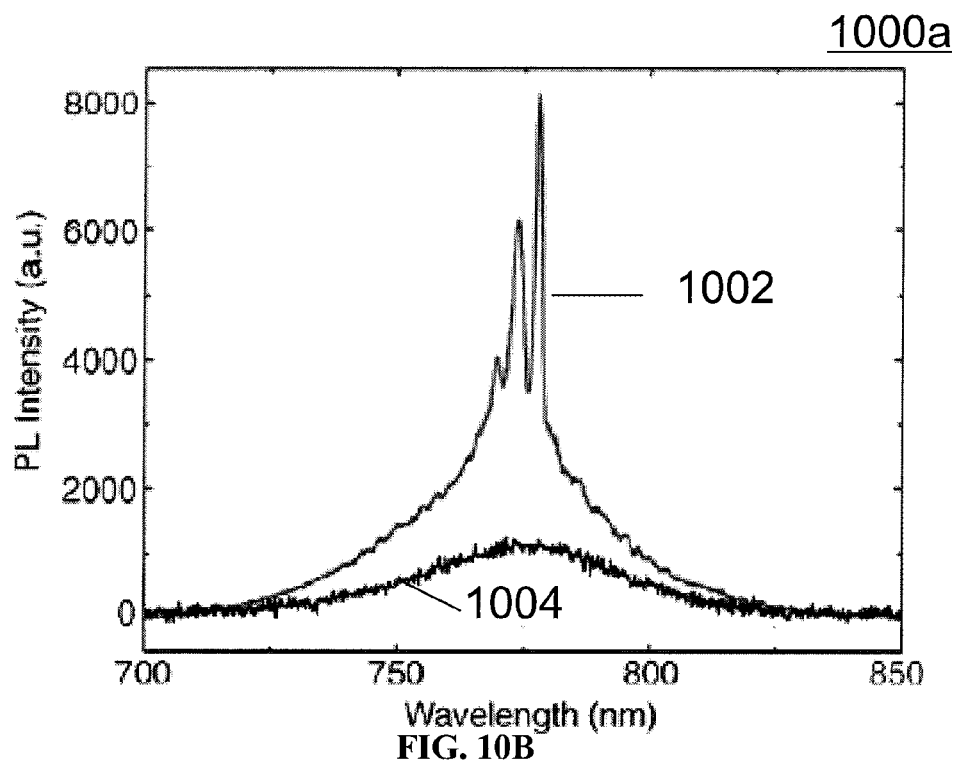
FIG. 10A is a plot showing room temperature lasing from $CH_3NH_3PbI_3$ single crystals from dropcasted films.
Figure 10B:
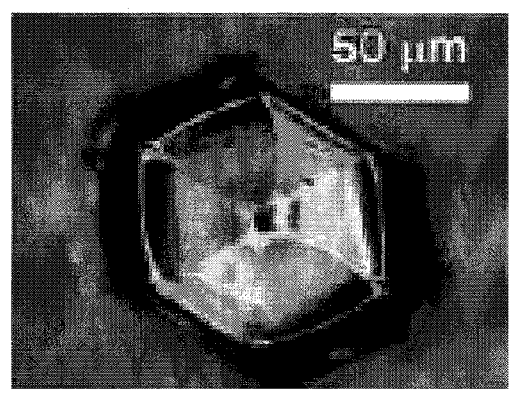
FIG. 10B is an optical micrograph of the crystal.
Figure 10C:
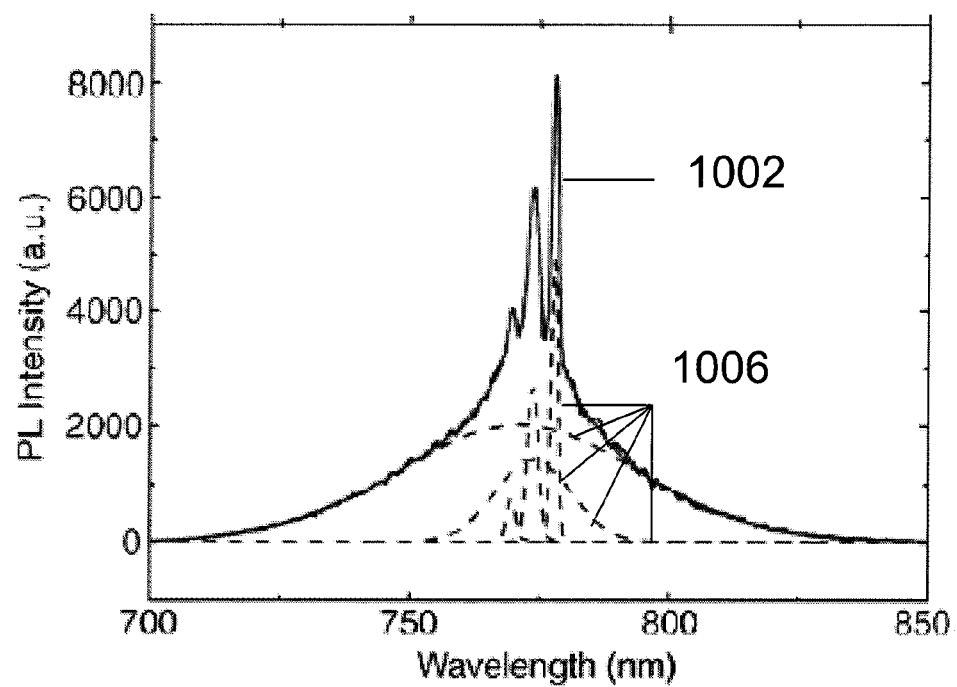
FIG. 10C is a plot showing the lasing data fitted to 5 peaks.

FIG. 10A is a plot 1000a showing room temperature lasing from $CH_3NH_3PbI_3$ single crystals from dropcasted films. 1002 indicates the lasing data while 1004 indicates the PL data. FIG. 10B is an optical micrograph 1000b of the crystal. FIG. 10C is a plot 1000c showing the lasing data 1002 fitted to 5 peaks (indicated by 1006). The most prominent mode shows a full width half maximum of 1.2 nm. FIGS. 4H, 4J plot PL intensity (in a.u.) against wavelength (nm).

Under low fluence fs laser pulse excitation (where Auger recombination is negligible) and the assumption that trap states recombination is much slower than band edge radiative recombination, the dynamics of photo-generated charge carrier density ($n_c$) can be described with the following set of differential equations:

$$\frac{dn_c(t)}{dt} = -\sum_i a_i n_c(t) n_{TP}^i(t) - \frac{n_c(t)}{\tau_0} \quad (3)$$

$$\frac{dn_{TP}^i(t)}{dt} = -a_c(t) n_{TP}^i(T) \quad (4)$$

Wherein $n_{TP}^i(t)$ is the trap states density and $a_i$ is the product of the trapping cross section and the carrier velocity. Therefore the first term in equation (3) represents various trap-mediated non-radiative pathways, while the second term denotes the radiative recombination inside the film. Thus the relationship between the integrate bandedge PL intensity ($I_{PL}=k\int_0^\infty n_c(t)/\tau_0 dt$, where k is a constant) the initial photo-generated charge carrier density $n_e(0)$ can be obtained as:

$$n_c(0) = \sum_i n_{YTP}^i(0)(1 - e^{-a_i \tau_0 I_{PL}/k}) + I_{PL}/k \quad (5)$$

Fitting the experimental result with equation (5) yields two types of traps in these $CH_3NH_3PbI_3$ thin films, with the bulk (surface/interfacial) traps exhibiting fast (slow) trapping times. The bulk trap density $n_{TP}^F$ is about $5\times10^{16}$ cm$^{-3}$ while the surface/interfacial trap density $n_{TP}^S$ is about $1.6\times10^{17}$ cm$^{-3}$. This correlates well with a simple estimation of the total trap density (bulk and surface) obtained by the intersection of the linearly extrapolated PL intensity (indicated by line 806) with that of the pump fluence axis from FIG. 8D (i.e. $n_{TP}^0 \sim 2\times10^{17}$ cm$^{-3}$). This intersection represents the pump fluence needed to fill all the traps (i.e., the threshold trap pump fluence $P_{th}^{Trap}$).

Figure 10D:
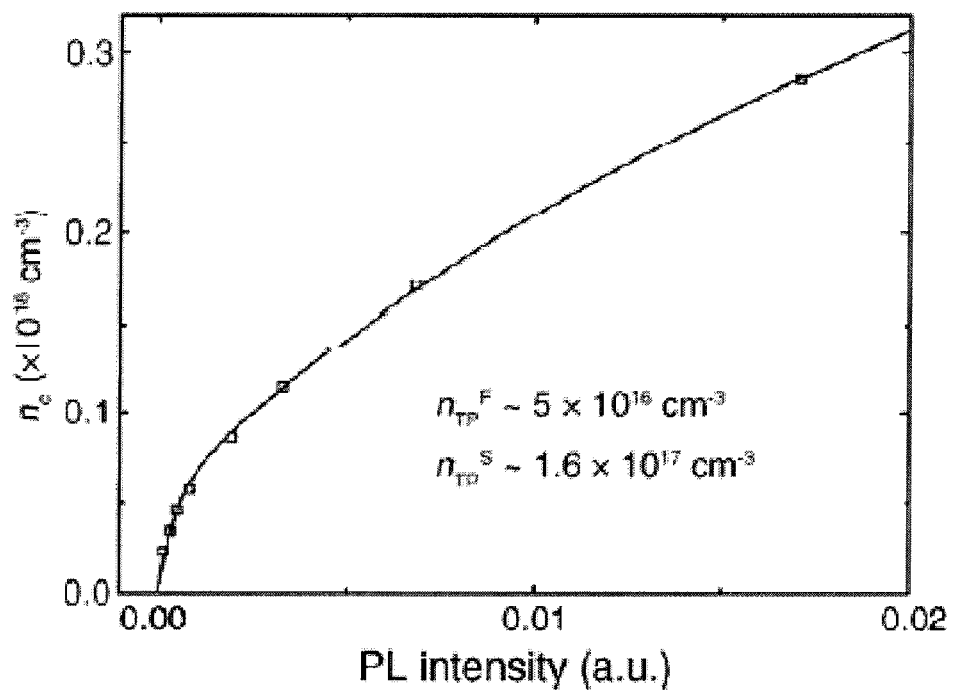
FIG. 10D is a plot showing photoluminescence (PL) intensity as a function of photon-generated exciton density within the low pump fluence range.

FIG. 10D is a plot 1000d showing photoluminescence (PL) intensity as a function of photon-generated exciton density within the low pump fluence range. The experimental data can be well-fitted ($R^2$=0.99) with equation (5) for two types of trapping states.

The bulk trap density ($n_{TP}^F$) is about $5\times10^{16}$ cm$^{-3}$ whereas the surface trap density ($n_{TP}^S$) is about $1.6\times10^{17}$ cm$^{-3}$. The trap densities measured in $CH_3NH_3PbI_3$ may be comparable to defect densities in highly ordered organic crystals ($10^{15}$-$10^{18}$ cm$^{-3}$) and superior to those of solution-processed organic thin films ($10^{19}$ cm$^{-3}$). Solution-deposited, high-temperature annealed Cu—In—Ga—S/Se (CIGS) chalcogenide layers also exhibit comparable defect densities to that reported here ($10^{16}$ cm$^{-3}$). These low bulk defect densities in perovskite are also consistent with the high solar cell efficiencies in this material.

Finite difference time domain (FDTD) simulations (Lumerical™ FDTD software) were performed to evaluate the optical confinement effects of the PCBM layer. The structure includes Quartz (100 nm)/$CH_3NH_3PbI_3$ (65 nm)/[6,6]-phenyl-C61-butyric acid methyl ester (PCBM) (45 nm-optional)/vacuum (390 nm).

Figure 5A:
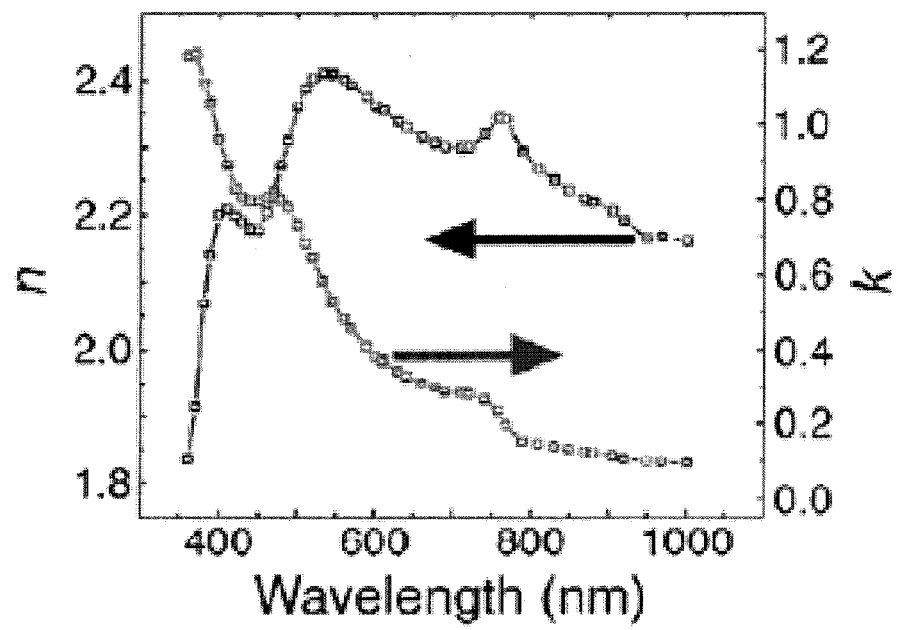
FIG. 5A is a plot showing the real part (n) and imaginary part or extinction coefficient (k) of the complex refractive index.

FIG. 5A is a plot 500a showing the real part (n) and imaginary part or extinction coefficient (k) of the complex refractive index. The refractive index of $CH_3NH_3PbI_3$ was measured using an ellipsometer-$n_{CH3NH3PbI3}$=2.3 and $k_{CH3NH3PbI3}$=0.15 at 790 nm while that of [6,6]-phenyl-C61-butyric acid methyl ester (PCBM) was extracted from the literature (Hoppe, H., Sariciftci, N. S., & Meissner, D. Optical constants of conjugated polymer/fullerene based bulk-heterojunction organic solar cells, Mol. Cryst. Liq. Cryst. 385, 233-239 (2002)).

Figure 5B:
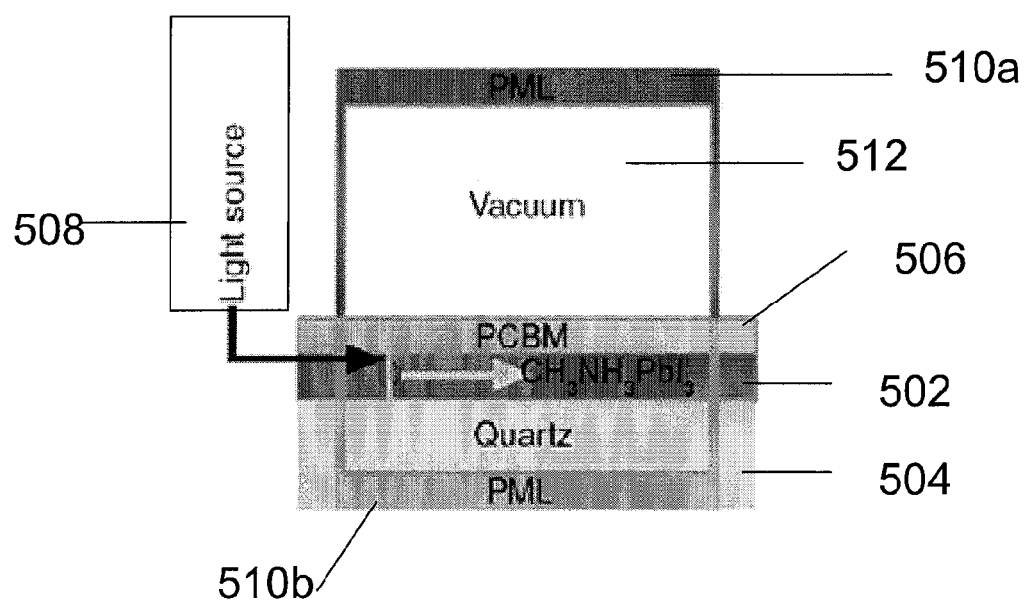
FIG. 5B shows a schematic of the of a gain medium under simulation conditions according to various embodiments.

FIG. 5B shows a schematic 500b of the of a gain medium 502 under simulation conditions according to various embodiments. The gain medium 502 may be on a quartz film 504. The gain medium 502 may include $CH_3NH_3PbI_3$ film. A PCBM layer 506 may be on the gain medium 502. A light source 508 (e.g. yellow line) may be introduced in-plane to the gain medium 502 and perfectly matched layers (PML) boundary conditions 510a, 510b may be used to absorb the incident light at the top and bottom edges with minimal reflections. A vacuum 512 may be between the top PML 510a and the structure including the gain medium 502.

FIG. 5C is a schematic 500c showing intensity distributions in the y-z plane of structures of light polarized parallel to the structure surface. 514 shows the intensity distribution of the light in the y-z plane of a structure with quartz film 504, gain medium 502 on quartz film 504 and PCBM layer 506 on the gain medium. 516 shows the intensity distribution of the light in the y-z plane of a structure with quartz film 504 and gain medium 502 on quartz film 504, i.e. without PCBM layer 506.

To examine the effects of the more prevalent surface traps on the carrier dynamics and ASE, PL measurements on bare $CH_3NH_3PbI_3$ were compared against $CH_3NH_3PbI_3$/[6,6]-phenyl-C61-butyric acid methyl ester (PCBM), C60) bilayers to mimic the presence of infinite interfacial electron trap states. Selective excitation of the $CH_3NH_3PbI_3$ layer (about 65 nm thick for both cases) was performed with 600 nm laser pulses.

Figure 11A:
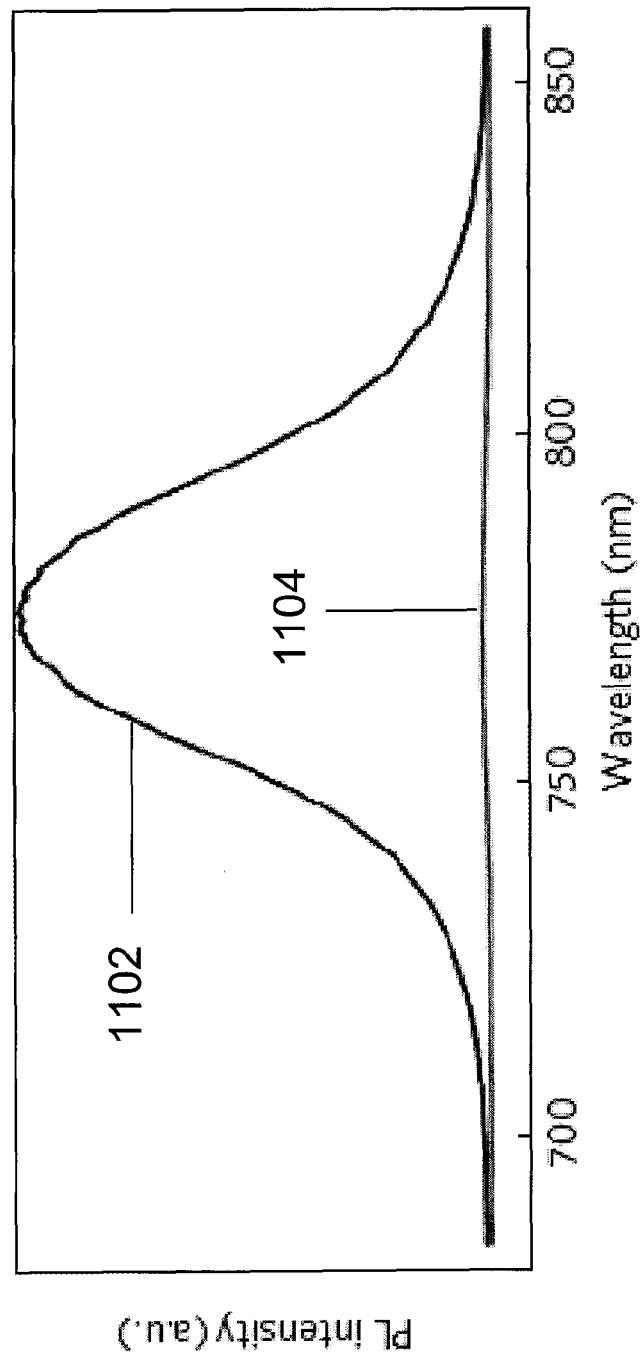
FIG. 11A is a plot showing the time-integrated PL spectra of $CH_3NH_3PbI_3$ and $CH_3NH_3PbI_3$/([6,6]-phenyl-C61-butyric acid methyl ester (PCBM).
Figure 11B:
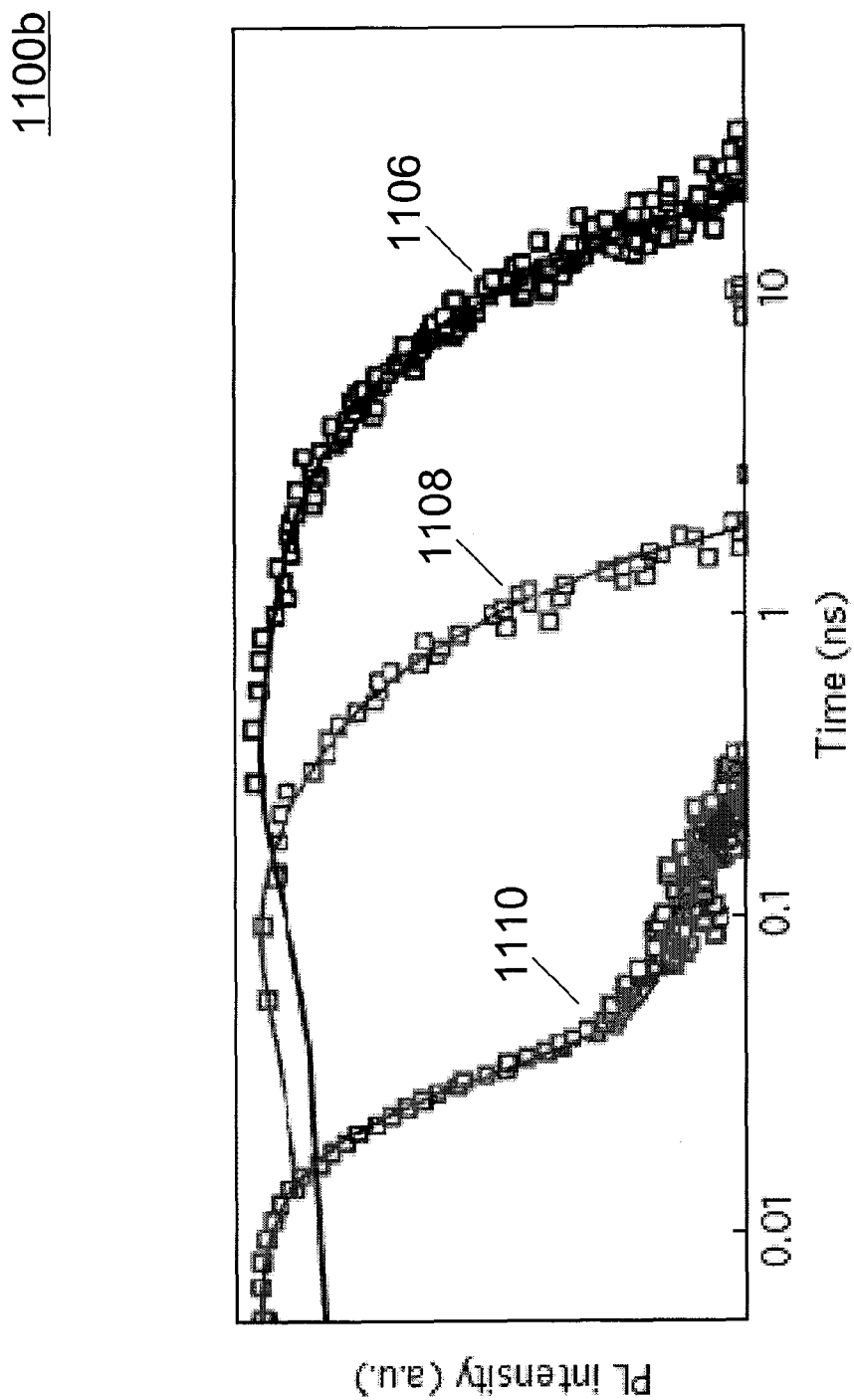
FIG. 11B is a plot showing the time-resolved photoluminescence (TRPL) decay transients for quartz/$CH_3NH_3PbI_3$ (about 1.3 µJ cm$^{-2}$), quartz/$CH_3NH_3PbI_3$/PCBM (about 1.3 µJ cm$^{-2}$ and about 17 µJ cm$^{-2}$) films in vacuum following excitation at 600 nm (1 KHz, 150 fs).
Figure 11C:
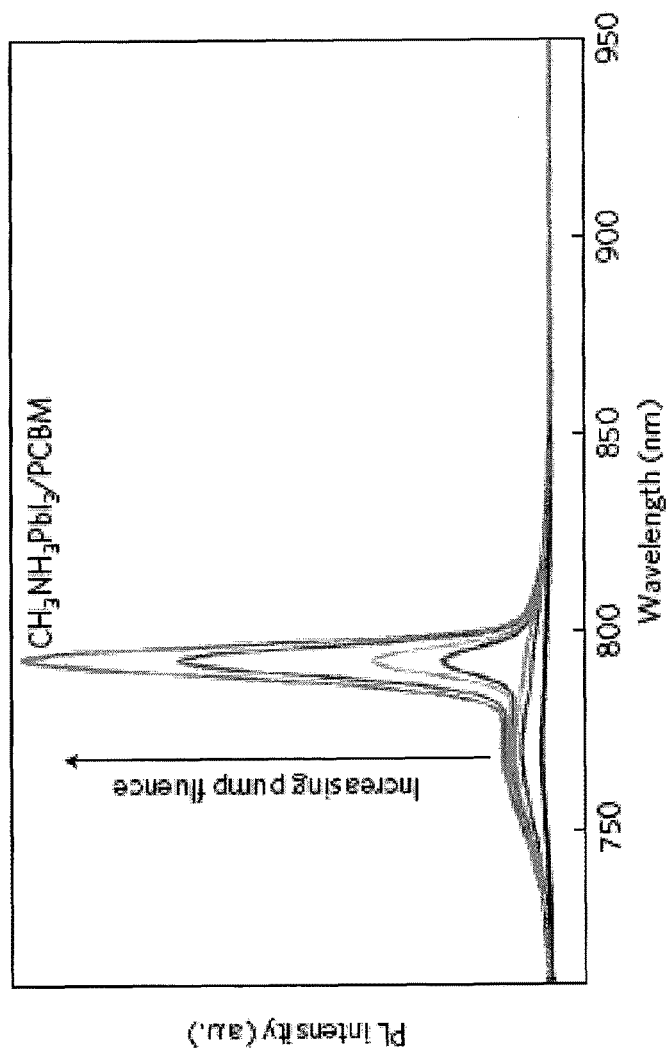
FIG. 11C is a plot of the pump fluence-dependent photoluminescence spectra of quartz/$CH_3NH_3PbI_3$ (65 nm)/PCBM film.
Figure 11D:
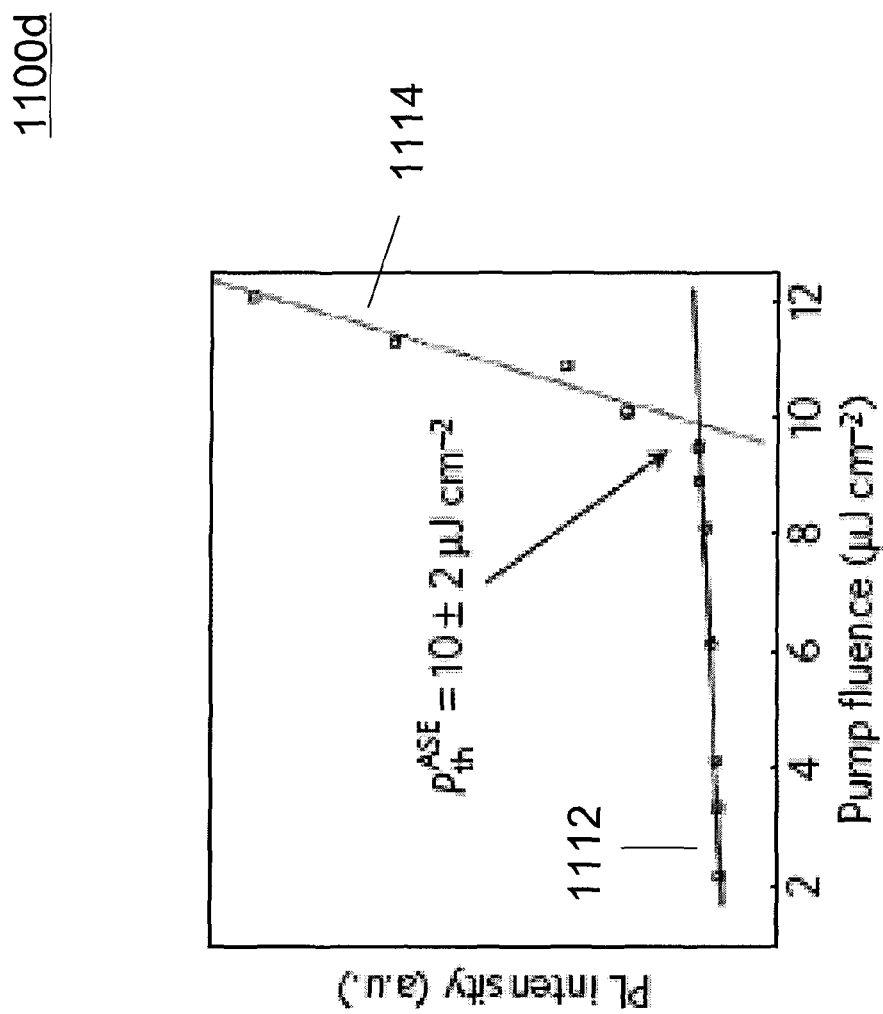
FIG. 11D is a plot of the photoluminescence intensity of quartz/$CH_3NH_3PbI_3$ (65 nm)/PCBM film.

FIG. 11A is a plot 1100a showing the time-integrated PL spectra of $CH_3NH_3PbI_3$ (indicated by 1102) and $CH_3NH_3PbI_3$/([6,6]-phenyl-C61-butyric acid methyl ester (PCBM) (indicated by 1104). FIG. 11B is a plot 1100b showing the time-resolved photoluminescence (TRPL) decay transients for quartz/$CH_3NH_3PbI_3$ (about 1.3 µJ cm$^{-2}$, indicated by 1106), quartz/$CH_3NH_3PbI_3$/PCBM (about 1.3 µJ cm$^{-2}$, indicated by 1108 and about 17 µJ cm$^{-2}$, indicated by 1110) films in vacuum following excitation at 600 nm (1 kHz, 150 fs). Through modifying the surface/interfacial trap density, these measurements reveal that, whereas SE is strongly quenched by the surface/interfacial traps, ASE—which occurs on a much faster timescale—could effectively compete with these carrier trapping processes. The solid lines in FIG. 11B are the single-exponential fits of the PL decay transients. FIG. 11C is a plot 1100c of the pump fluence-dependent photoluminescence spectra of quartz/$CH_3NH_3PbI_3$ (65 nm)/PCBM film. FIG. 11D is a plot 1100d of the photoluminescence intensity of quartz/$CH_3NH_3PbI_3$ (65 nm)/PCBM film. The line 1112 represents the linear fit to experimental data in the linear regime of SE. The line 1114 represents the linear to experimental data in the linear regime of ASE.

The presence of the PCBM layer (~45 nm) is expected to severely quench the SE from the $CH_3NH_3PbI_3$ layer; see FIG. 11A for the PL spectra and FIG. 11B for the PL decay transients. Such efficient PL quenching originates from the long-range electron diffusion in the $CH_3NH_3PbI_3$ film, where the diffusion-limited electron trapping time by the surface states can be estimated to be about 0.40 ns (Xing, G. et al. Long-range balanced electron- and hole-transport lengths in organic-inorganic $CH_3NH_3PbI_3$. Science 342, 344-347 (2013).). Surprisingly, under high pump fluence excitation, the ASE is impervious to the presence of the PCBM layer, which acts as a perfect electron quencher.

FIG. 11B clearly shows that the carrier avalanche proceeds at a much faster timescale than the carrier trapping at the surface states. Thus the surface states will not affect the ASE processes, only the fast bulk traps. Indeed, the ASE threshold fluence for the $CH_3NH_3PbI_3$/PCBM film is measured to be 10±2 µJ cm$^{-2}$ (FIG. 11D).

This value is slightly smaller than that of the bare $CH_3NH_3PbI_3$ film (12±2 µJ cm$^{-2}$) (shown in FIG. 8D) because of the better light confinement and propagation due to the presence of the PCBM cladding layer which improves gain buildup.

Figure 7A:
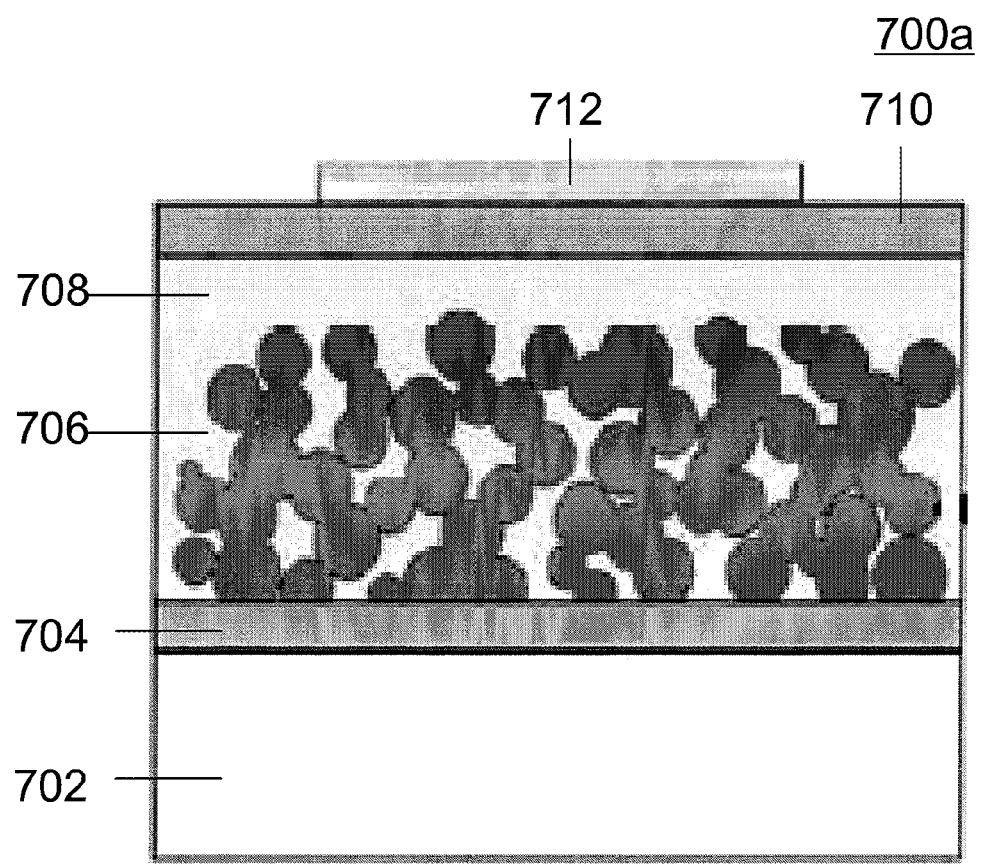
FIG. 7A is a schematic of a solar cell according to various embodiments.
Figure 7B:
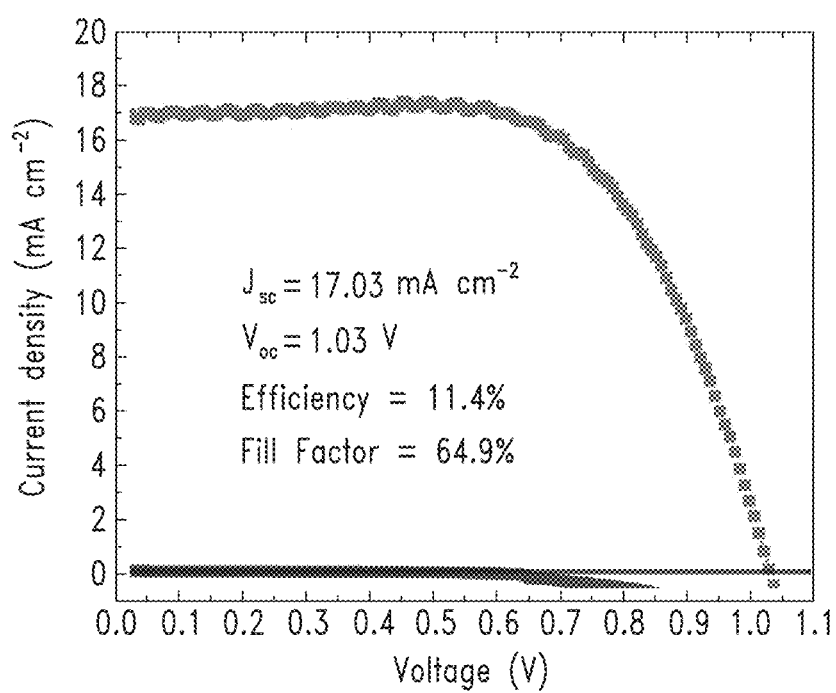
FIG. 7B is a plot showing the current density J (mA cm$^{-2}$) under A 1.5 (100 mW/cm$^2$) illumination.
Figure 7C:
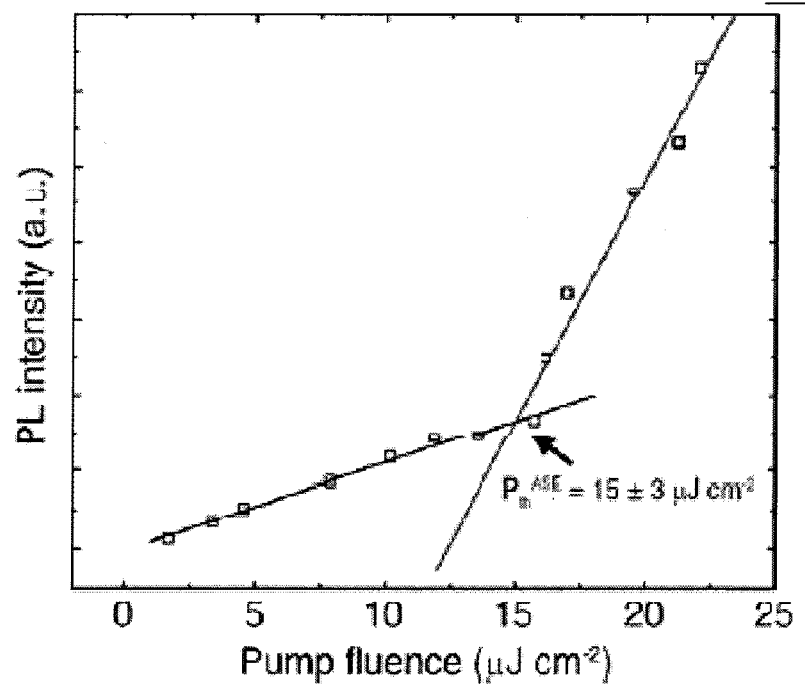
FIG. 7C is a plot of photoluminescence (PL) intensity (arbitrary units) as a function of pump fluence (µ J cm$^{-2}$) showing amplified spontaneous emission (ASE) threshold of the solar cell configuration.
Figure 7D:
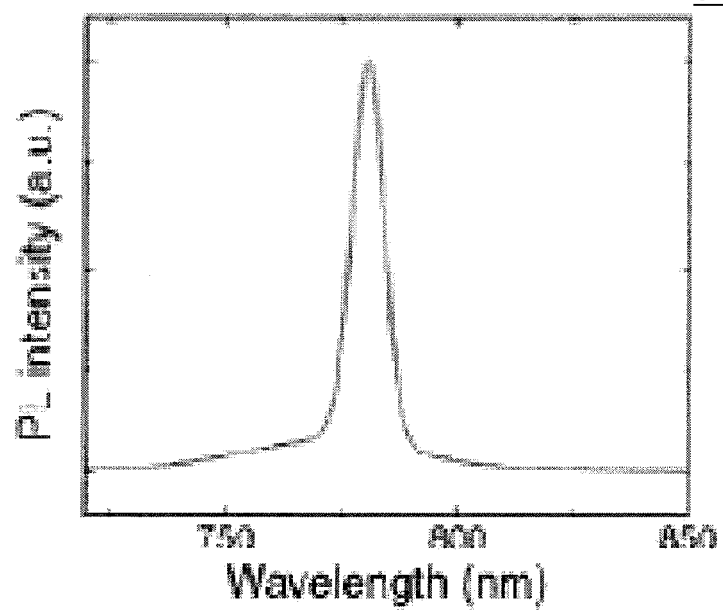
FIG. 7D is a plot of the ASE spectrum.
Figure 7E:
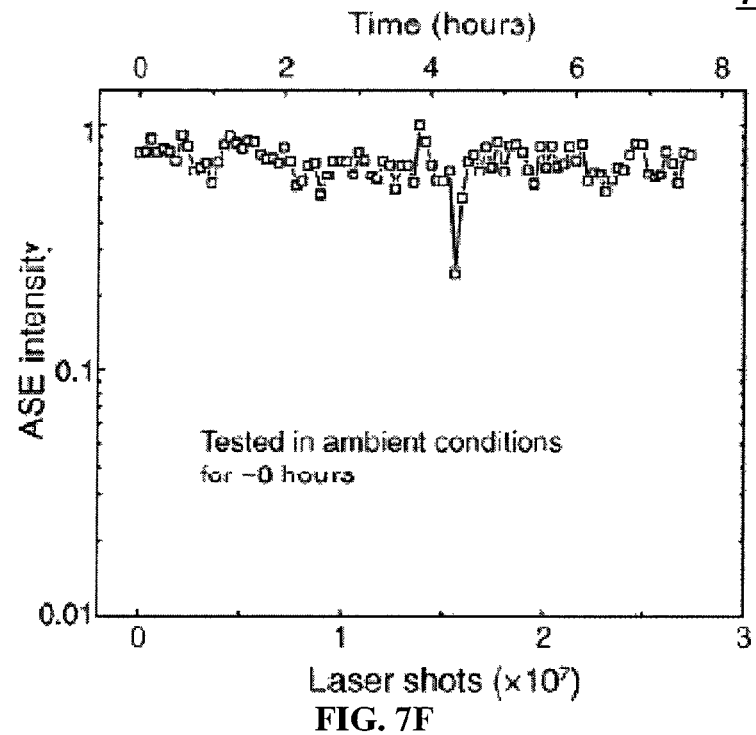
FIG. 7E is a plot showing ASE photostability measured under ambient conditions of the device (Excited with 600 nm, 1 KHz, 50 fs laser pulses, ~20 µJ cm$^{-2}$).
Figure 7F:
FIG. 7F is a photo showing a demonstration of green ASE from $CH_3NH_3PbBr_3$ deposited on PET substrates pumped using two-photon absorption at 800 nm.

FIG. 7A is a schematic 700a of a solar cell according to various embodiments. The solar cell may include a substrate 702 such as fluorine doped tin oxide (FTO) glass. The solar cell may further include a blocking layer 704 on the substrate 702. The blocking layer 704 may be a titanium oxide ($TiO_2$) blocking layer. The solar cell may further include a mesoporous layer 706 (e.g. a $TiO_2$ mesoporous layer) on the blocking layer 704. The solar cell may further include a layer including halide perovskite material 708 (e.g. $CH_3NH_3PbI_3$) on the mesoporous layer 706. The solar cell may additionally include a hole transport layer 710 on layer 708. The solar cell may also include an electrode 712 (e.g. a gold or aluminum electrode) on the hole transport layer 710. FIG. 7B is a plot 700b showing the current density J (mA cm$^{-2}$) under A 1.5 (100 mW/cm$^2$) illumination. FIG. 7C is a plot 700c of photoluminescence (PL) intensity (arbitrary units) as a function of pump fluence (µ J cm$^{-2}$) showing amplified spontaneous emission (ASE) threshold of the solar cell configuration. FIG. 7D is a plot 700d of the ASE spectrum. The photoluminescence (PL) intensity (arbitrary units) as a function of wavelength (nm). FIG. 7E is a plot 700e showing ASE photostability measured under ambient conditions of the device (Excited with 600 nm, 1 KHz, 50 fs laser pulses, ~20 µJ cm$^{-2}$). FIG. 7F is a photo 700f showing a demonstration of green ASE from $CH_3NH_3PbBr_3$ deposited on PET substrates pumped using two-photon absorption at 800 nm.

Remarkably, ASE can also be observed in functional photovoltaic devices (ç=11.4%; Device structure: FTO/$TiO_2$ compact layer/$TiO_2$ mesoporous layer/$CH_3NH_3PbI_3$/Spiro-OMeTAD/Au) with optical excitation; see FIG. 7A. The presence of the Spiro-OMeTAD layer, which acts as a perfect hole quencher, has no effect on the ASE from $CH_3NH_3PbI_3$—further exemplifying its exceptional gain properties.

Although a low bulk defect density is favourable for obtaining reduced ASE thresholds, a critical criterion for achieving ASE is suppressed multi-particle non-radiative recombination rates (for example, bimolecular recombination noted in organics or Auger recombination in inorganic semiconductors). Bimolecular recombination (which is a limiting process in organic lasing) has been reported to be extremely low in $CH_3NH_3PbI_3$—defying the Langevin recombination limit by at least four orders of magnitude.

These low bi-molecular charge recombination constants are consistent with our findings of low bulk defect densities as discussed earlier. The Auger recombination process in perovskite, which manifests under high pump fluence (non-linear regime), typically yields Auger lifetimes ($\tau_{Auger}$) from a few ps to ns, depending on the photo-generated charge carrier density. The Auger recombination in $CH_3NH_3PbI_3$ is efficient ($\tau_{Auger}$~300 ps) compared with SE (4.5±0.3 ns) because of the long-range electron-hole diffusion lengths within them. However, the timescale for the occurrence of ASE (<10 ps-limited by the instrument response) signifies that the carrier build-up time for population inversion and the subsequent avalanche, out-competes the Auger processes in these $CH_3NH_3PbI_3$ thin films (Supplementary Information). In contrast to solution-processed colloidal QDs (typical biexciton $\tau_{Auger}$~50 ps for 5 nm diameter CdSe QDs), such an Auger loss mechanism is less dominant in this 'bulk-like' $CH_3NH_3PbI_3$ film.

Figure 6A:
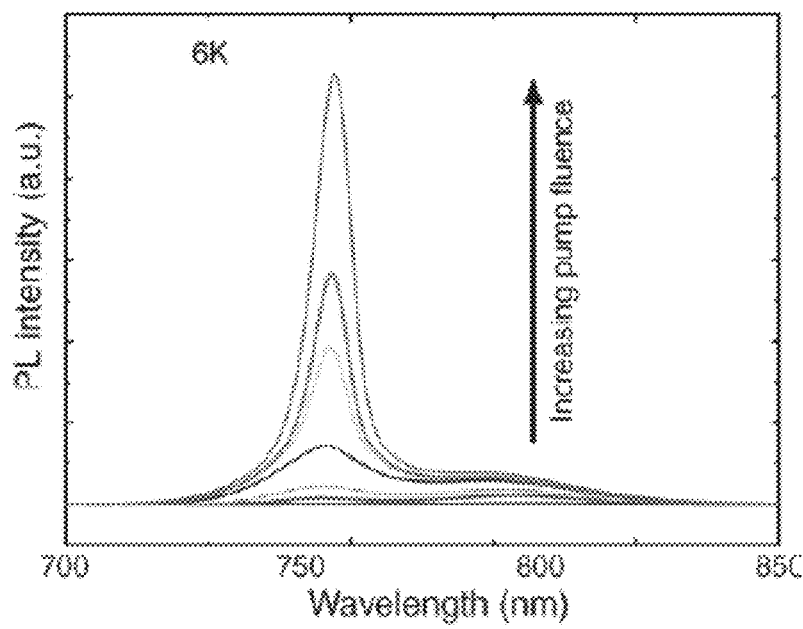
FIG. 6A is a plot of pump fluence dependent photoluminescence (PL) spectra at 6K.
Figure 6B:
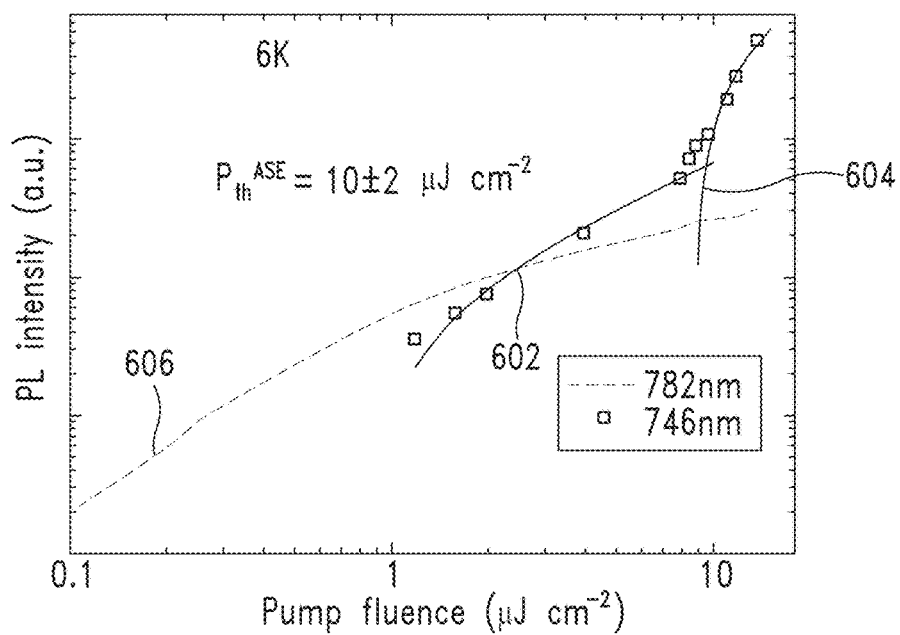
FIG. 6B is a plot of pump fluence dependent photoluminescence (PL) intensity at 6K.

Temperature dependent studies were also performed to further characterize the solution-processed $CH_3NH_3PbI_3$ gain medium. FIG. 6A is a plot 600a of pump fluence dependent photoluminescence (PL) spectra at 6K. FIG. 6A plots PL intensity (in arbitrary units or a.u.) against wavelengths (nm). FIG. 6B is a plot 600b of pump fluence dependent photoluminescence (PL) intensity at 6K. FIG. 6B plots PL intensity (in arbitrary units or a.u.) against pump fluence (µJ cm$^{-2}$).

Due to the limited bound states in the film, the emission intensity of these two peaks exhibit clear saturation behaviors at higher pump fluence. However, the free exciton emission intensity increases continually with increasing pump fluence, finally achieving ASE above a threshold fluence of 10±2 0/cm$^2$. This ASE threshold at 6 K is comparable to that at 300 K (i.e., 12±2 µJ cm$^{-2}$). Comparatively, traditional inorganic semiconductor gain media are highly susceptible to temperature induced effects: strong phonon assisted charge carrier trapping; temperature dependent exciton dissociation and photo-generated charge carrier diffusion and dilution. Hence, the threshold pump fluence for generating coherent light emission from these inorganic semiconductor materials are strongly temperature dependent. However, for $CH_3NH_3PbI_3$, the ASE threshold is almost temperature-insensitive, which are similar to organic chromophores and quantum dots. The line 602 represents the fit to experimental data in the regime of SE for the 746 nm PL peak. The line 604 represents the fit to experimental data in the regime of ASE for the 746 nm PL peak. Line 606 indicates variation of PL intensity for the 782 nm peak as a function of pump fluence. The temperature-insensitivity of $CH_3NH_3PbI_3$ ASE threshold stems from its extremely low trap states density and almost temperature invariant charge carrier diffusion as indicated by FIG. 6C.

Figure 6C:
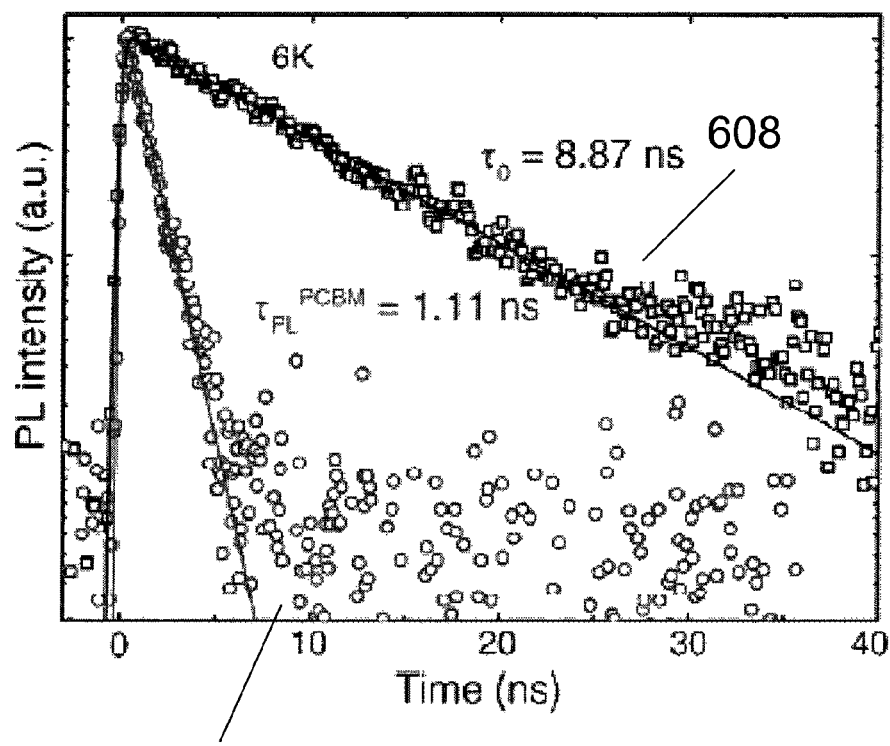
FIG. 6C is a plot showing time resolved photoluminescence (TRPL) TRPL decay transients for quartz/$CH_3NH_3PbI_3$ (65 nm) and quartz/$CH_3NH_3PbI_3$ (65 nm)/PCBM(45 nm) films in vacuum following excitation at 600 nm (1 KHz, 150 fs, ~1 µJ cm$^{-2}$).

FIG. 6C is a plot 600c showing time resolved photoluminescence (TRPL) TRPL decay transients for quartz/$CH_3NH_3PbI_3$ (65 nm) (indicated by 608) and quartz/$CH_3NH_3PbI_3$ (65 nm)/PCBM(45 nm) (indicated by 610) films in vacuum following excitation at 600 nm (1 KHz, 150 fs, ~1 μJ $cm^{-2}$). The solid lines in FIG. 6C are the single-exponential fits of the PL decay transients.

Our experiments also show that such perovskite gain media have nearly temperature independent threshold pump fluence (carrier density). In contrast, traditional semiconductor gain media have strong temperature dependent threshold pump fluence (carrier density).

The photostability of the $CH_3NH_3PbI_3$ thin films was assessed by monitoring the ASE intensity as a function of time under laser irradiation at a 1 kHz repetition rate at room temperature.

Figure 12A:
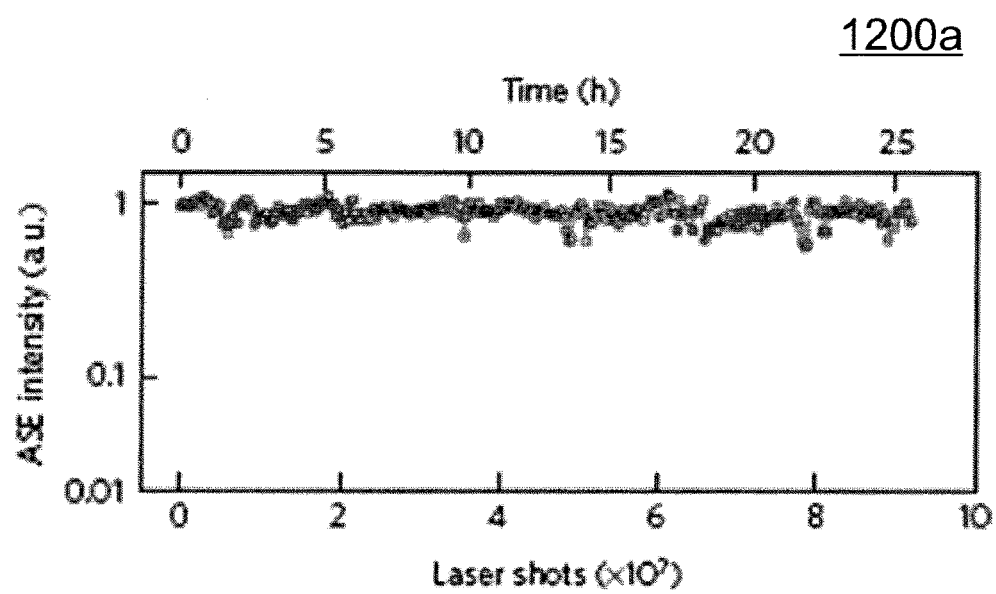
FIG. 12A is a plot showing shot-dependent ASE intensity of the solution-processed $CH_3NH_3PbI_3$ film with over 9×10$^7$ laser excitation shots at 600 nm (1 kHz, 50 fs, ~18 µJ cm$^{-2}$) performed at room temperature.
Figure 12B:
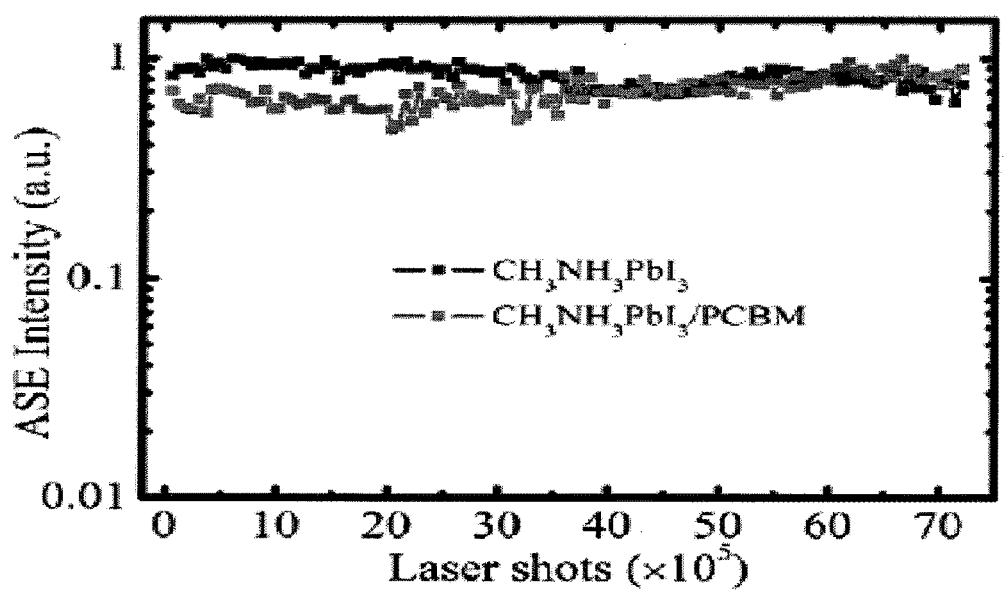
FIG. 12B is a plot showing shot-dependent ASE intensity of the solution processed $CH_3NH_3PbI_3$ and $CH_3NH_3PbI_3$/PCBM films over 7×10$^6$ at 600 nm (1 KHz, 50 fs, 14 µJ/cm$^2$) under room temperature.

FIG. 12A is a plot 1200a showing shot-dependent ASE intensity of the solution-processed $CH_3NH_3PbI_3$ film with over $9 \times 10^7$ laser excitation shots at 600 nm (1 kHz, 50 fs, ~18 μJ $cm^{-2}$) performed at room temperature. The ASE intensity has a standard deviation of 0.2% about the mean intensity for about 26 h of continuous irradiation (that is $\sim 10^8$ laser shots in all). FIG. 12B is a plot 1200b showing shot-dependent ASE intensity of the solution processed $CH_3NH_3PbI_3$ and $CH_3NH_3PbI_3$/PCBM films over $7 \times 10^6$ at 600 nm (1 KHz, 50 fs, 14 μJ/$cm^2$) under room temperature. Following such a large number of laser pulse excitation events, the near invariance of the output intensity shown in FIGS. 12A-B bear testimony to the excellent optical stability of the low temperature solution processed perovskites as gain media.

This performance compares favourably against the state-of-the-art organic semiconducting thin films (50% drop in output power after about $10^7$ laser shots; Grivas, C. & Pollnau, M. "Organic solid-state integrated amplifiers and lasers", Laser Photon. Rev. 6, 419-462 (2012)) and colloidal QDs (50% drop in output power after about $10^6$ laser shots; Chan, Y. et al. "Blue semiconductor nanocrystal laser", Appl. Phys. Lett. 86, 073102 (2005)). The impressive ASE stability of the perovskite layers is also evident from tests of perovskite solar cells irradiated for about 8 h under ambient conditions (FIG. 7E).

Figure 12C:
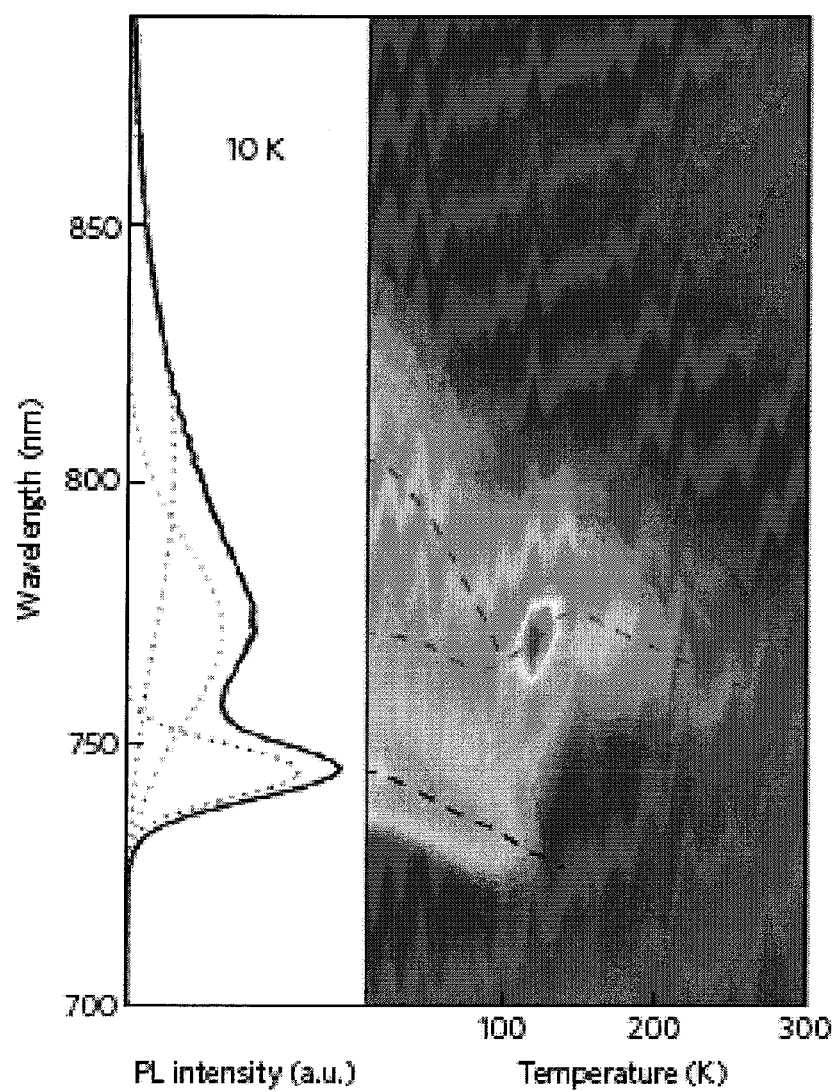
FIG. 12C is a plot showing the PL spectrum at 10 K. The dotted lines are the deconvolved Gaussian peaks.
Figure 12D:
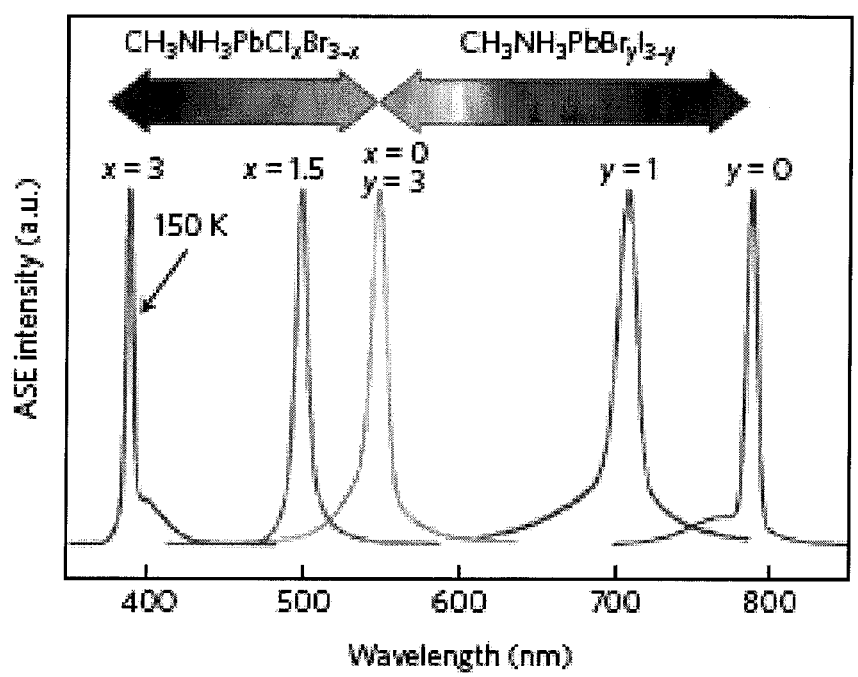
FIG. 12D is a plot showing wide wavelength tunability of ASE wavelengths from low-temperature solution-processed organic-inorganic halide semiconductor films fabricated by mixing the precursor solutions.

FIG. 12C is a plot 1200c showing the PL spectrum at 10 K. The dotted lines are the deconvolved Gaussian peaks. The dashed lines in the false colour temperature-dependent PL map show the evolution of the emission peaks with temperature. FIG. 12D is a plot 1200d showing wide wavelength tunability of ASE wavelengths from low-temperature solution-processed organic-inorganic halide perovskite films fabricated by mixing the precursor solutions.

In the absence of any significant defect concentrations, the SE may originate from the bandedge emission. Because the SE may provide the seed photons for the photon cascade in ASE, the ASE wavelengths may be in turn dependent on the bandgap of the semiconducting film. This is clearly evident from our temperature-dependent studies, where an increase in the bandgap due to a tetragonal to orthorhombic phase transition results in a blue-shifted SE and a corresponding shift in the ASE (FIG. 12C). The orthorhombic phase may give rise to three emission peaks, attributed to two bound exciton emissions (815 nm and 782 nm) and a free exciton emission (746 nm), which yields the low-temperature ASE peak (at a threshold fluence of 10±2 μJ $cm^{-2}$. Such an intrinsic dependence of the ASE on the bandgap may allow wavelength tunability through halide substitution. By using either mixtures of bromides and iodides or chlorides and iodides, the bandgap may be continuously tunable over the entire visible spectral range (from about 390 to about 790 nm). We realize this through a simple physical mixing of the precursor solutions before spin-coating.

FIG. 12D is a plot 1200d showing the ASE from $CH_3NH_3PbCl_3$, $CH_3NH_3PbCl_{1.5}Br_{1.5}$, $CH_3NH_3PbBr_3$, $CH_3NH_3PbBrI_2$ and $CH_3NH_3PbI_3$ thin films, demonstrating its wide wavelength-tunability. The ability of the perovskites to encompass the full visible spectrum may allow them to address the 'green gap' seen in III-nitrides and III-phosphides. Lasing in perovskites may be achieved with a suitably designed cavity resonator (for example, with microspheres as whispering galley mode lasing or with gratings as distributed feedback lasing). Towards this lasing has also been observed from $CH_3NH_3PbI_3$ single crystals from dropcast thin films (FIGS. 10A-C). This shows that despite the relatively lower PLQY measured, the impressive gain, the large absorption cross-section, low defect densities, low bimolecular recombination and slow Auger recombination in $CH_3NH_3PbI_3$ enables lasing.

Figure 13A:
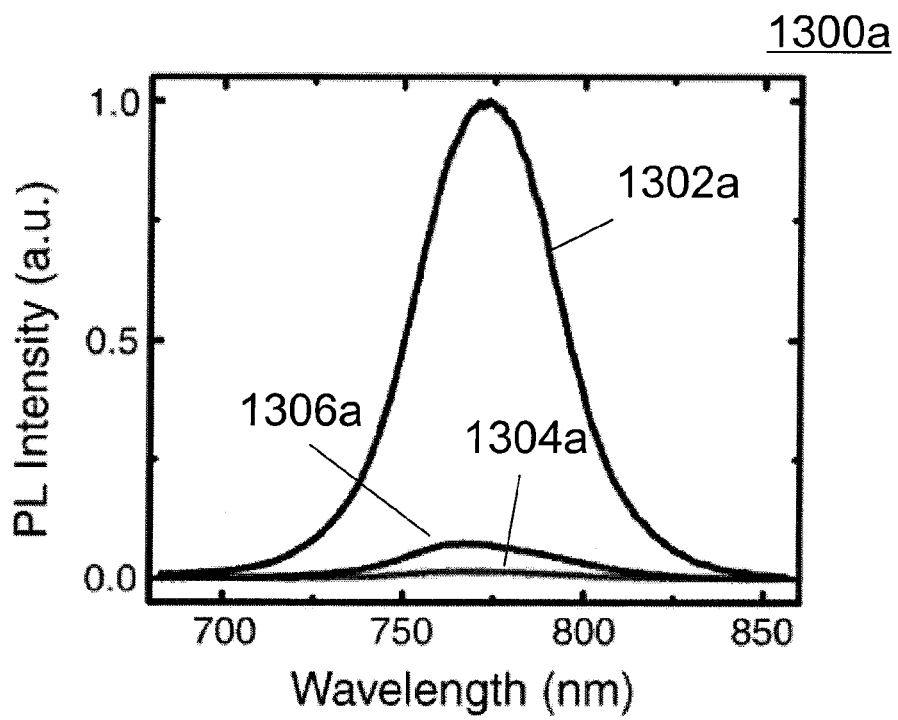
FIG. 13A is a plot showing the time-integrated PL spectra measured at 760±10 nm for quartz/$CH_3NH_3PbI_3$(65 nm), quartz//$CH_3NH_3PbI_3$ (65 nm)/PCBM (indicated by 1304a), quartz/$CH_3NH_3PbI_3$(65 nm)/Spiro-OMeTAD films in vacuum following excitation at 600 nm (1 KHz, 150 fs, 1.3 µJ/cm2).
Figure 13B:
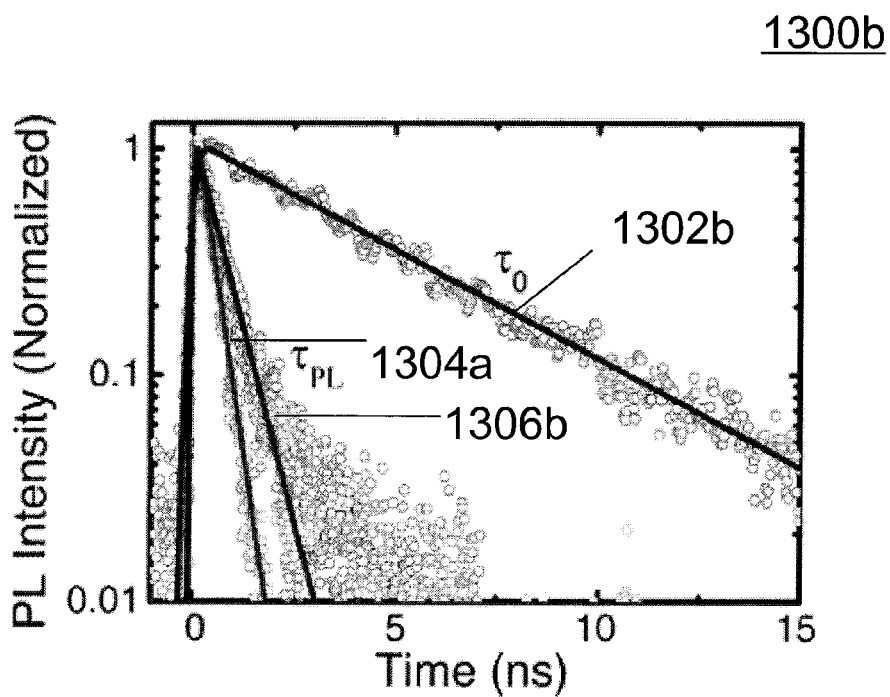
FIG. 13B is a plot showing TRPL decay transients measured at 760±10 nm for quartz/$CH_3NH_3PbI_3$(65 nm), quartz/$CH_3NH_3PbI_3$(65 nm)/PCBM, quartz/$CH_3NH_3PbI_3$(65 nm)/Spiro-OMeTAD films in vacuum following excitation at 600 nm (1 KHz, 150 fs, 1.3 µJ/cm2).
Figure 13C:
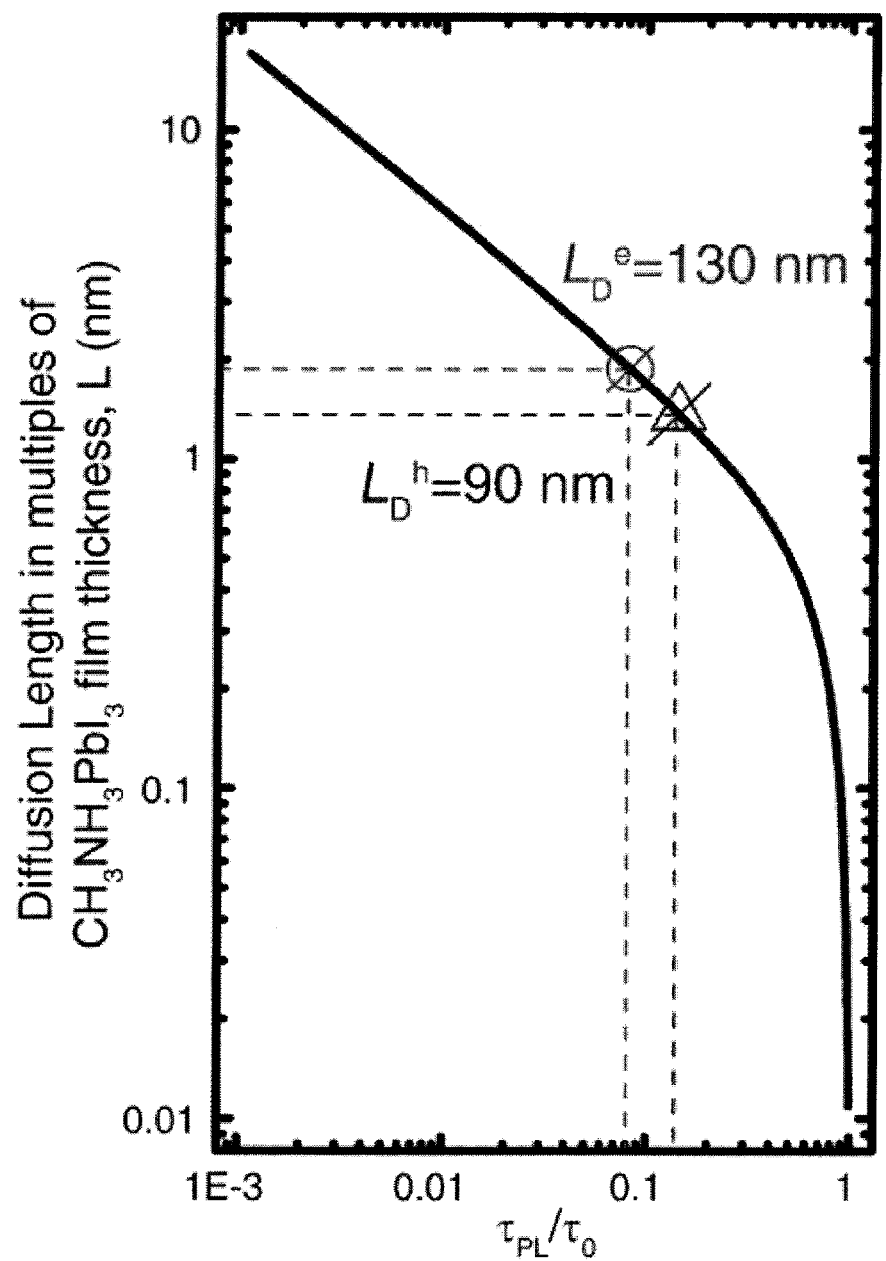
FIG. 13C is a plot of exciton diffusion length as a function of PL lifetime quenching ratios.

FIG. 13A is a plot 1300a showing the time-integrated PL spectra measured at 760±10 nm for quartz/$CH_3NH_3PbI_3$(65 nm) (indicated by line 1302a), quartz//$CH_3NH_3PbI_3$ (65 nm)/PCBM (indicated by 1304a), quartz/CH3NH3PbI3(65 nm)/Spiro-OMeTAD (indicated by 1306a) films in vacuum following excitation at 600 nm (1 KHz, 150 fs, 1.3 μJ cm2). FIG. 13B is a plot 1300b showing TRPL decay transients measured at 760±10 nm for quartz/CH3NH3PbI3(65 nm) (indicated by line 1302b), quartz/CH3NH3PbI3(65 nm)/PCBM (indicated by line 1304b), quartz/CH3NH3PbI3(65 nm)/Spiro-OMeTAD (indicated by line 1306b) films in vacuum following excitation at 600 nm (1 KHz, 150 fs, 1.3 μJ/$cm^2$). The solid lines in FIG. 13B are the single-exponential fits of the PL decay transients. FIG. 13C is a plot 1300c of exciton diffusion length as a function of PL lifetime quenching ratios. FIG. 13C is based on equation (5). Diffusion length is scaled in multiples of $CH_3NH_3PbI_3$ layer thickness (L=65 nm). A consequence of the low trap density within this perovskite gain medium may include long range balanced electron and hole diffusion lengths, which guarantee the good electron and hole injection. It may therefore possible to achieve efficient electrical-driven lasing in this class of materials.

Various embodiments may be fabricated using a low temperature solution processed approach. In contrast, traditional semiconductor gain media are usually produced at elevated temperatures and using high vacuum growth techniques that require significant infrastructural investments.

Further, a solution processable gain medium according to various embodiments may have much greater versatility than traditional gain media for integration with existing silicon based technologies. It may be applied to a much wider range of optical cavity designs and substrates by simply spin-coating, dip-coating or dropcasting.

The lasing wavelength in these classes of materials may be determined by the band to band transition. The energetic separation between the bands (and hence the lasing wavelength) can be modified by facile substitution of either the metal or the organic component or the halide. This can allow lasing wavelengths from the visible to the infrared.

Our findings show that these organic-inorganic halide semiconductors may be a new class of robust solution-processed gain media with highly desirable characteristics. The low ASE threshold and the long-range balanced charge carrier diffusion length may stem from the low bulk defect density in $CH_3NH_3PbI_3$ films. The highly crystalline $PbX_6$ three-dimensional network may lend crystalline inorganic character to $CH_3NH_3PbX_3$ while maintaining its solution processability. Broad wavelength tunability is possible with both cation and anion replacement. Their low-temperature solution processing may be highly compatible with unconventional substrates, printing technologies and monolithic integration with silicon-based electronics. Together with the long-range balanced electron and hole diffusion, high charge carrier mobilities and low bimolecular charge recombination rates, as well as large wavelength range continuously tunable coherent emission, our findings indicate that the simple solution-processed $CH_3NH_3PbX_3$ may hold the key to realizing electrically driven solution-processed on-chip coherent light sources.

Low temperature solution processed photovoltaics suffer from low efficiencies due to poor exciton/electron-hole diffusion lengths (typically about 10 nanometers). Recent reports of highly efficient $CH_3NH_3PbI_3$-based solar cells in a broad range of configurations raise a compelling case for understanding the fundamental photophysical mechanisms in these materials. By applying femtosecond transient optical spectroscopy to bilayers that interface this perovskite with either selective electron or selective hole extraction materials, we have uncovered concrete evidence of balanced long-range electron-hole diffusion lengths of at least 100 nm in solution processed $CH_3NH_3PbI_3$. The high photoconversion efficiencies of these systems stem from the comparable optical absorption length and charge carrier diffusion lengths, transcending the traditional constraints of solution processed semiconductors.

An ideal solar cell material should combine good optical absorption characteristics with efficient charge transport properties. Low temperature solution processed light harvesting films prepared by techniques such as spin coating and chemical bath deposition are typically amorphous or poorly crystalline, consequently suffering from poor charge carrier transport. This limitation necessitates device designs that decouple light absorption and charge carrier transport lengths, including light trapping strategies such as plasmonics as well as the sensitized solar cell architecture. The recent development of organic-inorganic halide perovskite materials such as $CH_3NH_3PbI_3$ as light harvesters in solid state sensitized solar cells has led to reports of impressive efficiency values of up to 15%. This remarkable material has been employed in a variety of photovoltaic architectures. A configuration employed by Kim et al. (H. S. Kim et al., "Lead iodide perovskite sensitized all-solid-state submicron thin film mesoscopic solar cell with efficiency exceeding 9%", Scientific Reports 2, 591 (2012)) and Heo et al. (J. H. Heo et al., Efficient inorganic-organic hybrid heterojunction solar cells containing perovskite compound and polymeric hole conductors. Nature Photonics 7, 486 (2013)), sandwiches the thin perovskite layer between a rough mesoporous $TiO_2$ photoanode and a hole transporting layer such as (2,2',7,7'-tetrakis(N,N-di-p-methoxyphenylamine)-9,9'-spirobi-fluorene (Spiro-OMeTAD). Lee et al. (M. M. Lee, J. Teuscher, T. Miyasaka, T. N. Murakami, H. J. Snaith, "Efficient hybrid solar cells based on meso-superstructured organometal halide perovskites", Science 338, 643 (2012)) have shown that efficient solar cells can be fabricated by replacing the $TiO_2$ photoanode with an insulating $Al_2O_3$ scaffold—implying good electron transport properties. Surprisingly, Etgar et al. (L. Etgar et al., Mesoscopic $CH_3NH_3PbI_3/TiO_2$ heterojunction solar cells. Journal of the American Chemical Society 134, 17396 (2012)) reported an efficiency of 5.5% in a configuration without the hole transporting layer—indicating good hole transport properties. These indications of ambipolar charge transport capabilities are supported by a recent report by Ball et al. (J. M. Ball, M. M. Lee, A. Hey, H. J. Snaith, Low-temperature processed mesosuperstructured to thin-film perovskite solar cells. Energy and Environmental Science 6, 1739 (2013)) which demonstrated that ~350 nm thick planar films sandwiched between a $TiO_2$ compact layer and a hole transporting layer can generate short circuit current densities of 15 mA/cm$^2$. These reports together imply that the electron and hole transport lengths within these organic-inorganic hybrid materials are high. Nonetheless, the innate dynamics of the photoexcited electrons and holes in $CH_3NH_3PbI_3$ driving the high efficiencies in these solar cells are unknown. Herein, through femtosecond transient optical spectroscopy of $CH_3NH_3PbI_3$ heterojunctions with selective electron and hole extraction, we successfully decouple electron and hole dynamics and show clear evidence of long electron and hole transport lengths (both over 100 nm). Our findings indicate that this class of materials does not suffer from the bottleneck of low collection lengths which handicap typical low temperature solution processed photovoltaic materials.

Figure 14A:
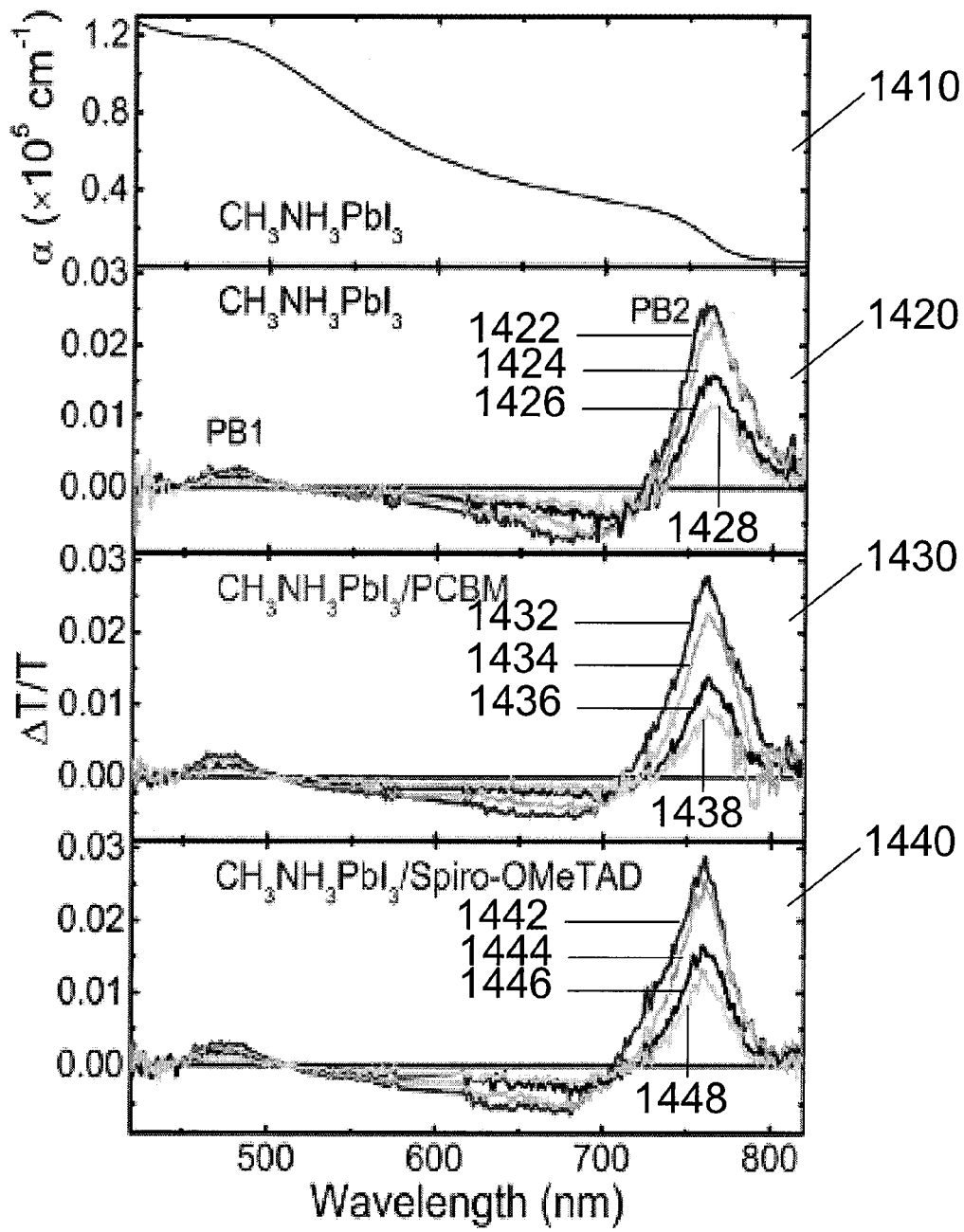
FIG. 14A is an illustration showing the absorbance and transmission spectra of $CH_3NH_3PbI_3$, $CH_3NH_3PbI_3$/PCBM, $CH_3NH_3PbI_3$/Spiro-OMeTAD.

FIG. 14A is am illustration 1400a showing the absorbance and transmission spectra of $CH_3NH_3PbI_3$, $CH_3NH_3PbI_3$/PCBM, $CH_3NH_3PbI_3$/Spiro-OMeTAD. 1410 shows the absorbance spectra for pure $CH_3NH_3PbI_3$. 1420 shows the differential transmission spectra for $CH_3NH_3PbI_3$. 1430 shows the differential transmission spectra for $CH_3NH_3PbI_3$/PCBM. 1440 shows the differential transmission spectra for $CH_3NH_3PbI_3$/Spiro-OMeTAD. The films are in vacuum and the spectra are measured at 600 nm (1 KHz, 150 fs, 13 µJ/cm$^2$). Lines 1422, 1432, 1442 are measured at 1 ps. Lines 1424, 1434, 1444 are measured at 100 ps. Lines 1426, 1436, 1446 are measured at 500 ps. Lines 1428, 1438, 1448 are measured at 1 ns.

Figure 14B:
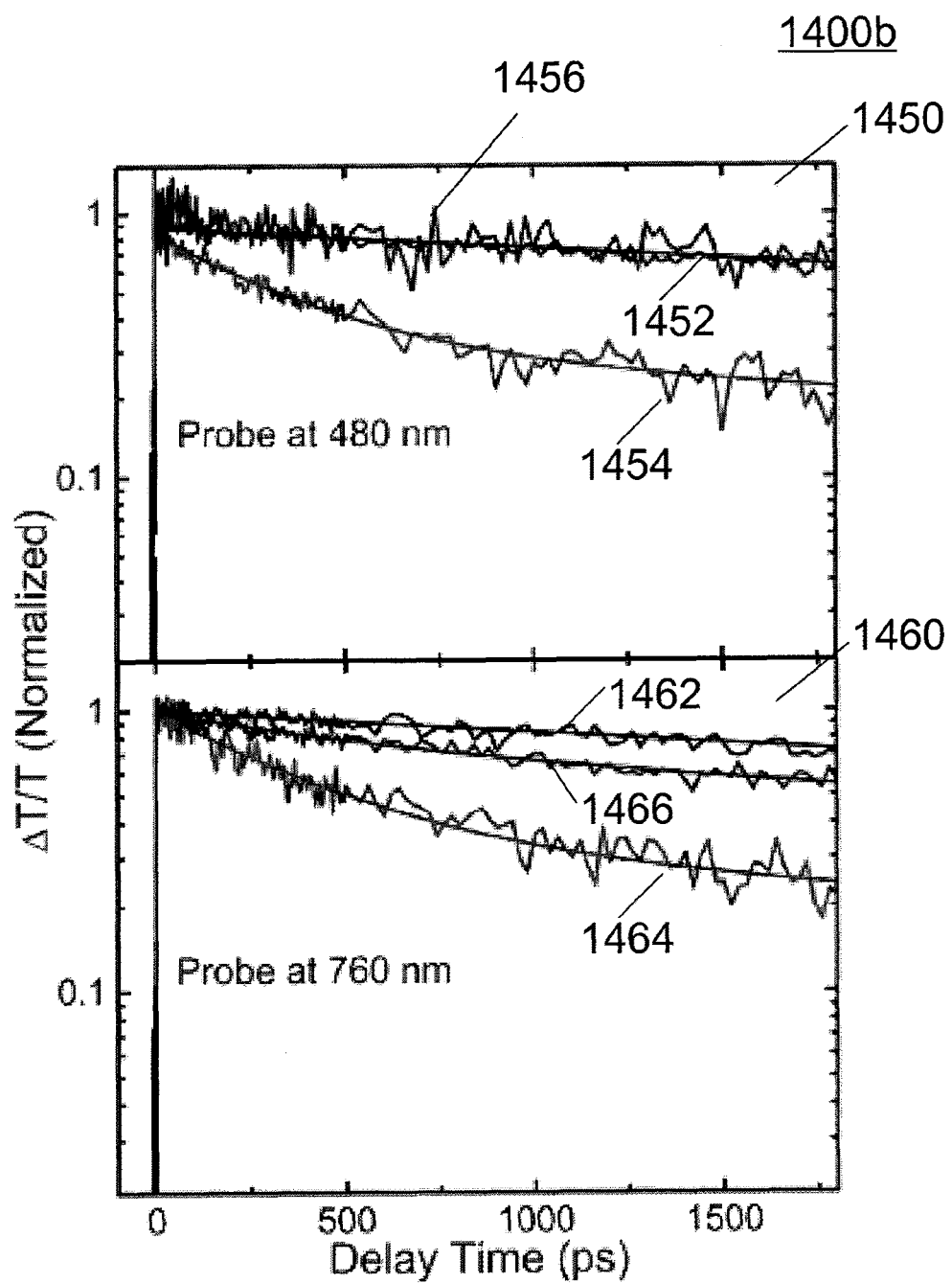
FIG. 14B is an illustration 1400b showing normalized bleaching kinetics for films in vacuum following excitation at 600 nm (1 KHz, 150 fs, 1.3 µJ/cm$^2$).

FIG. 14B is an illustration 1400b showing normalized bleaching kinetics for films in vacuum following excitation at 600 nm (1 KHz, 150 fs, 1.3 µJ/cm$^2$). 1450 shows the normalized bleaching kinetics at 480 nm while 1460 shows the normalized bleaching kinetics at 760 nm. 1452, 1462 represent the data for $CH_3NH_3PbI_3$. 1454, 1464 represent the data for $CH_3NH_3PbI_3$/PCBM. 1456, 1466 represent the data for $CH_3NH_3PbI_3$/Spiro-OMeTAD.

Figure 15A:
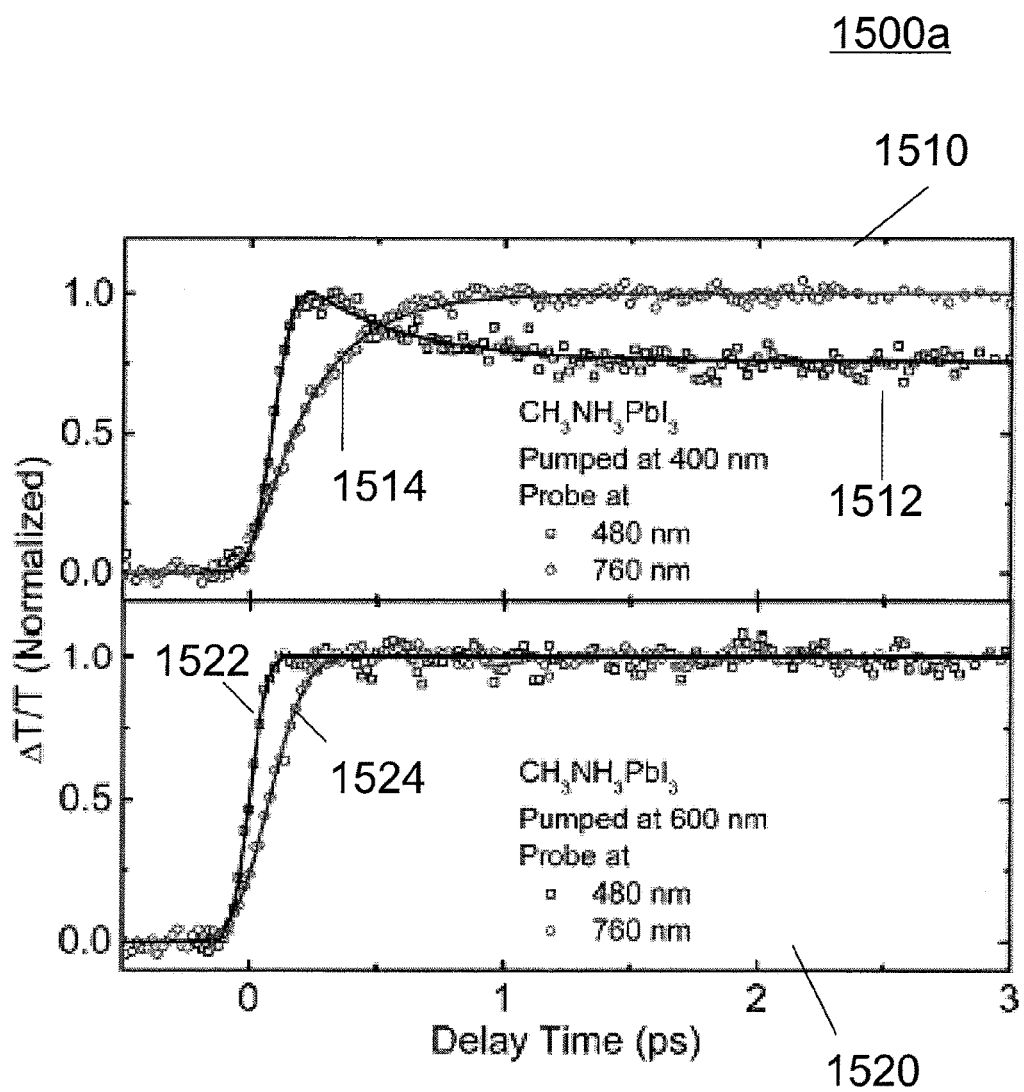
FIG. 15A is an illustration of normalized bleaching kinetics in short time range showing the inter-valence band hot hole cooling for $CH_3NH_3PbI_3$ (in vacuum) following excitation.

FIG. 15A is an illustration 1500a of normalized bleaching kinetics in short time range showing the inter-valence band hot hole cooling for $CH_3NH_3PbI_3$ (in vacuum) following excitation. 1510 shows the early time dynamics following excitation at 400 nm (1 µJ/cm$^2$). 1520 shows the early time dynamics following excitation at 600 nm (1.3 µJ/cm$^2$). 1512, 1522 represent the data at 480 nm while 1514, 1524 represent the data at 760 nm.

Figure 15B:
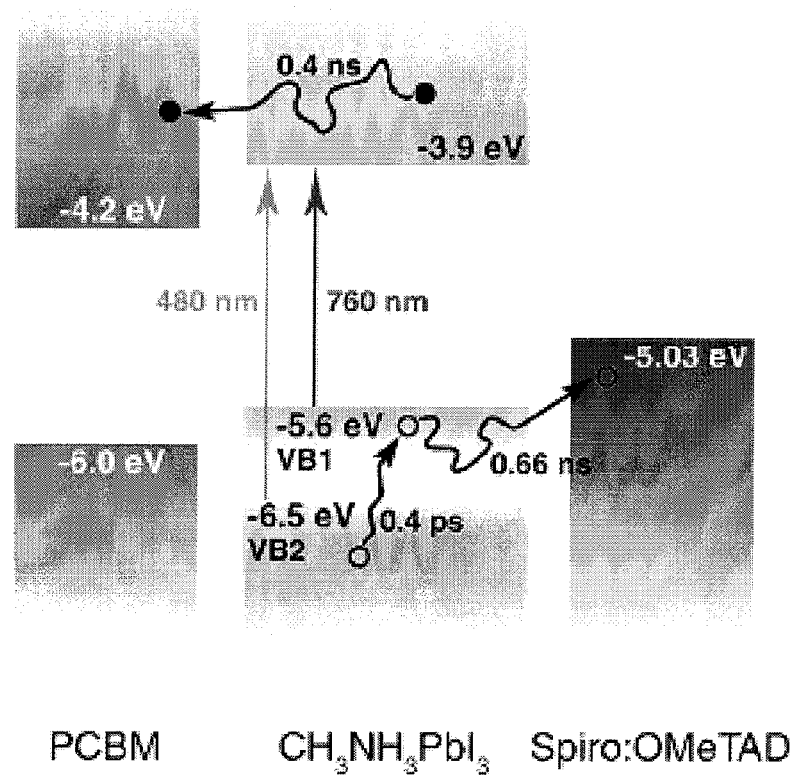
FIG. 15B is a schematic illustrating the hot hole cooling and charge recombination within $CH_3NH_3PbI_3$ and charge separation at the $CH_3NH_3PbI_3$/PCBM and $CH_3NH_3PbI_3$/Spiro-OMeTAD interfaces.

FIG. 15B is a schematic 1500b illustrating the hot hole cooling and charge recombination within $CH_3NH_3PbI_3$ and charge separation at the $CH_3NH_3PbI_3$/PCBM and $CH_3NH_3PbI_3$/Spiro-OMeTAD interfaces. The approximate positions of VB1 and VB2 were obtained from the TA measurements.

Figure 16:
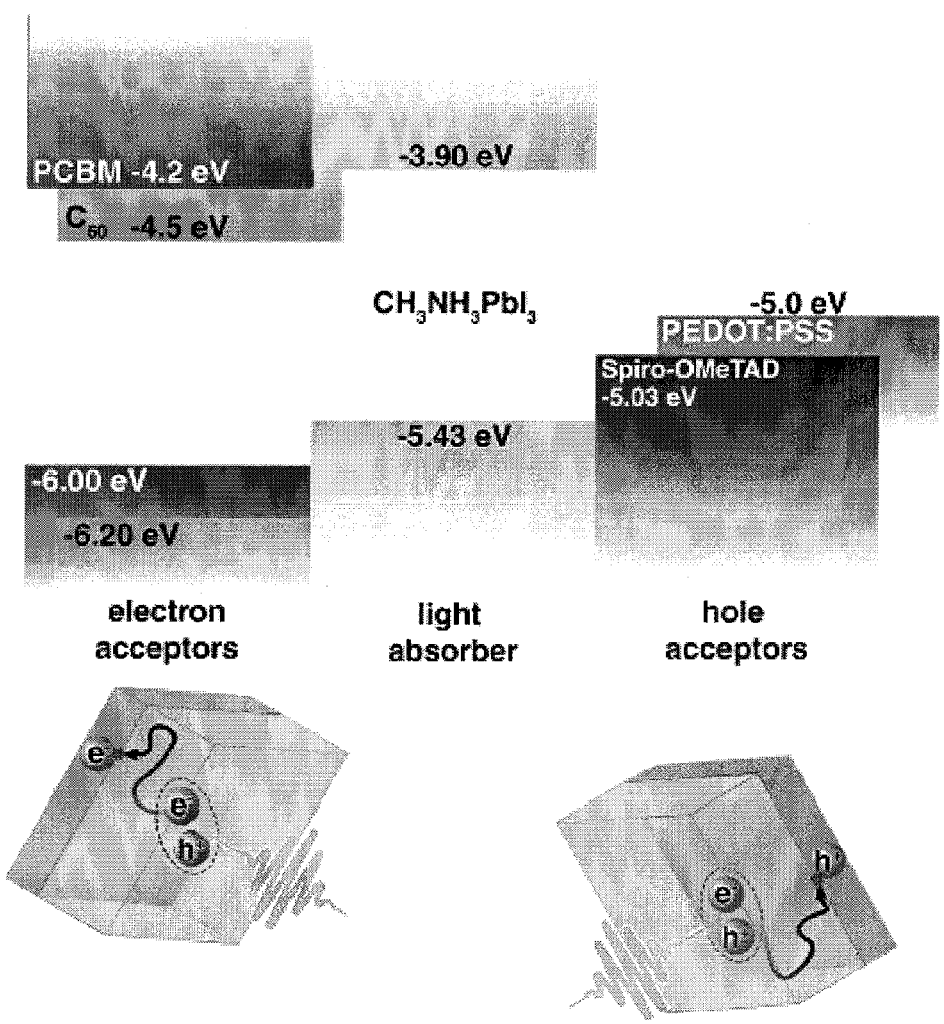
FIG. 16 is a schematic of the energy levels of the heterojunctions and depiction of the exciton generation, diffusion and quenching processes in the respective bilayers.

FIG. 16 is a schematic 1600 of the energy levels of the heterojunctions and depiction of the exciton generation, diffusion and quenching processes in the respective bilayers.

Figure 17:
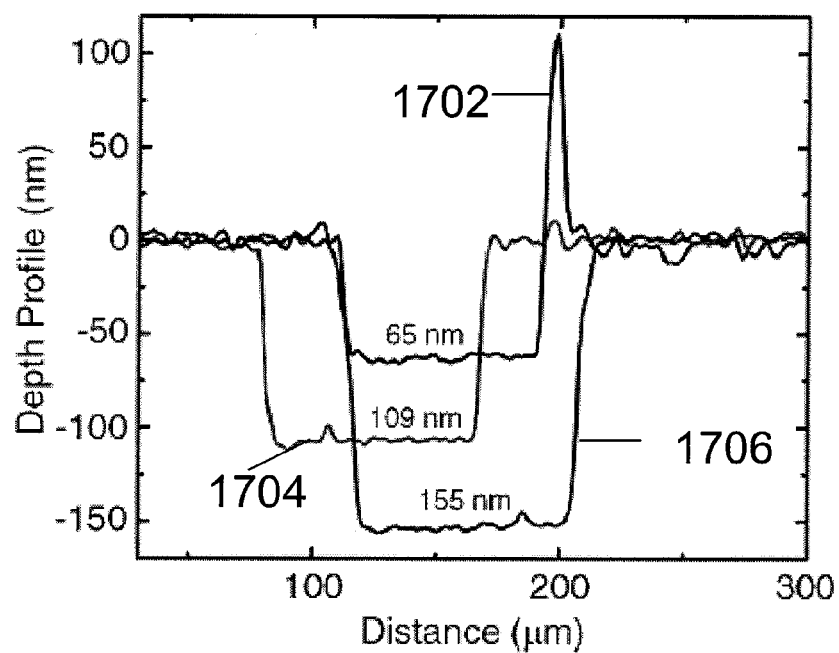
FIG. 17 is a plot showing step profiles of the thickness of the $CH_3NH_3PbI_3$, $CH_3NH_3PbI_3$/PCBM and $CH_3NH_3PbI_3$/Spiro-OMeTAD films.

FIG. 17 is a plot 1700 showing step profiles of the thickness of the $CH_3NH_3PbI_3$, $CH_3NH_3PbI_3$/PCBM and $CH_3NH_3PbI_3$/Spiro-OMeTAD films. 1702 shows the step profile of $CH_3NH_3PbI_3$ film. 1704 shows the step profile of $CH_3NH_3PbI_3$/PCBM film. 1706 shows the step profile of $CH_3NH_3PbI_3$/Spiro-OMeTAD film.

Figure 18:
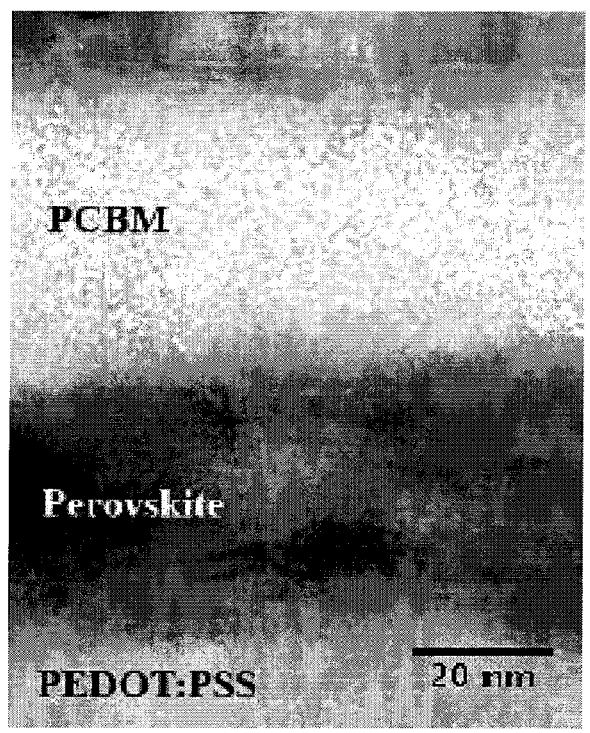
FIG. 18 is a cross-sectional transmission electron microscopy image of a typical trilayer showing the clear interfaces between the perovskite and the electron and hole acceptor layers.
Figure 19:
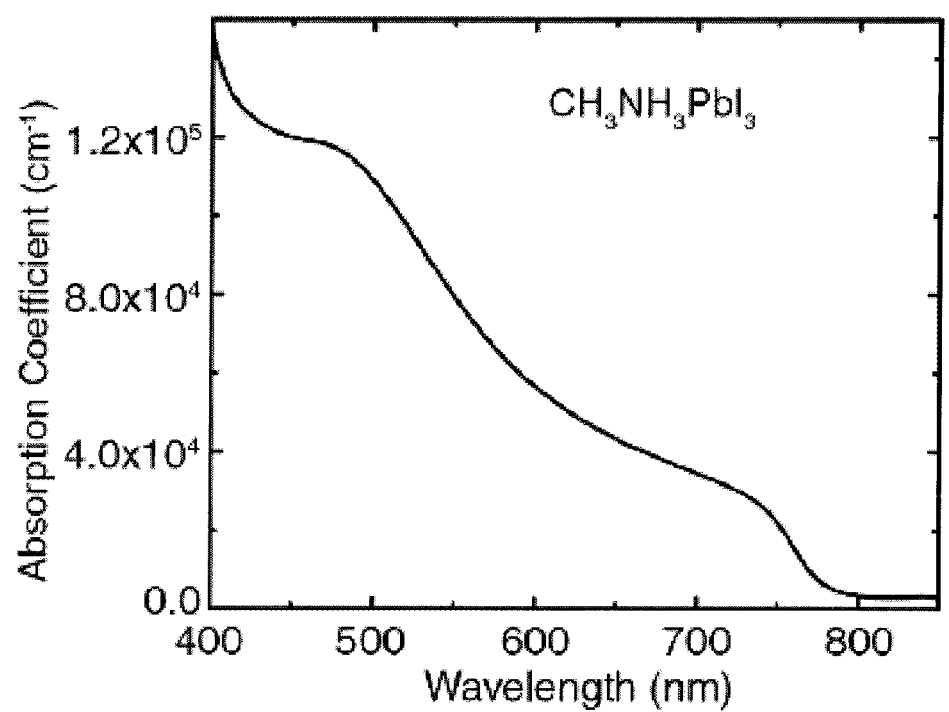
FIG. 19 is a plot of absorption coefficient of $CH_3NH_3PbI_3$ as a function of wavelength.

FIG. 18 is a cross-sectional transmission electron microscopy image 1800 of a typical trilayer showing the clear interfaces between the perovskite and the electron and hole acceptor layers. FIG. 19 is a plot 1900 of absorption coefficient of $CH_3NH_3PbI_3$ as a function of wavelength—calculated from equation (6).

Figure 20:
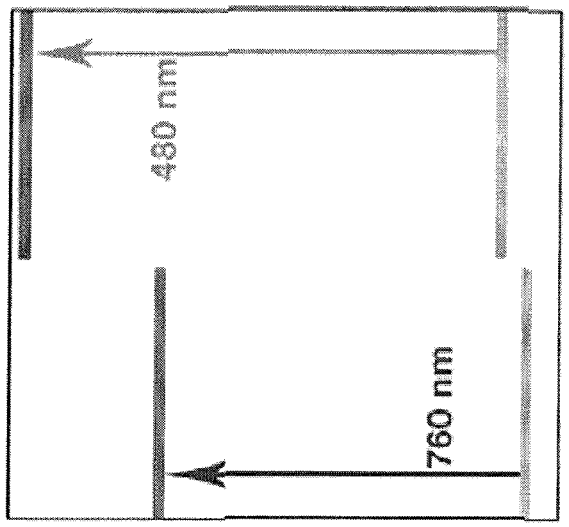
FIG. 20 is a schematic showing 4 possible scenarios for the two peaks (480 nm and 760 nm) observed in the linear absorption and TA spectra.
Figure 20:
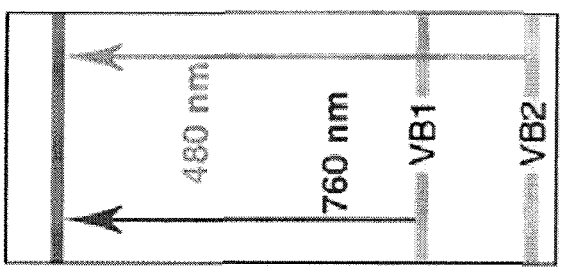
Figure 20:
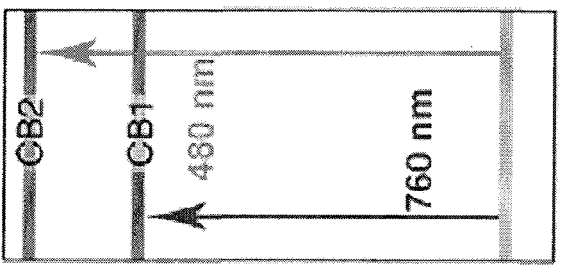
Figure 20:
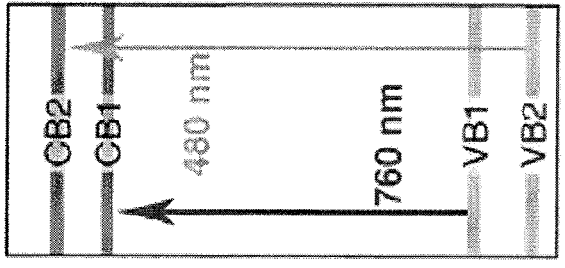

FIG. 20 is a schematic 2000 showing 4 possible scenarios for the two peaks (480 nm and 760 nm) observed in the linear absorption and TA spectra.

Figure 21:
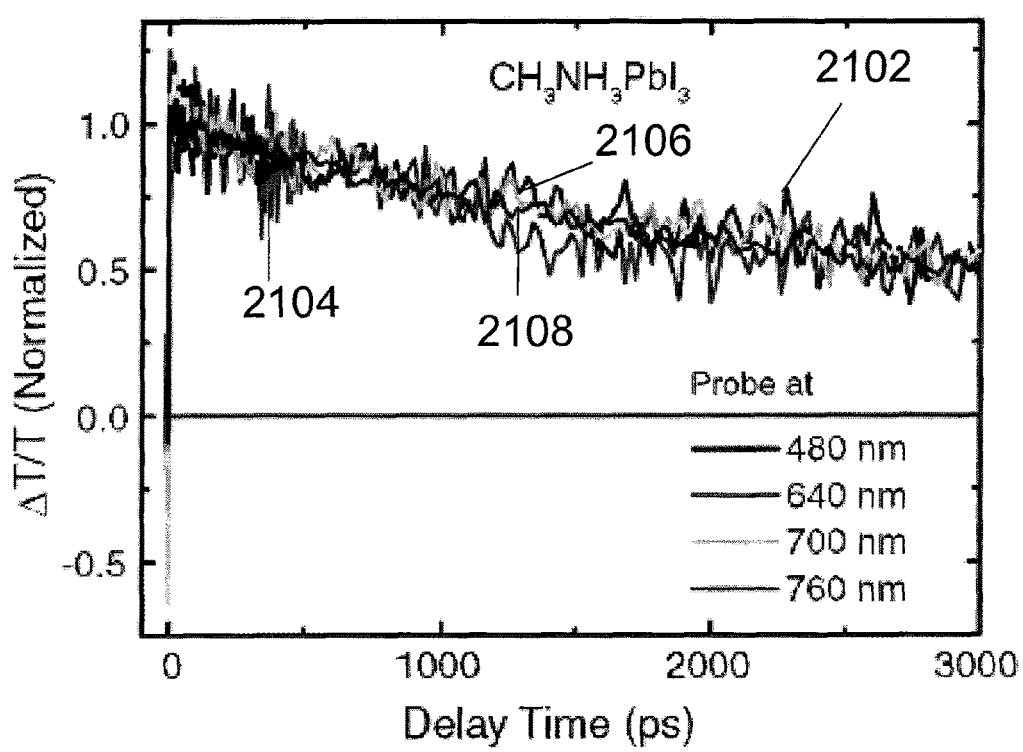
FIG. 21 is a plot showing normalized probe wavelength dependent kinetics for $CH_3NH_3PbI_3$ film in vacuum following excitation at 600 nm (0.7 µJ/cm$^2$).

FIG. 21 is a plot 2100 showing normalized probe wavelength dependent kinetics for $CH_3NH_3PbI_3$ film in vacuum following excitation at 600 nm (0.7 µJ/cm²). The signals at 640 nm and 700 nm were reversed for better comparison. Note the zero crossing of the signals at timescale below 1 ps for the 700 nm probe. This signature is characteristic of hot charge carrier cooling in the short timescales. 2102 is measured at 480 nm, 2104 is measured at 640 nm, 2106 is measured at 700 nm and 2108 is measured at 760 nm.

Figure 22:
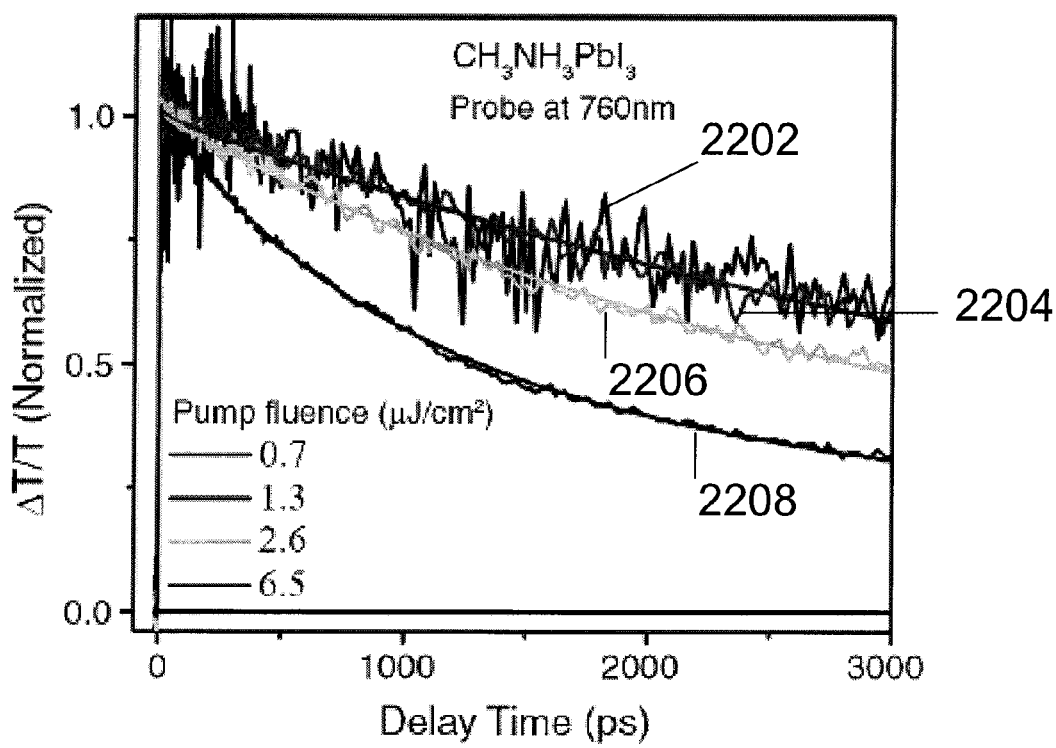
FIG. 22 is a plot showing normalized pump fluence dependent kinetics at 760 nm for $CH_3NH_3PbI_3$ film vacuum following excitation at 600 nm.
Figure 23:
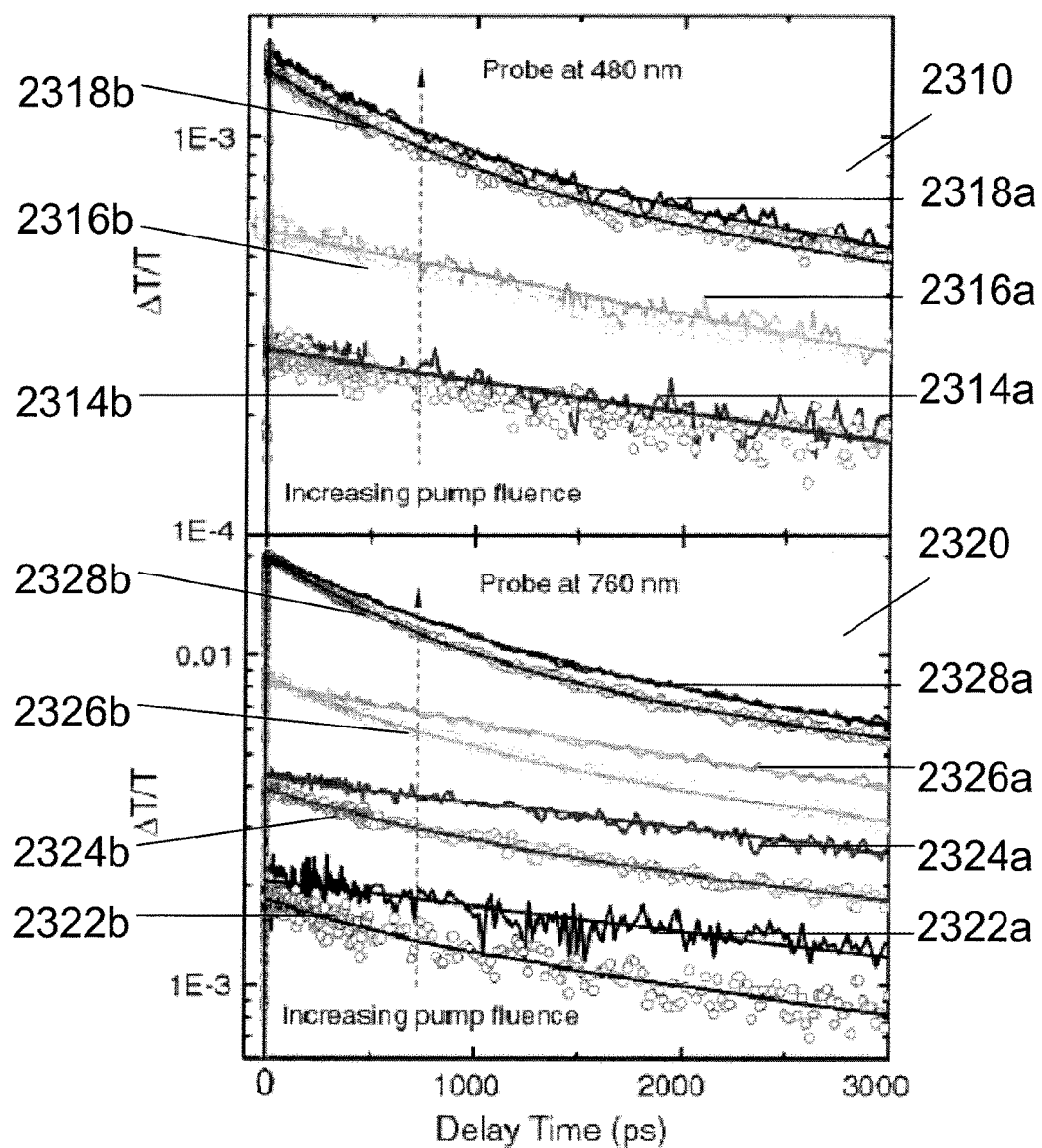
FIG. 23 is an illustration showing pump fluence dependent dynamics for $CH_3NH_3PbI_3$ and $CH_3NH_3PbI_3$ in vacuum.

FIG. 22 is a plot 2200 showing normalized pump fluence dependent kinetics at 760 nm for $CH_3NH_3PbI_3$ film vacuum following excitation at 600 nm. 2202 represents a pump fluence of 0.7 µJ/cm², 2204 represents a pump fluence of 1.3 µJ/cm², 2206 represents a pump fluence of 2.6 µJ/cm², and 2208 2204 represents a pump fluence of 6.5 µJ/cm², FIG. 23 is an illustration 2300 showing pump fluence dependent dynamics for $CH_3NH_3PbI_3$ (lines 2314*a*, 2316*a*, 2318*a*, 2322*a*, 2324*a*, 2326*a*, 2328*a*) and $CH_3NH_3PbI_3$ (dots 2314*b*, 2316*a*, 2318*b*, 2322*b*, 2324*b*, 2326*b*, 2328*b*) in vacuum. 2310 shows the pump fluence dependent dynamics at 480 nm while 2320 shows the pump fluence dynamics at 760 nm. 2322*a*, 2322*b* are for a pump fluence of 0.7 µJ/cm². 2314*a*, 2314*b*, 2324*a*, 2324*b* are for a pump fluence of 1.3 µJ/cm². 2316*a*, 2316*b*, 2326*a*, 2326*b* are for a pump fluence of 2.6 µJ/cm². 2318*a*, 2318*b*, 2328*a*, 2328*b* are for a pump fluence of 6.5 µJ/cm².

Figure 24:
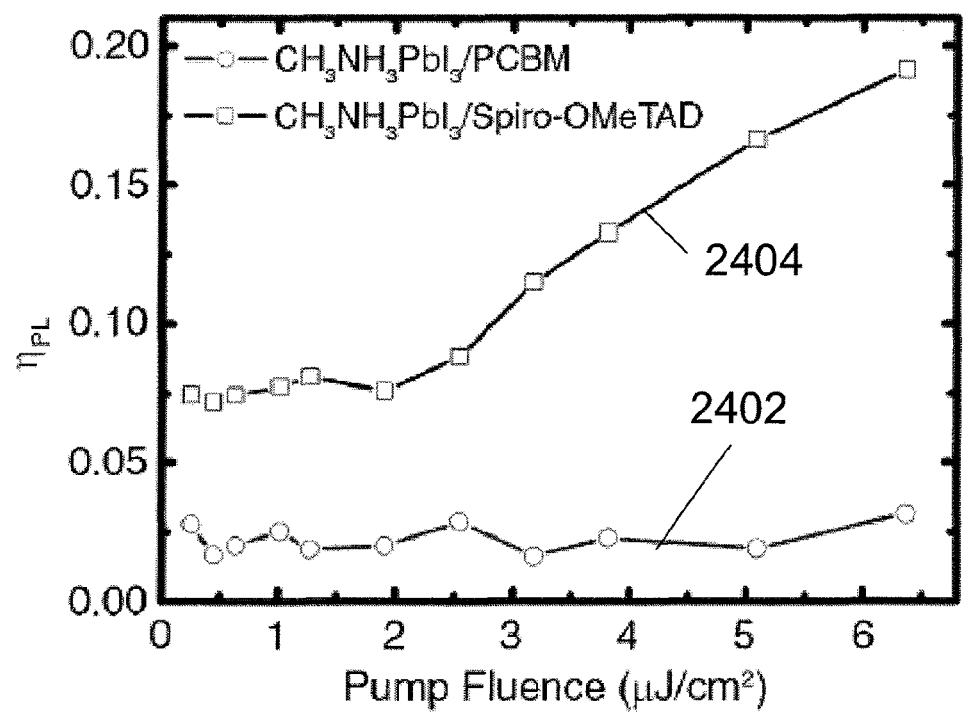
FIG. 24 is a plot showing pump fluence dependent relative PL quantum yield with 600 nm, 150 fs and 1 KHz laser pulse excitation.

FIG. 24 is a plot 2400 showing pump fluence dependent relative PL quantum yield with 600 nm, 150 fs and 1 KHz laser pulse excitation. 2402 shows the data for $CH_3NH_3PbI_3$/PCBM while 2404 shows the data for $CH_3NH_3PbI_3$/Spiro-OMeTAD.

FIG. 25 is a table 2500 showing relative photoluminescence (PL) quantum yield ($\varsigma_{PL}$), PL decay time ($\tau_{PL}$), TA decay time ($\tau_{TA}$) and the estimated charge transfer time ($\tau_{CT}$) from the TA results.

In this study, electron extraction layers (such as [6,6]-phenyl-C61-butyric acid methyl ester (PCBM), C60) with conduction band levels below that of $CH_3NH_3PbI_3$ and hole extraction layers (such as Spiro-OMeTAD, poly(3,4-ethylenedioxythiophene) poly(styrenesulfonate) (PEDOT:PSS)) with valence band levels above $CH_3NH_3PbI_3$ were interfaced to $CH_3NH_3PbI_3$ to permit decoupling of the electron and hole dynamics (FIG. 16). Comparing measurements on bare $CH_3NH_3PbI_3$ against $CH_3NH_3PbI_3$/hole acceptor bilayers and $CH_3NH_3PbI_3$/electron acceptor bilayers enables identification of electron and hole signatures in the organic/inorganic halide.

Under identical experimental conditions, the photoluminescence (PL) quantum yield of the 65 nm thick $CH_3NH_3PbI_3$ is greatly reduced when the perovskite is interfaced with an electron extracting PCBM layer or a hole extracting Spiro-OMeTAD layer (FIG. 13A). The PL intensity is quenched by a factor of 12.5 in the bilayer with Spiro-OMeTAD and by a factor of 50 in the bilayer with PCBM (FIG. 25). Given that the current configurations are ideal layered systems (FIG. 17 and FIG. 18), these high degrees of PL quenching, comparable to closely blended donor/acceptor system, are particularly revealing. Given a linear absorption coefficient of $5.7\times10^4$ cm$^{-1}$ at 600 nm (1410 in FIG. 14A, FIG. 19), near homogenous generation of the charge carriers in these 65 nm $CH_3NH_3PbI_3$ layers can be ensured. The PL quenching is expected to originate from the charge carrier extraction across the interface.

Efficient PL quenching suggests that the charge carrier diffusion length inside the $CH_3NH_3PbI_3$ layer is comparable to or longer than the layer thickness (65 nm). Correspondingly, the PL lifetimes were also significantly shortened when CH3NH3PbI3 was interfaced with the PCBM or Spiro-OMeTAD layer (FIG. 13B)—with fitted lifetimes of 4.5 (±0.3) ns, 0.37 (±0.02) ns and 0.64 (±0.03) ns for the $CH_3NH_3PbI_3$, $CH_3NH_3PbI_3$/PCBM and $CH_3NH_3PbI_3$/Spiro-OMeTAD, respectively. The single exponential PL decay indicates the good crystalline quality of the samples. Using the relation ($1/\tau_{Heterojunction} = 1/\tau_{Perovskite} + 1/\tau_{CT}$), the charge carrier transfer times $\tau_{CT}$ (and efficiency) can be estimated to be 0.40 ns (92%) and 0.75 ns (86%) for $CH_3NH_3PbI_3$/PCBM and $CH_3NH_3PbI_3$/Spiro-OMeTAD, respectively. The slight variation between the charge carrier transfer efficiencies obtained using steady state PL (FIGS. 13A, 25) and transient PL can be attributed to: (i) extremely fast charge carrier transfer at the interface (that cannot be monitored at the current temporal resolution); and (ii) the dependence of the steady state PL on the light reflection, scattering and refraction by the additional PCBM and Spiro-OMeTAD layers in the heterojunctions. Next, a charge carrier extraction model based on diffusion was employed to estimate the charge carrier diffusion lengths. FIG. 13C shows the dependence of the charge carrier diffusion length on the PL lifetime quenching ratios obtained from the analytical solution of the model. Assuming that charge carrier quenching occurs only at the extraction layer interface with 100% efficiency, minimum estimates of the extracted electron and hole diffusion lengths are 130 nm and 90 nm. By comparison, solution processed organic conjugated materials have typical diffusion lengths about 10 nm; thermally deposited organic molecules have typical diffusion lengths of 10-50 nm; and colloidal quantum dot films have diffusion lengths ~30 nm (organic cross-linked) and ~80 nm (hybrid surface passivated). Thus the conservatively estimated long diffusion lengths in the low temperature solution processed $CH_3NH_3PbI_3$ films compare favorably.

To improve the accuracy of these estimated values from the direct PL approach and obtain more details on the photo-excited charge carrier dynamics, complementary transient absorption spectroscopy (TAS) measurements were also performed. Due to the large absorption coefficients and the long charge carrier diffusion lengths, low pump fluence is essential to avoid extensive Auger recombination in $CH_3NH_3PbI_3$—see FIGS. 21 to 24. 1410 in FIG. 14A shows the linear absorption spectrum of $CH_3NH_3PbI_3$ spanning the UV to near infrared (800 nm) with two distinct peaks located at 480 nm and 760 nm, in agreement with earlier publications. The second absorption peak (760 nm) is attributed to the direct gap transition from the first valence band maximum (VB1) to the conduction band minimum (CB1). However, the origin of the first absorption peak (480 nm) is still unresolved.

Representative TA spectra of $CH_3NH_3PbI_3$ and its bilayer counterparts over the same spectral region are shown in 1420, 1430, 1440 (FIG. 14A)—with two pronounced photobleaching (PB) bands. These long-lived PB peaks are located at almost the same spectral positions as the two absorption peaks. The PB at 480 and 760 nm are labeled as PB1 and PB2, respectively, and are attributed to state-filling. For 600 nm photo-excitation, it is reasonable to attribute the 760 nm PB2 band to state filling effects (which include the hole population of VB1, the electron population of CB1 and the inter-band stimulated emission).

However, it is not straightforward to assign the transitions associated with the 480 nm PB1 band. Given that the photo-excitation energy (of ~2.06 eV for 600 nm wavelength) is smaller than the energy of the PB1 peak (2.58 eV), only one of the two energy states involving this PB transition could be populated. The long-lived nature of this PB band further suggests that the populated energy level should be either VB1 or CB1 (see SM for a more detailed discussion of the assignment).

Upon selective excitation of the $CH_3NH_3PbI_3$ layer, no new PB or photoinduced absorption bands are observed when the electron or hole extraction layer is present. A comparative study at the respective probe wavelengths of PB1 and PB2 would thus yield detailed information about the charge carrier dynamics. For pure $CH_3NH_3PbI_3$, the recombination dynamics at different probe wavelengths are relatively invariant over a range of pump fluences where second order effects are insignificant (FIG. 21). All these decay transients are well-fitted with a single exponential time constant of 5.6 (±0.1) ns, which is longer than the measured PL lifetime of 4.5 (±0.3) ns (FIG. 25). As time-resolved PL cannot monitor the recombination dynamics of all the photo-excited carriers, this finding suggests that the PL lifetime in pure $CH_3NH_3PbI_3$ is limited by the minority carrier lifetime. Correlating these PL lifetimes with the TA lifetimes of the bilayers allows us to identify the minority charge carriers. With the PCBM (electron acceptor) layer present, both PB1 and PB2 bleaching peaks show an additional fast lifetime component of 0.37 (±0.02) ns (FIG. 14B), which is closely matched to the measured PL lifetime. This suggests that electrons are the minority charge carriers in $CH_3NH_3PbI_3$. Since PB1 and PB2 dynamics are simultaneously affected by the electron extraction layer, the probes monitor the electron population in the CB1. For the $CH_3NH_3PbI_3$/Spiro-OMeTAD (hole acceptor) samples, only PB2 exhibits an additional fast decay lifetime of 0.59 (±0.03) ns (1450, FIG. 14B), which is slightly faster than the PL lifetime of 0.64 (±0.03) ns (FIG. 25). This indicates that PB2 also reflects the hole population of VB1 (i.e., the transitions between VB1 and CB1). PB1 on the other hand is only related to the electron population in CB1 (i.e., the transitions between the lower valence band (VB2) and CB1) (FIG. 15B). By comparing the PB1 decays between pure $CH_3NH_3PbI_3$ and $CH_3NH_3PbI_3$/PCBM, we determined electron extraction time and efficiency values in $CH_3NH_3PbI_3$/PCBM to be 0.40 ns (±0.05) and 68%. 1450 (FIG. 14B) also shows that about 27% of the photo-generated electrons are possibly trapped, and therefore contribute neither to the electron extraction from $CH_3NH_3PbI_3$ to PCBM, nor to the radiative recombination. By comparing the decay at PB2 between pure $CH_3NH_3PbI_3$ and $CH_3NH_3PbI_3$/Spiro-OMeTAD, we estimate the hole extraction time in $CH_3NH_3PbI_3$/Spiro-OMeTAD to be 0.66 (±0.05) ns.

However, given that the TA signal at PB2 is a combination of signals from both electrons and holes, it is difficult to estimate the detailed hole extraction efficiency at this stage. The origins of PB1 and PB2 suggest the possibility of hot holes cooling from VB2 to VB1 following excitation of $CH_3NH_3PbI_3$ across the VB2-CB1 gap. Such hot hole cooling dynamics could be validated through varying the pump wavelengths.

After 3.10 eV (400 nm) excitation, 1510 (FIG. 15) shows a very fast bleach buildup for PB1 which is close to the 150 fs laser pulse duration. Subsequently, hole localization from VB2 to VB1 occurs (within ~0.4 ps). The decay of the PB1 transient (indicative of the depopulation of VB2) is well-matched with a concomitant rise of the bleach signal at PB2 (indicative of VB1 being populated)—both at 0.4±0.1 ps. On the other hand, excitations with lower energy photons (e.g. across the VB1-CB1 gap using 2.07 eV (600 nm) pulses), do not excite carriers in VB2 and therefore, such hot hole cooling dynamics are absent (FIG. 3B). This 0.4 ps hot hole cooling is much slower than that in most organic semiconductors (~100 fs). Potentially, these hot hole energies could be efficiently extracted before the hot holes cool down to VB1 through optimizing the device configuration.

From fitting the TA decay dynamics with the diffusion model, the electron and hole diffusion coefficients were found to be 0.036 and 0.022 cm2/s, respectively. Using these values, the electron and hole diffusion lengths ($L_D$) perpendicular to the film surface were calculated to be $L_D^e$=130 nm and $L_D^h$=110 nm where $L_D=\sqrt{D\tau_{TA}}$. As expected, the $L_D^h$ (majority carrier diffusion length) determined here is longer than that extracted from the more direct PL approach presented earlier, which is sensitive to the minority carrier dynamics. The long transport lengths associated with $CH_3NH_3PbI_3$ are linked to its crystal structure, which includes corner-connected $PbI_6$ octahedra that form a three-dimensional framework.

Other organic/inorganic halide materials based on Sn have also displayed good charge transport properties. The slightly shorter diffusion length of the holes compared to the electrons is consistent with the hole's larger effective mass and larger positive space charge limited transport. Nonetheless, these values are relatively balanced as compared to typical values reported in bulk heterojunction solar cells where the electron and hole transport lengths (proportional to their mobility) differ by orders of magnitude resulting in space charge limited photocurrents. These balanced long charge carrier diffusion lengths would account for the remarkable performances reported for these $CH_3NH_3PbI_3$ devices.

These $L_D$ values are underestimated mainly because of the assumption that no quenching at the $CH_3NH_3PbI_3$-quartz or -vacuum interfaces occur. The measured carrier lifetimes, $\tau_0$ are more susceptible to the non-ideality of these interfaces in these thinner spincoated $CH_3NH_3PbI_3$ layers, leading to smaller $\tau_0$ and consequently shorter LD. Measurements in more "bulk-like" samples would yield longer $\tau_0$ and higher $L_D$ (submicron)—FIG. 13C. From the linear absorption coefficients (1410, FIG. 14A), the absorption lengths are $L_a$~100 nm (at ë=500 nm). These conservatively estimated carrier diffusion lengths measured in $CH_3NH_3PbI_3$ are comparable to the optical absorption lengths for λ≤500 nm, but are shorter than the absorption lengths at longer wavelengths. Increasing the optical thickness of these layers through light trapping architectures compensates for this slight mismatch—accounting for the high photoconversion efficiencies reported in these systems.

Methods and Materials. [6,6]-phenyl-C61-butyric acid methyl ester (PCBM) layers were spincoated from a solvent mixture (10 mg/ml) of anhydrous chlorobenzene and anhydrous chloroform (1:1 v/v) while PEDOT:PSS employed in the study was Clevios™ Al 4083) layer. (2,2',7,7'-tetrakis (N,-di-p-methoxyphenylamine)-9,9-spirobifluorene) (Spiro-OMeTAD) films were prepared by spincoating 20 mg/ml solutions in chlorobenzene. The $CH_3NH_3PbI_3$ films were prepared by spincoating 10 wt % solutions in anhydrous DMF. The samples were stored in vacuum for more than 3 days to rid them of any residual solvent before the optical measurements. FIG. 16 shows the schematic energy levels of the donor and acceptors materials utilized in this work. The thickness of the studied films was determined with Step-Profile measurements (FIG. 17) and matches well with values extracted from TEM imaging (FIG. 18).

All optical measurements were conducted in an optical cryostat under vacuum. For femtosecond optical spectroscopy, the laser source was a Coherent Legend™ regenerative amplifier (150 fs, 1 KHz, 800 nm) that was seeded by a Coherent Vitesse™ oscillator (100 fs, 80 MHz). 800 nm wavelength laser pulses were from the regenerative amplifier's output while 400 nm wavelength laser pulses were obtained through doubling the fundamental 800 nm pulses with a BBO crystal. 600-nm laser pulses were generated from a Light Conversion TOPAS-C optical parametric amplifier. The emission from the samples was collected at a backscattering angle of 150° by a pair of lenses and into an optical fiber that is coupled to a spectrometer (Acton, Spectra Pro 2500i) to be detected by a charge coupled device (CCD) camera (Princeton Instruments, Pixis 400B). Time-resolved PL was collected using an Optronis Optoscope™ streak camera system which has an ultimate temporal resolution of ~10 ps. For femtosecond TA experiments, the samples were pumped at 2.07 eV (or 3.1 eV) and probed with a white-light continuum. The probe pulses (420-820 nm) were generated by focusing a small portion (~5 μJ) of the fundamental 800 nm laser pulses into a 2 mm-thick sapphire plate. The linear polarization of the pump pulse was adjusted to be perpendicular to that of the probe pulse with a polarizer and a half waveplate. The cross-polarization will eliminate any contribution from coherent artifacts at early times. Pump-induced changes of transmission (DT/T) of the probe beam were monitored using a monochromator/PMT configuration with lock-in detection. The pump beam was chopped at 83 Hz and this was used as the reference frequency for the lock-in amplifier.

The optical transmittance and total reflectance spectra of $CH_3NH_3PbI_3$ on quartz substrate and blank quartz substrate were measured with a UV-VIS-NIR spectrophotometer (Shimadzu UV-3600) with an integrating sphere (ISR-3100). The absorption coefficient of the ultrathin $CH_3NH_3PbI_3$ film was calculated using the following expression:

$$\alpha_{film} = \frac{d_{sub}}{d_{tot}} \frac{1}{d_{film}} \ln\left(\frac{1-R_{tot}}{T_{tot}}\right) - \frac{1}{d_{sub}} \ln\left(\frac{1-R_{sub}}{T_{sub}}\right) \quad (6)$$

where $R_{sub}$, $T_{sub}$ and $d_{sub}$ are the substrate reflectance, transmittance and thickness, respectively. $R_{tot}$, $T_{tot}$ and $d_{tot}$ are reflectance, transmittance and thickness of the substrate/film system, respectively. $d_{film}$ is the $CH_3NH_3PbI_3$ film thickness. With equation (6), the interface effect between substrate and film can be taken into account.

Diffusion Model. The charge carrier diffusion lengths (LD) in the active layer can be estimated using a simple diffusion limited quenching model in a bilayer system. The laser pulse generated charge carrier density in the active layer can be described by a one-dimensional diffusion equation:

$$\frac{\partial n(z,t)}{\partial t} = D\frac{\partial^2 n(z,t)}{\partial x^2} - kn(z,t) \quad (7)$$

where n(z, t) is the charge carrier density, D is the charge carrier diffusion coefficient, k is the original charge carrier consumption rate without the acceptor layer. The spatial coordinate z represents the vertical distance of a point in the active layer from the quartz/active layer interface. With fs laser pulse excitation, the initial photo-generated charge carrier distribution in the active layer can be expressed as:

$$n(z,0) = n(0)e^{-\alpha z} \quad 8$$

where ä is the linear absorption coefficient of the active layer at the excitation wavelength. Assuming that the donor/acceptor interface is the only quenching interface with infinite quenching rate, a minimum estimate of $L_D$ will be obtained. Solving Equation 7 with the initial charge carrier distribution and boundary conditions yields the time dependent charge carrier distribution (n(z, t)) and total charge number (N(t)) within the active layer:

$$n(z,t) = 2n_0 \exp(-kt) \sum_{m=0}^{\infty} \left( \exp\left(-\frac{\pi^2 D}{L^2}\left(m+\frac{1}{2}\right)^2 t\right) \frac{(-1)^m \exp(-\alpha L)\pi\left(m+\frac{1}{2}\right) + \alpha L}{(\alpha L)^2 + \pi^2\left(m+\frac{1}{2}\right)^2} \cos\left(\pi\left(m+\frac{1}{2}\right)\frac{z}{L}\right)\right) \quad (9)$$

$$N(t) = \frac{2n_0 L}{\pi} \exp(-kt) \sum_{m=0}^{\infty} \left( \exp\left(-\frac{\pi^2 D}{L^2}\left(m+\frac{1}{2}\right)^2 t\right) \frac{\exp(-\alpha L)\pi\left(m+\frac{1}{2}\right) + (-1)^m \alpha L}{\left((\alpha L)^2 + \pi^2\left(m+\frac{1}{2}\right)^2\right)\left(m+\frac{1}{2}\right)}\right) \quad (10)$$

where L is the active layer thickness.

Interpretation for Photobleaching (PB) Peaks at 480 nm and 760 nm.

From the linear absorption spectrum in FIG. 19, the PB peaks could originate from one of the four possible scenarios as shown in FIG. 20 (A): separate valence bands to separate conduction bands transitions (i.e., VB1→CB1 and VB2→CB2); (B) common valence band to separate conduction bands transitions (i.e., VB1→CB1 and VB1→CB2); (C) separate valence bands to common conduction band transitions (i.e., VB1→CB1 and VB2→CB1); and (D) a mixture of two photo-systems with independent transitions. Energy band alignments could be a type I or type II configuration.

Scenario A: The long-lived nanosecond PB transient measured at 480 nm would exclude this situation because hot carrier relaxation to the lower levels would occur on a much faster picoseconds timescale.

Scenario D: The schematic represents a general situation where the band alignment could be either (a) a type I band alignment where the smaller bandgap system is located within the wider bandgap system; or (b) a type II band alignment where the energy bands of the two systems are staggered. Nonetheless, the following discussion is applicable. For the 600 nm pump pulse to yield two bleaching peaks at PB1 and PB2, a charge transfer from the smaller bandgap system (760 nm) to the larger bandgap system (480 nm) must have taken place. A key signature of such charge transfer is a concomitant decrease in the 760 nm probe signal with a rise in the 480 nm probe signal over the same time frame. This is not observed, thus eliminating Scenario D altogether.

Differentiating Scenario B and C: In Scenario B, the dependence of the dynamics at the two wavelengths could be described by:

$$\frac{\Delta T}{T}(760 \text{ nm}) = k_1 n_e + k_2 n_h \quad (11)$$

$$\frac{\Delta T}{T}(480 \text{ nm}) = k_3 n_h \quad (12)$$

where $k_1$, $k_2$ and $k_3$ are proportionality constants and $n_e$ and $n_h$ are the electron and hole populations at CB1 and VB1. The transition at 480 nm does not depend on $n_e$ since the hot electron at CB2 decays within 1 ps.

In Scenario C, the dependence of the dynamics at the two wavelengths could be described by:

$$\frac{\Delta T}{T}(760 \text{ nm}) = k_1 n_e + k_2 n_h \quad (13)$$

$$\frac{\Delta T}{T}(480 \text{ nm}) = k_3 n_e \quad (14)$$

where $k_1$, $k_2$ and $k_3$ are proportionality constants and $n_e$ and $n_h$ are the electron and hole populations at CB1 and VB1.

For the $CH_3NH_3PbI_3$/PCBM bilayer, the dynamics originating from ne will be affected; while for the $CH_3NH_3PbI_3$/Spiro-OMeTAD bilayer, the dynamics originating from $n_h$ will be affected. Experimentally, both 480 nm (PB1) and the 760 nm (PB2) transients are modulated in the presence of the electron accepting PCBM—indicating that the CB1 is participating in both the transitions. In addition, only the 760 nm transition (PB2) is affected by the presence of the hole accepting Spiro-OMeTAD—indicating that VB2 is participating in this transition. This eliminates Scenario B and confirms Scenario C.

Second Order Effects—Auger Recombination. It was found that these carrier dynamics are strongly pump fluence dependent due to the large light absorption coefficient ($\sim 5.7 \times 10^4$ cm$^{-1}$ at 600 nm (FIG. 19) and long charge carrier diffusion length in $CH_3NH_3PbI_3$. For pump fluence $\leq 1.3$ μJ/cm$^2$, multi-particle Auger recombination process in $CH_3NH_3PbI_3$ is insignificant and the TA decay transients are identical to those presented earlier (FIGS. 21, 22). However, for a pump fluence >2.6 μJ/cm$^2$ (i.e., photo-generated exciton density >$3.7 \times 10^{17}$/cm$^3$), Auger recombination will dominate over the linear recombination, resulting in a shortening of the TA lifetimes. The existence of Auger recombination under these relatively low exciton densities points towards an extremely long exciton-exciton or exciton-charge interaction length ($\sim$μm) in $CH_3NH_3PbI_3$—consistent with the long carrier diffusion lengths determined in this work. Under high pump fluence, the lifetime shortening induced by the interface charge carrier extraction in the bilayers will be overshadowed by the lifetime shortening caused by Auger recombination (FIG. 23). Therefore, careful regulation of the pump fluence in the ultrafast optical spectroscopy of $CH_3NH_3PbI_3$ is essential for uncovering its intrinsic properties. As shown in FIG. 24, the relative PL quantum yields ($\eta_{PL}$) of $CH_3NH_3PbI_3$/PCBM and $CH_3NH_3PbI_3$/Spiro-OMeTAD to $CH_3NH_3PbI_3$ layer are strongly dependent on the pump fluence used. At relative low pump fluence (where Auger recombination is insignificant), $\eta_{PL}$, is independent of the pump fluence. However, when Auger effects become more dominant, $\eta_{PL}$ increases with pump fluence. The variation of $\eta_{PL}$ with pump fluence is more obvious for $CH_3NH_3PbI_3$/Spiro-OMeTAD than for $CH_3NH_3PbI_3$/PCBM. This is attributed to the slower hole diffusion compared to the electron diffusion in $CH_3NH_3PbI_3$—consistent with the hole's larger effective mass and larger space charge limited transport. All our PL measurements were performed in the linear range with low pump fluence.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. An emission source comprising:
   a gain medium that provides optical amplification, the gain medium comprising a three-dimensional halide perovskite material; and
   a pump source configured to provide energy to the gain medium comprising the three-dimensional halide perovskite material so that the gain medium generates a coherent stimulated light to emit a laser beam and the gain medium generates amplified spontaneous emission based on the energy provided,
   wherein the three-dimensional halide perovskite material is a halide semiconductor material, and
   wherein the gain medium has a trap density below $10^{18}$ cm$^{-3}$.

2. The emission source according to claim 1, wherein the pump source is an optical source configured to provide light as energy to the gain medium.

3. The emission source according to claim 1, wherein the pump source is an electrical source configured to provide electrical energy to the gain medium.

4. The emission source according to claim 1, the emission source further comprising:
   a resonant cavity, the gain medium arranged within the resonant cavity;
   wherein the resonant cavity is defined by a first reflective structure and a second reflective structure, the gain medium arranged between the first reflective structure and the second reflective structure along an optical axis.

5. The emission source according to claim 4, wherein the first reflective structure is arranged to reflect light incident on the first reflective structure towards the second reflective structure along the optical axis and the second reflective structure is arranged to reflect light incident on the second reflective surface towards the first reflective surface along the optical axis.

6. The emission source according to claim 4, wherein the first reflective structure is partially transparent so that light incident in the first reflective structure is partially transmitted through the first reflective structure and partially reflected towards the second reflective structure along the optical axis.

7. The emission source according to claim 1, wherein the three-dimensional halide perovskite material comprises an organic ammonium cation.

8. The emission source according to claim 7, wherein the organic ammonium cation is selected from a group consisting of an ammonium ion, a hydroxylammonium ion, a methylammonium ion, a hydrazinium ion, an azetidinium ion, a formamidinium ion, an imidazolium ion, a dimethylammonium ion, an ethylammonium ion, a phenethylammonium ion, a guanidinium ion, a cation with formula $[C_nH_{2n+1} NH_3]^+$ where 2<n<20 and combinations thereof.

9. The emission source according to claim 1, wherein the three-dimensional halide perovskite material comprises one or more metal cations selected from a cationic 2+ group.

10. The emission source according to claim 1, wherein the three-dimensional halide perovskite material comprises one or more halide anions selected from a group consisting of $F^-$, $I^-$, $Cl^-$ and $Br^-$.

11. The emission source according to claim 1, wherein the emission source is configured to generate light of a wavelength from a range of about 250 nm to about 1 mm.

12. The emission source according to claim 1, wherein the gain medium has undergone a post film treatment.

13. The emission source according to claim 1, wherein the gain medium further comprises additives to control trap density.

14. The emission source according to claim 1, wherein the three-dimensional halide perovskite material comprises a three-dimensional organic-inorganic halide perovskite material.

15. The emission source according to claim 1, wherein the three-dimensional halide perovskite material is represented by general formula $AMX_3$, where A is a monopositive organic or inorganic ion, M is a divalent metal cation or element, and X is a halogen anion or element.

16. The emission source according to claim 1, wherein the emission source is operable at room temperature.

17. The emission source according to claim 1, wherein amplified spontaneous emission occurs above a threshold pump fluence of 10 µJ cm$^{-2}$ at 300 K.

18. The emission source according to claim 1, wherein the three-dimensional halide perovskite material is $CsSnI_3$.

19. The emission source according to claim 1, wherein the gain medium comprises $SnF_2$.

20. The emission source according to claim 1, wherein the gain medium has a trap density below $10^{17}$ cm$^{-3}$.

21. The emission source according to claim 1, wherein the gain medium has a trap density below $10^{16}$ cm$^{-3}$.

22. A method of forming an emission source, the method comprising:

providing a gain medium that provides optical amplification, the gain medium comprising a three-dimensional halide perovskite material; and providing a pump source configured to provide energy to the gain medium comprising the three-dimensional halide perovskite material so that the gain medium generates a coherent stimulated light to emit a laser beam and the gain medium generates amplified spontaneous emission based on the energy provided, wherein the three-dimensional halide perovskite material is a halide semiconductor material, and wherein the gain medium has a trap density below $10^{18}$ cm$^{-3}$.

23. The method according to claim 22, wherein the gain medium is arranged within a resonant cavity by arranging the gain medium between a first reflective structure and a second reflective structure along an optical axis.

24. The method according to claim 23, wherein the first reflective structure is arranged to reflect light incident on the first reflective structure towards the second reflective structure along the optical axis and the second reflective structure is arranged to reflect light incident on the second reflective surface towards the first reflective surface along the optical axis.

25. The method according to claim 23, wherein the first reflective structure is partially transparent so that light incident in the first reflective structure is partially transmitted through the first reflective structure and partially reflected towards the second reflective structure along the optical axis.

26. The method according to claim 22, wherein the three-dimensional halide perovskite material is formed by reacting a metal halide with an organic or inorganic halide.

27. The method according to claim 22, wherein the three-dimensional halide perovskite material is formed by printing processes, physical deposition methods or combinations thereof.

28. The method according to claim 22, wherein the three-dimensional halide perovskite material comprises a three-dimensional organic-inorganic halide perovskite material.

29. The method according to claim 22, wherein the three-dimensional halide perovskite material is represented by general formula $AMX_3$, where A is a monopositive organic or inorganic ion, M is a divalent metal cation or element, and X is a halogen anion or element.

30. The method according to claim 22, wherein the emission source is operable at room temperature.

31. The method according to claim 22, wherein amplified spontaneous emission occurs above a threshold pump fluence of 10 µJ cm$^{-2}$ at 300 K.

32. The method according to claim 22, wherein the three-dimensional halide perovskite material is $CsSnI_3$.

33. The method according to claim 22, wherein the gain medium comprises $SnF_2$.

34. The method according to claim 22, wherein the gain medium has a trap density below $10^{17}$ cm$^{-3}$.

35. The method according to claim 22, wherein the gain medium has a trap density below $10^{16}$ cm$^{-3}$.

* * * * *